(12) United States Patent
Lee

(10) Patent No.: US 9,293,205 B2
(45) Date of Patent: Mar. 22, 2016

(54) MULTI-TASK CONCURRENT/PIPELINE NAND OPERATIONS ON ALL PLANES

(71) Applicant: Aplus Flash Technology, Inc, Fremont, CA (US)

(72) Inventor: Peter Wung Lee, Saratoga, CA (US)

(*) Notice: Subject to any disclaimer, the term of this patent is extended or adjusted under 35 U.S.C. 154(b) by 0 days.

(21) Appl. No.: 14/487,078

(22) Filed: Sep. 15, 2014

(65) Prior Publication Data
US 2015/0078086 A1     Mar. 19, 2015

Related U.S. Application Data

(60) Provisional application No. 61/877,959, filed on Sep. 14, 2013.

(51) Int. Cl.
| G11C 16/14 | (2006.01) |
|---|---|
| G11C 16/04 | (2006.01) |
| G11C 16/26 | (2006.01) |
| G11C 16/34 | (2006.01) |

(52) U.S. Cl.
CPC ............ *G11C 16/14* (2013.01); *G11C 16/0483* (2013.01); *G11C 16/26* (2013.01); *G11C 16/3445* (2013.01); *G11C 16/3459* (2013.01)

(58) Field of Classification Search
None
See application file for complete search history.

(56) References Cited

U.S. PATENT DOCUMENTS

| 5,734,609 A | 3/1998 | Choi et al. |
|---|---|---|
| 5,867,429 A | 2/1999 | Chen et al. |
| 6,522,580 B2 | 2/2003 | Chen et al. |
| 6,542,407 B1 | 4/2003 | Chen et al. |
| 6,657,891 B1 | 12/2003 | Shibata |
| 6,781,877 B2 | 8/2004 | Cernea |
| 6,807,095 B2 | 10/2004 | Chen |
| 6,816,409 B2 | 11/2004 | Tanaka |
| 6,847,553 B2 | 1/2005 | Chen |
| 6,870,768 B2 | 3/2005 | Cemea |
| 6,888,758 B1 | 5/2005 | Hemink |
| 6,917,542 B2 | 7/2005 | Chen |
| 7,023,735 B2 | 4/2006 | Ban |
| 7,046,548 B2 | 5/2006 | Cernea |
| 7,061,798 B2 | 6/2006 | Chen |
| 7,102,924 B2 | 9/2006 | Chen |
| 7,187,585 B2 | 3/2007 | Li |
| 7,196,928 B2 | 3/2007 | Chen |
| 7,224,613 B2 | 5/2007 | Chen |
| 7,289,344 B2 | 10/2007 | Chen |
| 7,301,808 B2 | 11/2007 | Li |
| 7,301,813 B2 | 11/2007 | Chen |
| 7,301,839 B2 | 11/2007 | Li |
| 7,315,477 B2 | 1/2008 | Chen |
| 7,321,510 B2 | 1/2008 | Li |
| 7,372,730 B2 | 5/2008 | Chen |

(Continued)

*Primary Examiner* — James G Norman
(74) *Attorney, Agent, or Firm* — Fang Wu

(57) ABSTRACT

This invention provides a 2-level BL-hierarchical NAND memory architecture and associated concurrent operations applicable to both 2D and 3D HiNAND2 memory arrays. New Latch designs in Block-decoder and Segment-decoder with one common dedicated metal0 power line per one 2N-bit dynamic page buffer (DPB) formed in corresponding 2N broken-LBL metal1 line capacitors for Program and per one 2N-bit Segment DPB formed in corresponding 2N local LBL metal1 line capacitors for Read are provided for performing concurrent and pipeline operations of multiple-WL Program, Read, Erase-Verify, and Program-Verify in dispersed Blocks in a same or multiple different NAND planes with much enhanced array flexibility and multiple-fold performance improvements.

89 Claims, 31 Drawing Sheets

(56) References Cited

U.S. PATENT DOCUMENTS

| | | | |
|---|---|---|---|
| 7,397,698 | B2 | 7/2008 | Fong |
| 7,443,729 | B2 | 10/2008 | Li |
| 7,499,329 | B2 | 3/2009 | Nazarian |
| 7,499,338 | B2 | 3/2009 | Ito |
| 7,506,113 | B2 | 3/2009 | Li |
| 7,522,454 | B2 | 4/2009 | Li |
| 7,570,517 | B2 | 8/2009 | Kwak et al. |
| 7,652,929 | B2 | 1/2010 | Li |
| 7,839,690 | B2 | 11/2010 | Lee |
| 7,876,611 | B2 | 1/2011 | Dutta |
| 8,036,041 | B2 | 10/2011 | Li |
| 8,130,556 | B2 | 3/2012 | Lutze |
| 8,148,763 | B2 | 4/2012 | Kim |
| 8,169,826 | B2 * | 5/2012 | Hishida .................. G11C 5/02 257/324 |
| 8,189,391 | B2 | 5/2012 | Itagaki |
| 8,194,453 | B2 | 6/2012 | Maejima |
| 8,203,882 | B2 | 6/2012 | Hishida |
| 8,218,348 | B2 | 7/2012 | Roohparvar |
| 8,274,823 | B2 | 9/2012 | Roohparvar |
| 8,284,606 | B2 | 10/2012 | Li |
| 8,284,613 | B2 | 10/2012 | Yamada |
| 8,334,551 | B2 | 12/2012 | Itagaki |
| 8,335,111 | B2 | 12/2012 | Fukuzumi |
| 8,400,826 | B2 | 3/2013 | Roohparvar |
| 8,400,839 | B2 | 3/2013 | Li |
| 8,437,192 | B2 | 5/2013 | Lung |
| 8,446,777 | B2 | 5/2013 | Ueno |
| 8,461,000 | B2 * | 6/2013 | Alsmeier ......... H01L 27/11551 257/E29.131 |
| 8,462,559 | B2 | 6/2013 | Yamada |
| 8,477,533 | B2 | 7/2013 | Kang |
| 8,488,382 | B1 | 7/2013 | Li |
| 8,503,230 | B2 | 8/2013 | Yoo |
| 8,503,245 | B2 | 8/2013 | Yamada |
| 8,526,236 | B2 | 9/2013 | Jones |
| 8,559,222 | B1 | 10/2013 | Iwai et al. |
| 8,559,236 | B2 | 10/2013 | Nakai |
| 8,570,810 | B2 | 10/2013 | Fong |
| 8,599,617 | B2 | 12/2013 | Shiino |
| 8,605,503 | B2 | 12/2013 | Futatsuyama |
| 8,605,511 | B2 | 12/2013 | Tanaka |
| 8,619,468 | B2 | 12/2013 | Shibata |
| 8,625,356 | B2 | 1/2014 | Shibata |
| 8,625,357 | B2 | 1/2014 | Cho |
| 8,625,359 | B2 | 1/2014 | Jeon |
| 8,630,115 | B2 | 1/2014 | Pascucci |
| 8,630,116 | B2 | 1/2014 | Maejima |
| 8,634,251 | B2 | 1/2014 | Chung |
| 8,637,915 | B2 | 1/2014 | Ichige |
| 8,638,608 | B2 | 1/2014 | Lai |
| 8,638,609 | B2 | 1/2014 | Lin |
| 8,644,081 | B2 | 2/2014 | Chang |
| 8,654,585 | B2 | 2/2014 | Oh |
| 8,654,588 | B2 | 2/2014 | Aritome |
| 8,659,951 | B2 | 2/2014 | Nawata |
| 8,661,294 | B2 | 2/2014 | Lee |
| 8,665,649 | B2 | 3/2014 | Park |
| 8,670,272 | B2 | 3/2014 | Radke |
| 8,675,416 | B2 | 3/2014 | Lee |
| 8,681,543 | B2 | 3/2014 | Jang |
| 8,681,545 | B2 | 3/2014 | Kim et al. |
| 8,681,563 | B1 | 3/2014 | Lee |
| 8,687,430 | B2 | 4/2014 | Sarin et al. |
| 8,687,431 | B2 | 4/2014 | Sarin |
| 8,694,720 | B2 | 4/2014 | Lee |
| 8,694,766 | B2 | 4/2014 | Toelkes |
| 8,700,879 | B2 | 4/2014 | Porzio |
| 8,705,277 | B2 | 4/2014 | Moschiano et al. |
| 8,705,290 | B2 | 4/2014 | Damle |
| 8,705,293 | B2 | 4/2014 | She |
| 8,711,621 | B2 | 4/2014 | Kim |
| 8,711,624 | B2 | 4/2014 | Choi |
| 8,717,819 | B2 | 5/2014 | Aritome |
| 8,730,733 | B2 | 5/2014 | Youn |
| 8,737,140 | B2 | 5/2014 | Kim |
| 8,755,224 | B2 | 6/2014 | Yun |
| 8,773,910 | B2 | 7/2014 | Jones |
| 8,773,911 | B2 | 7/2014 | Park |
| 8,893,247 | B1 | 11/2014 | Faaborg |
| 2012/0008400 | A1 * | 1/2012 | Fukuzumi ......... G11C 16/0483 365/185.18 |

* cited by examiner

2nd Read while 1st Read, Program, Program Verify, Erase Verify

| 2nd Read Operation (Page/Dispersed Block) | XB | XBM | ENS | CLR | CLA | XBP | PH | ENB | HXB | GSLp | SSLp | XT1~XT64 | VHH | SSL | WL1~WL64 | GSL | PAS |
|---|---|---|---|---|---|---|---|---|---|---|---|---|---|---|---|---|---|
| Initialization | 1/0 | 0 | 0 | 0 | ⊓ | 0 | 0 | 1 | 0 | 1 | 1 | 1/0 | 1 | 0# | 0# | 0# | 1& |
| Pre-charge LBL to $V_{inh}$ | 1/0 | 0 | 0 | 0 | 0 | 0 | CK | 1 | 0 | X | X | X | H1/H4 | 0# | 0# | 0# | 1& |
| Charge WL, SSL, GSL | 1 | 0 | ⊓ | 0 | 0 | 1 | CK | 0 | H1' | 1 | 1 | H1/VR | H1 | 1 | H1/VR | 1 | 1& |
| Latch WL, SSL, GSL to Discharge on-cell and Charge shares between LBL and GBL | 1 | 0 |  | 0 | 0 | 0 | CK | 1 | 0 | 1→X | 1→X | H1/VR→X | H1/H4 | 1# | H1#/VR# | 1# | 1& |
| Lock XB Driver | 1 | 1 |  | 0 | 0 | 0 | CK | 1 | 0 | X | X | X | H1/H4 | 1# | H1#/VR# | 1# | 0 |
| Unlock XB Driver | 1 | 0 |  | 0 | 0 | 0 | CK | 1 | 0 | X | X | X | H1/H4 | 1# | H1#/VR# | 1# | 1& |
| Discharge WL, SSL, GSL of selected Blocks | 1 | 0 |  |  | 0 | ⊓ | CK | ⊓+ | 0 | 0 | 0 | 0 | H1/H4 | 0 | 0# | 0# | 1& |

Note: 1=Vdd; 0=0V; #=Floating; X=Don't Care; CK=clock pulse; VR=Sel WL Read voltage; 1&=Pull-up by weak resistor to Vdd; H1=Vread; H2=Vpass; H3=Vpgm; +=H1'=>Vread+Vt; @=H4'=>Vpp+Vt; VP=Sel WL sProgram Verify voltage; Vpgm is ramped step-wisely to Vpp=20V.

Continue this figure on next page

FIG. 6A

2nd Program while 1st Read, Program, Program Verify, Erase Verify

| 2nd Program Operation | XB | XBM | ENS | CLR | CLA | XBP | PH | ENB | HXB | GSLp | SSLp | XT1~XT64 | VHH | SSL | WL1~WL64 | GSL | PAS |
|---|---|---|---|---|---|---|---|---|---|---|---|---|---|---|---|---|---|
| Initialization | 1/0 | 0 | 0 | 0 | ⊓ | 0 | 0 | 1 | 0 | 1 | 1 | 1/0 | 1 | 0# | 0# | 0# | 1& |
| Pre-charge LBL to $V_{inh}$ | 1/0 | 0 | 0 | 0 | 0 | 0 | CK | 1 | 0 | X | X | X | H1/H4 | 0# | 0# | 0# | 1& |
| Charge WL, SSL, GSL | 1 | 0 | 0 | 0 | 0 | 1 | CK | 0 | H1' | 0 | H2 | H2/H3 | H1 | H2 | H2/H3 | 0 | 1& |
| Latch WL, SSL, GSL and discharge program-cell from LBL to GBL via data register | 1 | 0 | 0 | 0 | 0 | 0 | CK | 1 | 0 | X | H2→X | H2/H3→X | H1/H4 | H2# | H2#/H3# | 0# | 1& |
| Lock XB Driver | 1 | 1 | ⊓ | 0 | 0 | 0 | CK | 1 | 0 | X | X | X | H1/H4 | H2# | H2#/H3# | 0# | 0 |
| Unlock XB Driver | 1 | 0 | 0 | ⊓ | 0 | 0 | CK | 1 | 0 | X | X | X | H1/H4 | H2# | H2#/H3# | 0# | 1& |
| Discharge WL, SSL, GSL of selected Blocks | 1 | 0 | 0 | 0 | 0 | ⊓ | CK | 1 | ⊔⊓@ | 0 | 0 | 0 | H1/H4 | 0 | 0# | 0# | 1& |

Note: 1=Vdd; 0=0V; #=Floating; X=Don't Care; CK=clock pulse; VR=Sel WL Read voltage; 1&=Pull-up by weak resistor to Vdd; H1=Vread; H2=Vpass; H3=Vpgm; +=H1'=>Vread+Vt; @=H4'=>Vpp+Vt; VP=Sel WL sProgram Verify voltage; Vpgm is ramped step-wisely to Vpp=20V.

FIG. 6A (continued)

2nd Program Verify while 1st Read, Program, Program Verify, Erase Verify

| 2nd Program-Verify Operation | XB | XBM | ENS | CLR | CLA | XBP | PH | ENB | HXB | GSLp | SSLp | XT1~XT64 | VHH | SSL | WL1~WL64 | GSL | PAS |
|---|---|---|---|---|---|---|---|---|---|---|---|---|---|---|---|---|---|
| Initialization | 1/0 | 0 | 0 | 0 | ⊓ | 0 | 0 | 1 | 0 | 1 | 1 | 1/0 | 1 | 0# | 0# | 0# | 1& |
| Pre-charge LBL to $V_{inh}$ | 1/0 | 0 | 0 | 0 | 0 | 0 | CK | 1 | 0 | X | X | X | H1/H4 | 0# | 0# | 0# | 1& |
| Charge WL, SSL, GSL | 1 | 0 | 0 | 0 | 0 | 1 | CK | 0 | H1' | 1 | 1 | H1/VP | H1 | 1 | H1/VP | 1 | 1& |
| Latch WL, SSL, GSL to Discharge on-cell and Charge shares between LBL and GBL | 1 | 0 | 0 | 0 | 0 | 0 | CK | 1 | 0 | 1→X | 1→X | H1/VP→X | H1/H4 | 1# | H1#/VP# | 1# | 1& |
| Lock XB Driver | 1 | 1 | ⊓ | 0 | 0 | 0 | CK | 1 | 0 | X | X | X | H1/H4 | 1# | H1#/VP# | 1# | 0 |
| Unlock XB Driver | 1 | 0 | 0 | ⊓ | 0 | 0 | CK | 1 | 0 | X | X | X | H1/H4 | 1# | H1#/VP# | 1# | 1& |
| Discharge WL, SSL, GSL of selected Blocks | 1 | 0 | 0 | 0 | 0 | ⊓ | ⊓ CK | ⊓ | ⊓@ | 0 | 0 | 0 | H1/H4 | 0 | 0# | 0# | 1& |

Note: 1=Vdd; 0=0V; #=Floating; X=Don't Care; CK=clock pulse; VR=Sel WL Read voltage; 1&=Pull-up by weak resistor to Vdd; H1=Vread; H2=Vpass; H3=Vpgm; +=H1'=>Vread+Vt; @=H4'=>Vpp+Vt; VP=Sel WL sProgram Verify voltage; Vpgm is ramped step-wisely to Vpp=20V.

FIG. 6A (continued)

Dispersed Block Erase Operation

| Dispersed Blocks Erase & Erase Verify | | XB | XBM | ENS | CLR | CLA | XBP | PH | ENB | HXB | GSLp | SSLp | XT1~XT64 | VHH | SSL | WL1~WL64 | GSL | TPW | PAS |
|---|---|---|---|---|---|---|---|---|---|---|---|---|---|---|---|---|---|---|---|
| Initialization | | 0/1 | 0 | 0 | 0 | ⊓ | 0 | 0 | 1 | 0 | 1 | 1 | 1/0 | 1 | 0# | 0# | 0# | 0 | 1& |
| Setup | Unselected Block | 0 | 0 | 0 | 0 | 0 | 0 | CK | 1 | 0 | H5 | H5 | H5/H6/0 | H5 | H5# | H5# | H5# | H5 | 1& |
| | Selected Block | 1 | 0 | 0 | 0 | 0 | 0 | CK | 1 | 0 | H5 | H5 | H5/H6/0 | H5 | H5# | H5# | H5# | H5 | 1& |
| Erase | Unselected Block | 0 | 0 | 0 | 0 | 0 | 0 | CK | 0 | 0 | H5 | H5 | H5/H6/0 | H5 | H5# | H5# | H5# | H5 | 1& |
| | Selected Block | 1 | 0 | 0 | 0 | 0 | 0 | CK | ⊔⊓^ | H5 | H5 | H5/H6/0 | H5 | H5# | H5/H6/0# | H5# | H5 | 1& |
| | Discharge WL, SSL & GSL to 0V | 1 | 0 | 0 | 0 | 0 | 1 | CK | 0 | H1' | 0 | 0 | 0 | H1/H4 | 0 | 0 | 0 | 0 | 1& |
| | Precharge LBL to Vinh | 1/0 | 0 | 0 | 0 | 0 | 1 | CK | 1 | H1' | 1 | 1 | 0 | H1/H4 | 1 | H1/0 | 1 | 0 | 1& |
| | Charge WL, SSL, & GSL | 1 | 0 | 0 | 0 | 0 | 1 | CK | 0 | H1' | X | X | H1/0 | H1 | 1 | H1/0 | 1 | 0 | 1& |
| Erase Verify | Latch WL, SSL, GSL to discharge on-cell and charge shares between LBL & GBL | 1 | 0 | 0 | 0 | 0 | 0 | CK | 1 | 0 | 1→X | X | H1/0→X | H1/H4 | 1# | H1#/0# | 1# | 0 | 1& |
| | Lock XB Driver | 1 | 1 | ⊓ | 0 | 0 | 0 | CK | 1 | 0 | X | X | X | H1/H4 | 1# | H1#/0# | 1# | 0 | 0 |
| | Unlock XB Driver | 1 | 0 | 0 | ⊓ | 0 | 0 | CK | 1 | 0 | X | X | X | H1/H4 | 1# | H1#/0# | 1# | 0 | 1& |
| | Discharge WL, SSL, GSL of selected blocks | 1 | 0 | 0 | 0 | 0 | ⊔⊓ | CK | ⊔⊓† | 0 | 0 | 0 | H1/H4 | 0 | 0# | 0# | 0 | 1& |

Note: 1=Vdd; 0=0V; #=Floating; X=Don't Care; 1"=Vdd-Vtn; CK=clock pulse; VR=Sel WL Read voltage; 1&=Pull-up by weak resistor to Vdd; H1=Vread; +=H1'=>Vread+Vt; H5=Vers=20V; H6=Vers-ΔV, ΔV~ 3 to 5V; ^=H5'=H5+Vt

FIG. 6B

2nd Read while 1st Read, Program, Program Verify, Erase Verify

| 2nd Read Operation (Page/Dispersed Block) | Sk | XSM | ESS | CLR | CLA | XSP | PH | ESB | HXS | SEGp | VHV | SEG | S_PAS |
|---|---|---|---|---|---|---|---|---|---|---|---|---|---|
| Initialization | 1/0 | 0 | 0 | 0 | ⎍ | 0 | 0 | 1 | 0 | 1 | 1 | 0# | 1& |
| Pre-charge LBL to Vinh | 1/0 | 0 | 0 | 0 | 0 | 1 | CK | 1 | 0 | X | H1/H4 | 0# | 1& |
| Charge SEG | 1 | 0 | 0 | 0 | 0 | 1 | CK | 0 | H1' | H1 | H1 | H1 | 1& |
| Latch SEG to discharge on-cell and charge shares between LBL and GBL | 1 | 0 | 0 | 0 | 0 | 0 | CK | 1 | 0 | 1→X | H1/H4 | H1# | 1& |
| Lock SEG Driver | 1 | 1 | ⎍ | 0 | 0 | 0 | CK | 1 | 0 | X | H1/H4 | H1# | 0 |
| Unlock SEG Driver | 1 | 0 | 0 | ⎍ | 0 | 0 | CK | 1 | 0 | X | H1/H4 | H1# | 1& |
| Discharge SEG of selected Segments | 1 | 0 | 0 | 0 | 0 | ⎍ | CK | ⎍ | ⎍+ | 0 | H1/H4 | 0 | 1& |

2nd Program while 1st Read, Program, Program Verify, Erase Verify

| 2nd Program Operation | Sk | XSM | ESS | CLR | CLA | XSP | PH | ESB | HXS | SEGp | VHV | SEG | S_PAS |
|---|---|---|---|---|---|---|---|---|---|---|---|---|---|
| Initialization | 1/0 | 0 | 0 | 0 | ⎍ | 0 | 0 | 1 | 0 | 1 | 1 | 0# | 1& |
| Pre-charge LBL to Vinh | 1/0 | 0 | 0 | 0 | 0 | 1 | CK | 1 | 0 | X | H1/H4 | 0# | 1& |
| Charge SEG | 1 | 0 | 0 | 0 | 0 | 1 | CK | 0 | H2' | 1 | H2 | 1 | 1& |
| Latch SEG and discharge program-cell from LBL to GBL via data register | 1 | 0 | 0 | 0 | 0 | 0 | CK | 1 | 0 | 1→X | H1/H4 | 1# | 1& |
| Lock SEG Driver | 1 | 1 | ⎍ | 0 | 0 | 0 | CK | 1 | 0 | X | H1/H4 | 1# | 0 |
| Unlock SEG Driver | 1 | 0 | 0 | ⎍ | 0 | 0 | CK | 1 | 0 | X | H1/H4 | 1# | 1& |
| Discharge SEG of selected Segments | 1 | 0 | 0 | 0 | 0 | ⎍ | CK | ⎍ | ⎍! | 0 | H1/H4 | 0 | 1& |

2nd Program Verify while 1st Read, Program, Program Verify, Erase Verify

| 2nd Program Verify | Sk | XSM | ESS | CLR | CLA | XSP | PH | ESB | HXS | SEGp | VHV | SEG | S_PAS |
|---|---|---|---|---|---|---|---|---|---|---|---|---|---|
| Initialization | 1/0 | 0 | 0 | 0 | ⎍ | 0 | 0 | 1 | 0 | 1 | 1 | 0# | 1& |
| Pre-charge LBL to Vinh | 1 | 0 | 0 | 0 | 0 | 1 | CK | 1 | 0 | X | H1/H4 | 0# | 1& |
| Charge SEG | 1 | 0 | 0 | 0 | 0 | 1 | CK | 0 | H1' | H1 | H1 | H1 | 1& |
| Latch SEG to discharge on-cell and charge shares between LBL and GBL | 1 | 0 | 0 | 0 | 0 | 0 | CK | 1 | 0 | H1→X | H1/H4 | 1# | 1& |
| Lock SEG Driver | 1 | 1 | ⎍ | 0 | 0 | 0 | CK | 1 | 0 | X | H1/H4 | 1# | 0 |
| Unlock SEG Driver | 1 | 0 | 0 | ⎍ | 0 | 0 | CK | 1 | 0 | X | H1/H4 | 1# | 1& |
| Discharge SEG of selected Segments | 1 | 0 | 0 | 0 | 0 | ⎍ | CK | ⎍ | ⎍! | 0 | H1/H4 | 0 | 1& |

Note: 1=Vdd; 0=0V; #=Floating; X=Don't Care; CK=clock pulse; 1&=Pull-up by weak resistor to Vdd; H1=Vread; H2=Vpass; +=H1'=>Vread+Vt; !=H2'=>Vpass+Vt

FIG. 8A

Dispersed Block Erase Operation

| Dispersed Blocks Erase & Erase Verify | | Sk | XSM | ESS | CLR | CLA | XSP | PH | ESB | HXS | SEGp | VHV | SEG | TPW | S_PAS |
|---|---|---|---|---|---|---|---|---|---|---|---|---|---|---|---|
| Initialization | | 0/1 | 0 | 0 | 0 | ⊓ | 0 | 0 | 1 | 0 | 1 | 1 | 0# | 0 | 1& |
| Setup | Unselected Segment | 0 | 0 | 0 | 0 | 0 | 0 | CK | 1 | 0 | 1 | 1 | H5# | H5 | 1& |
| Setup | Selected Segment | 1 | 0 | 0 | 0 | 0 | 0 | CK | 1 | 0 | 1 | 1 | H5# | H5 | 1& |
| Erase | Unselected Segment | 0 | 0 | 0 | 0 | 0 | 0 | CK | 1 | 0 | 1 | 1 | H5# | H5 | 1& |
| Erase | Selected Segment | 1 | 0 | 0 | 0 | 0 | 0 | CK | 1 | 0 | 1 | 1 | H5# | H5 | 1& |
| Erase Verify | Discharge SEG driver to 0V | 1 | 0 | 0 | 0 | 0 | 1 | CK | 0 | H1' | 0 | H1 | 0 | 0 | 1& |
| Erase Verify | Precharge LBL to Vinh; Charge SEG | 1 | 0 | 0 | 0 | 0 | 1 | CK | 0 | H1' | H1 | H1 | H1 | 0 | 1& |
| Erase Verify | Latch SEG to discharge on-cell and charge shares between LBL & GBL | 1 | 0 | 0 | 0 | 0 | 0 | CK | 1 | 0 | H1→X | H1 | H1# | 0 | 1& |
| Erase Verify | Lock SEG Driver | 1 | 1 | ⊓ | 0 | 0 | 0 | CK | 1 | 0 | X | H1 | H1# | 0 | 0 |
| Erase Verify | Unlock SEG Driver | 1 | 0 | 0 | ⊓ | 0 | 0 | CK | 1 | 0 | X | H1 | H1# | 0 | 1& |
| Erase Verify | Discharge SEG of selected Segments | 1 | 0 | 0 | 0 | 0 | ⊓ | CK | ⊔ | ⊓+ | 0 | H1 | 0 | 0 | 1& |

Note: 1=Vdd; 0=0V; #=Floating; X=Don't Care; 1"=Vdd-Vtn; CK=clock pulse;
1&=Pull-up by weak resistor to Vdd; H1=Vread; +=H1'=>Vread+Vt; H5=Vers=20V

FIG. 8B

2nd Read while 1st Read, Program, Program Verify, Erase Verify

| 2nd Read Operation (Page/Dispersed Block) | XD | XSM | ESS | CLR | CLA | XDP | PH | ESB | HXD | Dlp | VHV | DI |
|---|---|---|---|---|---|---|---|---|---|---|---|---|
| Initialization | 1/0 | 0 | 0 | 0 | ⎍ | 0 | 0 | 1 | 0 | 1 | 1 | 0# |
| Pre-charge LBL to Vinh | 1 | 0 | 0 | 0 | 0 | 1 | CK | 1 | 0 | X | H1/H2/H4 | 0# |
| Charge DI | 1 | 0 | 0 | 0 | 0 | 1 | CK | 0 | H1' | H1 | H1 | H1 |
| Latch DI to discharge on-cell and charge shares between LBL and GBL | 1 | 0 | 0 | 0 | 0 | 0 | CK | 1 | 0 | 1→X | H1 | H1# |
| Lock DI Driver | 1 | 1 | ⎍ | 0 | 0 | 0 | CK | 1 | 0 | X | H1 | H1# |
| Unlock DI Driver | 1 | 0 | 0 | ⎍ | 0 | 0 | CK | 1 | 0 | X | H1 | H1# |
| Discharge DI of selected Segments | 1 | 0 | 0 | 0 | 0 | ⎍ | CK | ⎍ | ⎍+ | 0 | H1 | 0 |

2nd Program while 1st Read, Program, Program Verify, Erase Verify

| 2nd Program Operation | XD | XSM | ESS | CLR | CLA | XDP | PH | ESB | HXD | Dlp | VHV | DI |
|---|---|---|---|---|---|---|---|---|---|---|---|---|
| Initialization | 1/0 | 0 | 0 | 0 | ⎍ | 0 | 0 | 1 | 0 | 1 | 1 | 0# |
| Pre-charge LBL to Vinh | 1 | 0 | 0 | 0 | 0 | 1 | CK | 1 | 0 | X | H1/H2/H4 | 0# |
| Charge DI | 1 | 0 | 0 | 0 | 0 | 1 | CK | 0 | H2' | 1 | H2 | 1 |
| Latch DI to discharge program-cell from LBL to GBL via data register | 1 | 0 | 0 | 0 | 0 | 0 | CK | 1 | 0 | 1→X | H2 | 1# |
| Lock DI Driver | 1 | 1 | ⎍ | 0 | 0 | 0 | CK | 1 | 0 | X | H2 | 1# |
| Unlock DI Driver | 1 | 0 | 0 | ⎍ | 0 | 0 | CK | 1 | 0 | X | H2 | 1# |
| Discharge DI of selected Segments | 1 | 0 | 0 | 0 | 0 | ⎍ | CK | ⎍ | ⎍! | 0 | H2 | 0 |

2nd Program Verify while 1st Read, Program, Program Verify, Erase Verify

| 2nd Read Operation (Page/Dispersed Block) | XD | XSM | ESS | CLR | CLA | XDP | PH | ESB | HXD | Dlp | VHV | DI |
|---|---|---|---|---|---|---|---|---|---|---|---|---|
| Initialization | 1/0 | 0 | 0 | 0 | ⎍ | 0 | 0 | 1 | 0 | 1 | 1 | 0# |
| Pre-charge LBL to Vinh | 1 | 0 | 0 | 0 | 0 | 1 | CK | 1 | 0 | X | H1/H2/H4 | 0# |
| Charge DI | 1 | 0 | 0 | 0 | 0 | 1 | CK | 0 | H2' | H1 | H2 | H1 |
| Latch DI to discharge on-cell and charge shares between LBL and GBL | 1 | 0 | 0 | 0 | 0 | 0 | CK | 1 | 0 | H1→X | H2 | H1# |
| Lock DI Driver | 1 | 1 | ⎍ | 0 | 0 | 0 | CK | 1 | 0 | X | H2 | H1# |
| Unlock DI Driver | 1 | 0 | 0 | ⎍ | 0 | 0 | CK | 1 | 0 | X | H2 | H1# |
| Discharge DI of selected Segments | 1 | 0 | 0 | 0 | 0 | ⎍ | CK | ⎍ | ⎍+ | 0 | H2 | 0 |

Note: 1=Vdd; 0=0V; #=Floating; X=Don't Care; CK=clock pulse; 1&=Pull-up by weak resistor to Vdd; H1=Vread; H2=Vpass; +=H1'=>Vread+Vt; !=H2'=>Vpass+Vt

FIG. 8C

Dispersed Block Erase Operation

| Dispersed Blocks Erase & Erase Verify | | XD | XSM | ESS | CLR | CLA | XDP | PH | ESB | HXD | DIp | VHV | DI | TPW |
|---|---|---|---|---|---|---|---|---|---|---|---|---|---|---|
| Initialization | | 0/1 | 0 | 0 | 0 | ⎍ | 0 | 0 | 1 | 0 | 1 | 1 | 0# | 0 |
| Setup | | 0/1 | 0 | 0 | 0 | 0 | 0 | CK | 1 | 0 | 1 | 1 | H5# | H5 |
| Erase | | 0/1 | 0 | 0 | 0 | 0 | 0 | CK | 1 | 0 | 1 | 1 | H5# | H5 |
| Erase Verify | Discharge DI Driver to 0V | 1 | 0 | 0 | 0 | 0 | 1 | CK | 0 | H1' | 0 | H1 | 0 | 0 |
| | Precharge LBL to H1; Charge DI | 1 | 0 | 0 | 0 | 0 | 1 | CK | 0 | H1' | H1 | H1 | H1 | 0 |
| | Latch DI to discharge on-cell and charge shares between LBL & GBL | 1 | 0 | 0 | 0 | 0 | 0 | CK | 1 | 0 | H1→X | H1 | H1# | 0 |
| | Lock DI Driver | 1 | 1 | ⎍ | 0 | 0 | 0 | CK | 1 | 0 | X | H1 | H1# | 0 |
| | Unlock DI Driver | 1 | 0 | 0 | ⎍ | 0 | 0 | CK | 1 | 0 | X | H1 | H1# | 0 |
| | Discharge DI of selected Segments | 1 | 0 | 0 | 0 | 0 | ⎍ | CK | ⎌ | ⎍+ | 0 | H1 | 0 | 0 |

Note: 1=Vdd; 0=0V; #=Floating; X=Don't Care; 1"=Vdd-Vtn; CK=clock pulse; 1&=Pull-up by weak resistor to Vdd; H1=Vread; +=H1'=>Vread+Vt; H5=Vers=20V

FIG. 8D

2nd Read while 1st Read, Program, Program Verify, Erase Verify

| 2nd Read Operation (Page/Dispersed Block) | XP | From SEG Driver | | | | XPR | PH | ESB | HXP | PREp | VHV | PRE |
|---|---|---|---|---|---|---|---|---|---|---|---|---|
| | | XSM | ESS | CLR | CLA | | | | | | | |
| Pre-charge LBL to Vinh; Charge PRE driver | 1 | 0 | 0 | 0 | 0 | 1 | CK | 0 | H1' | H1' | H1 | H1' |
| Discharge PRE driver to discharge on-cell and charge shares between LBL and GBL | 1 | 0 | 0 | 0 | 0 | 0 | CK | 1 | 0 | H1' | H1 | 0 |

2nd Program while 1st Read, Program, Program Verify, Erase Verify

| 2nd Program Operation | XP | From SEG Driver | | | | XPR | PH | ESB | HXP | PREp | VHV | PRE |
|---|---|---|---|---|---|---|---|---|---|---|---|---|
| | | XSM | ESS | CLR | CLA | | | | | | | |
| Pre-charge LBL to Vinh; Charge PRE driver | 1 | 0 | 0 | 0 | 0 | 1 | CK | 0 | H2' | H2' | H2 | H2' |
| Discharge PRE driver to discharge program-cell from LBL to GBL via data register | 1 | 0 | 0 | 0 | 0 | 0 | CK | 1 | 0 | H2' | H2 | 0 |

2nd Program Verify while 1st Read, Program, Program Verify, Erase Verify

| 2nd Program Verify Operation | XP | From SEG Driver | | | | XPR | PH | ESB | HXP | PREp | VHV | PRE |
|---|---|---|---|---|---|---|---|---|---|---|---|---|
| | | XSM | ESS | CLR | CLA | | | | | | | |
| Pre-charge LBL to Vinh; Charge PRE driver | 1 | 0 | 0 | 0 | 0 | 1 | CK | 0 | H2' | H2' | H2 | H2' |
| Discharge PRE driver to discharge on-cell and charge shares between LBL and GBL | 1 | 0 | 0 | 0 | 0 | 0 | CK | 1 | 0 | H2' | H2 | 0 |

Note: 1=Vdd; 0=0V; #=Floating; CK=clock pulse; 1&=Pull-up by weak resistor to Vdd; H1=Vread; H2=Vpass; H1'=>Vread+Vt; H2'=>Vpass+Vt; SEG driver is referred to Fig. 7A

FIG. 10A

Dispersed Block Erase Operation

| Dispersed Blocks Erase & Erase Verify | | XP | XSM | ESS | XPR | PH | ESB | HXP | PREp | VHV | PRE | TPW |
|---|---|---|---|---|---|---|---|---|---|---|---|---|
| Initialization | | 0/1 | 0 | 0 | 0 | CK | 1 | 0 | 1 | 1 | 0# | 0 |
| Setup | | 0/1 | 0 | 0 | 0 | CK | 1 | 0 | 1 | 1 | H5# | H5 |
| Erase | | 0/1 | 0 | 0 | 0 | CK | 1 | 0 | 1 | 1 | H5# | H5 |
| Erase Verify | Discharge PRE Driver to 0V | 1 | 0 | 0 | 1 | CK | 0 | H1' | 0 | H1 | 0 | 0 |
| | Precharge LBL to H1; Charge PRE | 1 | 0 | 0 | 1 | CK | 0 | H1' | H1 | H1 | H1 | 0 |
| | Disable PRE Driver to discharge on-cell and charge share between LBL & GBL | 1 | 0 | 0 | 0 | CK | 1 | 0 | H1→X | H1 | H1# | 0 |

Note: 1=Vdd; 0=0V; #=Floating; 1"=Vdd-Vtn; CK=clock pulse; 1&=Pull-up by weak resistor to Vdd; H1=Vread; H1'=>Vread+Vt; H5=Vers

FIG. 10B

Table of DIV_EN for Read While Read at Different Groups

| | To Top | | | | |
|---|---|---|---|---|---|
| | 1st Read Group | 2nd Read Group | DIV_EN[1] | DIV_EN[2] | DIV_EN[3] |
| | 1 | 2 | 0 | 1 | 1 |
| | 1 | 3 | 0 | 0 | 1 |
| | 1 | 4 | 0 | 0 | 0 |
| | 2 | 3 | 1 | 0 | 1 |
| | 2 | 4 | 1 | 0 | 0 |

| | To Bottom | | | | |
|---|---|---|---|---|---|
| | 1st Read Group | 2nd Read Group | DIV_EN[1] | DIV_EN[2] | DIV_EN[3] |
| | 3 | 1 | 0 | 0 | 1 |
| | 3 | 2 | 1 | 0 | 1 |
| | 4 | 1 | 0 | 0 | 0 |
| | 4 | 2 | 1 | 0 | 0 |
| | 4 | 3 | 1 | 1 | 0 |

FIG. 11A

Table of DIV_EN for Program While Read at Different Groups

| | To Top 1st Read Group | From Bottom 2nd Program Group | DIV_EN [1] | DIV_EN [2] | DIV_EN [3] |
|---|---|---|---|---|---|
| | 1 | 2 | 0 | 1 | 1 |
| | 1 | 3 | 0 | 0 | 1 |
| | 1 | 4 | 0 | 0 | 0 |
| | 2 | 3 | 1 | 0 | 1 |
| | 2 | 4 | 1 | 0 | 0 |

| | To Bottom 1st Read Group | From Top 2nd Read Group | DIV_EN [1] | DIV_EN [2] | DIV_EN [3] |
|---|---|---|---|---|---|
| | 3 | 1 | 0 | 0 | 1 |
| | 3 | 2 | 1 | 0 | 1 |
| | 4 | 1 | 0 | 0 | 0 |
| | 4 | 2 | 1 | 0 | 0 |
| | 4 | 3 | 1 | 1 | 0 |

FIG. 12A

Table of DI, PRE, LBLps for pre-charging LBL during Read Operation

| Selected Block | DI[1] | DI[2] | DI[3] | PRE[1] | PRE[2] | PRE[3] | PRE[4] | LBLps[1] | LBLps[2] | LBLps[3] | LBLps[4] |
|---|---|---|---|---|---|---|---|---|---|---|---|
| Block 1 | H1' | H1' | H1' | H1' | H1' | H1' | H1' | H1 | H1 | H1 | H1 |
| Block 2 | H1' | H1' | H1' | H1' | H1' | H1' | H1' | H1 | H1 | H1 | H1 |
| Block 3 | H1' | H1' | H1' | H1' | H1' | H1' | H1' | H1 | H1 | H1 | H1 |
| Block 4 | H1' | H1' | H1' | H1' | H1' | H1' | H1' | H1 | H1 | H1 | H1 |

Table of DI, PRE, LBLps for pre-charging LBL during Program Operation

| Selected Block | DI[1] | DI[2] | DI[3] | PRE[1] | PRE[2] | PRE[3] | PRE[4] | LBLps[1] | LBLps[2] | LBLps[3] | LBLps[4] |
|---|---|---|---|---|---|---|---|---|---|---|---|
| Block 1 | 0 | 0 | 0 | H2' | 0 | 0 | 0 | H2 | 0 | 0 | 0 |
| Block 2 | 0 | 0 | 0 | 0 | H2' | 0 | 0 | 0 | H2 | 0 | 0 |
| Block 3 | 0 | 0 | 0 | 0 | 0 | H2' | 0 | 0 | 0 | H2 | 0 |
| Block 4 | 0 | 0 | 0 | 0 | 0 | 0 | H2' | 0 | 0 | 0 | H2 |

Table of DI, PRE, LBLps for pre-charging LBL during Erase Operation

| Selected Block | DI[1] | DI[2] | DI[3] | PRE[1] | PRE[2] | PRE[3] | PRE[4] | LBLps[1] | LBLps[2] | LBLps[3] | LBLps[4] |
|---|---|---|---|---|---|---|---|---|---|---|---|
| Block 1 | H5# | H5# | H5# | H5# | H5# | H5# | H5# | H5# | H5# | H5# | H5# |
| Block 2 | H5# | H5# | H5# | H5# | H5# | H5# | H5# | H5# | H5# | H5# | H5# |
| Block 3 | H5# | H5# | H5# | H5# | H5# | H5# | H5# | H5# | H5# | H5# | H5# |
| Block 4 | H5# | H5# | H5# | H5# | H5# | H5# | H5# | H5# | H5# | H5# | H5# |

Note: 0=0V; #=Floating; H1=Vread; H2=Vpass; H1'=>Vread+Vt; H2'=> Vpass+Vt; H5=Vers

FIG. 13B

MULTI-TASK CONCURRENT/PIPELINE NAND OPERATIONS ON ALL PLANES

1. CROSS-REFERENCES TO RELATED APPLICATIONS

This application claims priority to U.S. Provisional Application No. 61/877,959, filed Sep. 14, 2013, commonly assigned and incorporated by reference herein for all purposes.

2. BACKGROUND OF THE INVENTION

NAND memory is well known, most popular and cheapest NVM memories in the art that provides the desired in-system or in-circuit repeatedly electrically programmable and erasable functions with only a single low-voltage Vdd supply. Up to 2013, NAND memory has 2D or 3D types, of them are achieving the same highest density up to 128 Gb MLC per die. Micron's 128 Gb MLC 2D NAND flash is produced by using the most advanced 16 nm (1y-node) planner NAND cell to solve the scalability challenge below 2×nm, while Samsung's 128 Gb MLC 3D NAND flash uses a less-advanced node of 3×nm to achieve the same high density but with another kind of technology challenge such as aspect ratio of making a stacked 24-layer cells. In overall NAND industry perspective, the consensus of future NAND is that the 2D NAND flash can be further scaled down to 10 nm (1z-node) to achieve NAND density of near 1 Tb MLC, while the 3D NAND flash can be scaled down at most around 2×nm node to achieve the density above 1 Tb MLC for a lower die cost without using the costly fab facilities of 10 nm lithography machines as required for 2D NAND flash design.

Currently, when NAND is compared to other NVM memories such as OTP, ROM, EEPROM and NOR, 2D NAND flash memory has achieved the highest capacity of 128 Gb and scalability with the smallest feature of 16 nm node in 2013. The mainstream standalone 2D NAND in mass production is mainly based on 2-poly floating-gate NMOS cell device, while the 3D NAND flash is using the charge-trapping MONOS-type 3D NAND cells. One common feature of both 2D and 3D NAND is that both use same FN-channel tunneling program to increase NAND cell's Vt.

So far, the product design specs of both 2D and 3D NAND remain pretty much the same as Block Erase and Block Erase-Verify, Page Read, Page Program-Verify. In addition, both 2D and 3D NAND employ compatible 20V VPP on NAND cell's gate vs. cell's Vss channel for the same FN-channel Program operation. In terms of the preferred Erase operation, some new 3D NAND flash memories are using the GIDL effect to generate the hot-hole current to perform Block erase operation, rather than using the conventional FN-channel tunneling scheme in 2D NAND flash design. But some 3D NAND technology are still employing FN-channel tunneling scheme to perform the same Block Erase operation.

Either 2D or 3D NAND memory arrays comprise a plurality of NAND Blocks connected by a plurality of global long metal1 GBL lines and are organized in a matrix with a plurality of rows and columns. Each Block is further comprised of a plurality of NAND strings. Each string is further comprised of a plurality of NMOS NAND cells connected in series and is sandwiched by two NMOS 1-poly string-select transistors such as one MS located on a string top and one MG on a string bottom. The number of 2D NAND flash cells in one string can be made of 8, 16, 32, 64, 128 or arbitrary integer number, depending on NAND specs. But by 2013, the maximum number of 3D NAND cells in one 3D NAND-string is 24 as published from Samsung's 128 Gb MLC 3D NAND product in 2013 Flash Summit held in San Jose, Calif., USA.

In summary, all the conventional NAND designs only provide consolidated Block Erase, consolidated Block-Verify, Page Program, Page Program-Verify operations. But none of the existing 2D or 3D NAND designs can provide dispersed Block Erase, dispersed Block Erase-Verify, dispersed Block Program, dispersed Block Program-Verify operations. Typically, in both 2D and 3D NAND designs, each NAND cell has options of several different storage types that include SLC (1 bit per physical cell), MLC (2 bits per physical cell), TLC (3 bits per physical cell), XLC (4 bits per physical cell), and even analog storage that stores more than 4 bits per one physical NAND cell. Taking a 2-poly floating-gate 2D NAND array as an example, its array comprises a plurality of vertical NAND Blocks that further comprises a plurality of 64 T vertical NAND strings. When performing a Program operation in NAND memory, the spec indicates that it is performed in unit of one physical page or one physical WL or partial page or partial WL. In other words, one physical WL or page can be divided into 2, 4, 8 or more logic partial WLs or partial pages or sectors in the same NAND plane.

But when NAND is scaled below 3×nm node, the Program latency is getting higher and higher from 250 μs SLC to almost 500 μs SLC. Thus, the reduction of page Program time in both 2D and 3D NAND design is urgently required. In order to program more than one WL or page in one NAND plane, it still encounters a limitation of one physical WL Program per one plane. Multiple WLs or pages concurrent Program in one NAND plane is still prohibited so far. Similarly, the concurrent multiple-WL Read and Program-Verify operations are also not allowed, regardless of 2D or 3D NAND designs by 2013 since its first debut in 1988.

Now, details of performing Program operations based on the conventional NAND are illustrated. First of all, in terms of Program unit size, the so-called All-BL one-WL Program means that the program size is based on one full physical page or WL and the Program operation is performed in 1-cycle. Another one is named as Odd/Even page Program, which is performed in unit of two logic pages (i.e., two halves of a whole physical page). The whole physical page Program needs 2 cycles of such Odd and Even half-page Program operations. Additionally, the Partial WL Program operation can be on Odd and Even logic pages in each divided partial WL. Each partial WL Program is performed with 1-cycle. Four partial WLs or 4 sectors would require 4 cycles of program totally.

The page Program bias conditions include setting a selected WL to Vpgm. All gates of NAND cells in only one selected page are commonly coupled to Vpgm=15V to 25V in one selected Block using Incremental-step-pulse-programming (ISPP) Program scheme with $\Delta$Vpgm=0.15V to 0.5V for different SLC, MLC, TLC and XLC programs. This Vpgm voltage is always presented to the selected WL during each ISPP program from the selected Block-decoder to the selected long WL, regardless of whole or partial WL or Page Program operations.

One option of the page Program bias conditions also includes setting non-selected 63 WLs (assuming each Block contains 64 pages) to Vpass along with GSL set to Vss and SSL set to Vdd. All the unselected 63 pages or WLs for a NAND Block are coupled with Vpass of ~10V through the selected Block-decoder associated with 63 XTs voltages at 63 XT input bus. This HV Vpass voltage is always presented to 63 non-selected XT bus to 63 non-selected WLs through the selected Block-decoder during each IPPG ~25 μs program time. In whole 250 μs SLC Program, the 63 non-selected WL Vpass voltage will be repeatedly coupled to 63 non-selected WLs parasitic poly capacitors during each program pulse but be switched to VRAED of ~6V during each Program-Verify operation right after each Program operation.

Another option of the page Program bias conditions includes setting selected NAND cell's channel voltage in a select page to 0V. This 0V is coupled from one corresponding digital bit data=0 in PB (Page Buffer). The 0V is coupled to the channels of NAND cells through the selected NAND strings by coupling SSL with Vdd, then through the selected metala1 GBL lines to top PB's latch circuit for 1-metal BL NAND structure. The advantage of Program BL=0V, thus no GBL precharge current is required for the selected programmed cells.

Furthermore, the page Program bias conditions include setting channel voltages of unselected NAND cells in a selected page to a $V_{inhibit}$ voltage (program-inhibit, $V_{inhibit} \geq 7V$). The initial $V_{inhibit}$ is Vdd−Vt but finally it is boosted to a value greater than 7V for automatic program-inhibit by ramping up the selected WL gate voltage from an initial Vpass voltage to a Vpgm voltage that results in a high gate coupling effect to boost the initial floating channel voltage of Vdd−Vt of about 1V at 1.8V Vdd to above 7V for the unselected NAND cells in the same selected page or WL or partial WL. This is referred as the Self-Boosting (SB) effect. In the lengthy page Program operation for a whole conventional NAND array, the $V_{inhibit}$ and Vss program voltages are always presented to the channels of selected NAND cells, and Vdd and Vss are presented to GBL between the selected Block and Static PB on either array top or bottom of the selected page. Thus GBL lines are fully occupied by first NAND Program operation for a long time, during which the second Read or Program operation in the same NAND plane cannot be performed because the data contention will happen when second operation taking up the same selected GBL lines. Thus that is why a simultaneous Read and Program operation are inhibited in the same NAND plane of the conventional NAND designs.

For a NAND Program scheme, a low current FN channel tunneling effect is used to increase NAND cell's Vt from E state (erased state) to 3 program states such as A, B or C state for a MLC storage and 7 program states for TLC program and 15 program states for XLC program. The schemes of prior art NAND Program-inhibit voltage generation include SB, LSB and EASB, etc.

In a typical SLC NAND program operation, a high step-rising program voltage, Vpgm from 15V to 25V, is applied to one selected WL but a fixed Vpass voltage of about 10V is applied to the rest of 31 non-selected WLs in the selected strings along with the gate of bottom string-select transistor connected to Vss and the gate of top string-select transistor connected to Vdd. As a result, 31 NAND cells in same string are in conduction-state while the string's bit line is grounded for Program operation. Electrons from the channels of selected NAND cells are injected into the corresponding floating-gate layers, Poly1, and NAND cell threshold voltages, Vts, are raised from an erased Vt0, E-state (with a negative value), to a first programmed state Vt1, A-state (with positive value). More information about the programming methods can be found in U.S. Pat. No. 6,859,397, titled "Source Side Boosting Technique for Non-volatile Memory;" and U.S. Pat. No. 6,917,542, titled "Detecting Over Programmed Memory;" and U.S. Pat. No. 6,888,758, titled "Programming Non-Volatile Memory."

In many cases, the Vpgm pulse is applied to a selected WLn of NAND associated with several fixed MHV pass-WL voltages such as Vpass voltages of Vpass1, Vpass2, and others applied to the non-selected WLn−1 and WLn+1 and the rest of WLs in the selected NAND strings of the selected Blocks. A series of step-rising Vpgm pulses (referred to as the programming gate pulses) are applied to the selected WL, cited as WLn, per each program iteration. Between each rising Vpgm pulse, single or multiple program-verify pulses like Read operation are performed to determine whether the selected NAND cells(s) in each selected page or WL are programmed with the desired programmed Vtn values. The programmed Vtn values are determined by the type of storages such as SLC (1-bit per cell), MLC (2-bit per cell), TLC (3-bit per cell), XLC (4-bit per cell) or analog storage (more than 4-bit per cell).

Since Program-Verify operation is like the regular Read operation, the previously mentioned precharge cycle and discharge cycle for N GBLs and 64 WLs and SSL and GSL and 64 XT lines per each Block would be the same. Therefore, during each Program-Verify cycle, all vertical GBLs lines in cell array and the set of vertical XT and SSLp and GSLp lines in X-decoder area will be fully occupied with the desired voltages and cannot be further used for other concurrent operations in the conventional NAND designs in a same plane, regardless of SLC, MLC, TLC and XLC or even analog NAND Program operations.

In summary, for the conventional NAND key operations such as Read, Program, Program-Verify, Erase-Verify, etc. can only be performed one at a time to prevent the data contention from happening in multiple XT bus lines and GBL lines. But when NAND technology is continuously scaled down below 2xnm and the density being increased to 1 Tb, the above high latency, high power consumption and low flexibility of more than two simultaneous operations in same NAND plane becomes unacceptable for those fast NAND memory system applications.

As a result, there is a strong market need to reduce Read, Verify, and Program latency, power consumption and to provide more flexibility of multiple simultaneous operations in all NAND planes, regardless of 2D and 3D NAND flash designs. Nevertheless, it is preferred to have a 2-level BL universal hierarchical array structure based on which more than one preferred concurrent NAND operations of Read, Program, Program-Verify, and Erase-Verify in one or different NAND planes can be performed, regardless of different Erase schemes in 3D NANDs and 2D NANDs.

3. BRIEF SUMMARY OF THE INVENTION

This invention is related to NAND memory architecture and its associated concurrent operations. Specifically, the preferred 2D and 3D HiNAND2 memory arrays and a featured Latch design in Block decoder, Segment-decoder, and Group-decoder with local LBL power line per one Block for Program and per Segment for Read are provided for performing multiple-WL dispersed Block Program, dispersed Block Read, dispersed Block Erase-Verify, and dispersed Block Program-Verify operations with much enhanced array flexibility for multiple simultaneous operations in a same NAND plane or multiple different NAND planes.

In an embodiment, the present invention provides a preferred HiNAND2 array that comprises a 2-level BL-hierarchical structure with multiple (J) broken Groups and each Group comprises multiple (L) broken Segments arranged in column (Y) direction and each Segment is further comprised of multiple Blocks arranged in Y direction and each Block comprises a plurality of NAND strings arranged in row (X) direction, each NAND string comprises a number of memory transistors connected in Y direction. All Groups of the HiNAND2 array are connected by N top-level metal2 global bit lines (GBLs) in Y direction. Each Group is connected with multiple top-level metal2 broken-GBLs by multiple GBL-divided devices so that each Group is associated with one top-level metal2 broken-GBL. A preferred 2-level BL-hierarchical structure is provided to introduce 2N bottom-level metal1 local bit lines (LBLs) in parallel with and associated with the N top-level metal2 broken-GBL lines. The N top-level metal2 broken-GBLs are arranged with loose 4λ x-pitch (2λ GBL line width and 2λ GBL spacing) and the 2N bottom-level metal1 LBLs are arranged with tight 2λ x-pitch (1λ LBL line width and 1λ LBL spacing) for this HiNAND2 array to save metal process cost and yield.

In the embodiment, the N top-level metal2 broken-GBL lines connected by GBL-divided devices are used to connect the multiple NAND Groups in Y-direction within one NAND plane. Each Group is further divided to L Segments connected together only by the top-level metal2 broken-GBL lines. Each Segment is also connected by the 2N bottom-level local LBL lines. Each local metal1 LBL associated with each Segment is divided by m−1 LBL-divided devices into m sub-Segments respectively associated with m metal1 broken-LBL lines. Each of the GBL-divided devices and LBL-divided devices is a high-voltage (HV) 1-poly NMOS transistor. Each sub-Segment includes K Blocks and each Block further comprises N pairs of interleaving Odd and Even NAND strings with total 2N string source nodes connecting to a horizontal metal0 common source line (CSL) (at a level below the metal1 line) shared by two adjacent Blocks. All K/2 CSL lines are connected together within each sub-Segment and further connected together within each Group (i.e., each Group has one CSL line). Furthermore, each sub-Segment has one dedicated LBLps power/source line laid out as another metal0 line in X direction and connected to the 2N metal1 broken-LBL lines in Y direction via 2N 1-poly NMOS devices with their common gates tied to one corresponding control signal.

Unlike the prior-art NAND array architecture with only N pairs of Odd and Even unbroken GBLs running through a whole NAND array in Y direction from top Page Buffer (PB), this HiNAND2 array has J×N pairs of Odd and Even metal1 LBL lines connecting to corresponding J×N metal2 broken-GBL lines to allow the desired multiple NAND concurrent and continuous operations to be performed, regardless of same or different planes, regardless of 2D or 3D NAND flash memories without having tight metal2 penalty.

In another embodiment, the present invention provides a preferred method for forming a plurality of 2N-bit Dynamic PBs (DPB) by using a plurality of 2N short metal1 broken-LBL lines as one page of 2N capacitors inside each Segment of each Group to allow the temporary storing of the 2N-bit analog or digital data for several following preferred concurrent operation purposes.

a) Storing 2N-bit temporary Page program data of Vss and $V_{inhibit}$ loaded from PB:
  The page data of Vss voltage is for program cells and another page data of $V_{inhibit}$ is for Program-inhibit cells for one select WL of one select Block within one corresponding Segment during multiple-WL, multiple-Segment Program operation. The Multiple Segments can be flexibly selected from only one or up to J groups.
b) Storing 2N-bit of temporary $V_{inhibit}$ precharged voltage supplied by each Segment's power line of LBLps:
  All 2N metal1 LBLs inside the selected Segments are precharged with $V_{inhibit}$ for all N-bit NAND cells in multiple selected pages during the preferred multiple-WL, Multiple-Block and Multiple-Segment concurrent Read, Program-Verify, and Erase-Verify operations.
c) Storing 2N-bit temporary transient Page program data of Vss and $V_{inhibit}$ in accordance with the sensed Vts from 2N selected WL cells during the iterative Program-Verify and Erase-Verify operations or Read operation:
  The 2N-bit DPBs are using 2N available parasitic capacitors such as 2N short metal1 broken-LBL lines or N metal2 broken-GBL lines to temporarily store the 2N-bit LBL voltages for different NAND operations without taking extra NAND array silicon area in peripheral circuit as opposing to the conventional NAND which wastes a large silicon area to form a N-bit Latch circuits in both top and bottom Static Page Buffers (SPBs).

In yet another embodiment, the present invention provides two preferred methods for locking-in a preferred 2N-bit page program data. A first method is to sequentially store or lock multiple 2N-bit page program data patterns preferably in the selected multiple local DPBs regions within multiple selected Segments while sacrificing certain flexibility of performing multiple NAND operations in the same NAND plane because in this method 2N metal1 broken-LBL lines are fully occupied without allowing usages for other NAND operations within the Blocks associated with the same 2N metal1 broken-LBL lines. A second method is to store or lock multiple 2N-bit page program data patterns preferably in the channel regions of selected multiple 2N-bit NAND cells within the selected pages of the selected Blocks with highest flexibility of performing multiple NAND operations in a same NAND plane because in this method 2N metal1 broken-LBL lines are released or available for other key NAND operations. In the second method, the Vss and $V_{inhibit}$ voltages in the channels of the select NAND cells in multiple selected WLs have to be maintained stable first after ramping up multiple WLs' voltage to Vpgm before turning off a common gate (SSL) voltage of corresponding string-select transistors to isolate from the selected strings from the 2N-bit DPB's capacitors. In this manner, the channels with Vss and $V_{inhibit}$ voltages under multiple selected WLs would not be affected so that it is ensured the page program can be successful.

In still another embodiment, the present invention provides two preferred methods for locking in the preferred precharged metal1 LBL voltage, $V_{LBL}$, for all LBLs in multiple selected DPBs in multiple selected Segments with a value ranging from 1V to 7V or more, regardless of a full physical page or a partial logic-page Read, Program-Verify, and Erase-Verify operations. The 7V is selected or determined by the minimum BVDS (N+/P junction voltages) of Segment's power NMOS device MDBLs or a string-select device MS in the NAND string as shown in FIG. 4. In embodiments of the present invention, two NMOS transistors of MS and MDBLs are preferably made of the same type device with same BVDS spec to meet the 7V or more for both $V_{inhibit}$ voltage used for Program and $V_{LBL}$ voltage used for Read, Program-Verify, Erase-Verify, etc.

A first method is for performing multiple-page operations of Read or Verify without precharging all 2N metal1 LBL lines in the DPB with program data pattern but precharging only 2N shorter metal1 broken-LBL lines in the selected multiple Segments with a $V_{LBL}$ voltage from a few selected Segments' power lines to reduce the high power consumption (when the $V_{LBL}$ is supplied from NAND array top SPB through N long GBL lines). A second method is for precharging the $V_{LBL}$ voltage from the SPB through the N long GBLs lines and capacitors. This method, compared to the first one, uses much higher power consumption and slower discharge BL speed, thus slower Read, Program-Verify, and Erase-Verify with higher WL stress.

In an alternative embodiment, the present invention provides a preferred Group-decoder, Segment-decoder, and Block-decoder incorporated with one respective Latch circuit along with the preferred HiNAND2 array to allow performing multiple key NAND operations simultaneously in a full page or a partial page in all NAND planes during any time intervals of availability of the full or partial 2N metal1 LBL lines and N metal2 GBL lines. The desired simultaneous NAND operations include the followings:

a) $2^{nd}$ Read while $1^{st}$ Read,
b) $2^{nd}$ Read while $1^{st}$ Program,
c) $2^{nd}$ Read while $1^{st}$ Program-Verify
d) $2^{nd}$ Read while $1^{st}$ Erase-Verify
e) $2^{nd}$ Program while $1^{st}$ Read,
f) $2^{nd}$ Program while $1^{st}$ Program,
g) $2^{nd}$ Program while $1^{st}$ Program-Verify
h) $2^{nd}$ Program while $1^{st}$ Erase-Verify
i) $2^{nd}$ Program-Verify while $1^{st}$ Program,
j) $2^{nd}$ Program-Verify while $1^{st}$ Read,
k) $2^{nd}$ Program-Verify while $1^{st}$ Program-Verify,
l) $2^{nd}$ Program-Verify while $1^{st}$ Erase-Verify.

As long as the 2N LBL lines and N GBL lines are available in some detectable time slots to allow transferring of page data without causing any data contention, then all Blocks can be selected for multiple-WL simultaneous page and partial-page Program without any limitation. But only one Block per one Group for the whole NAND array can be selected for performing the simultaneous multiple Page Read, Program-Verify, and Erase-Verify operations in all HiNAND2 planes supported by preferred Block-decoder, Segment-decoder, and Group-decoders with a unique latch circuit.

In a specific embodiment, the present invention provides a novel Block-decoder with a latch circuit and a busy reporter circuit so that the high voltages (HV) in selected Block's multiple WLs as well as voltages in two string-select lines SSL and GSL can be latched into corresponding poly parasitic capacitors when the desired operations are being started simultaneously. As the result, multiple 64 XT bus line, SSLp signal line, and GSLp signal line in the Block-decoder can be released for next simultaneous operation that needs to supply new address data into the 64 XTs, SSL, and GSL bus. The associated 2N LBL voltages in the selected Blocks of the selected Segments or Groups are also latched in accordance with the desired simultaneous operations.

In another specific embodiment, the present invention provides a novel Segment-decoder with a latch, a busy reporter and two outputs of SEG and Sk (shown in FIG. 7A) so that multiple selected sets of Vpass, Vdd, and Vss voltages of common 64 XTs, SSLp and GSLp for multiple selected Blocks in multiple selected broken LBLs in multiple selected Segments can be latched into multiple sets of poly parasitic capacitors of 64 WLs, SSL, and GSL when the desired operations are started simultaneously. After latching, the multiple 64 XTs, SSLp, and GSLp bus lines can be released for next simultaneous operation that needs to supply new different address data into 64 XTs, SSLp, and GSLp bus lines. The associated 2N LBL voltages in the selected Blocks of the selected Segments or Groups are also latched in the corresponding DPB in accordance with the desired simultaneous operations.

In yet another specific embodiment, the present invention provides a novel PRE-generator, which is used to enable and disable both precharge and discharge of a desired common $V_{inhibit}$ and $V_{LBL}$ voltages to the selected 2N metal1 LBL capacitors of each corresponding DPB from or to the selected Block-decoder power lines in the beginning or ending of the preferred concurrent Read, Program, Program-Verify, and Erase-Verify operations.

In still another specific embodiment, the present invention provides a novel Block-decoder with a latch circuit and a busy reporter circuit configured to latch HV to desired multiple 64 WLs voltages as well as the SSL and GSL voltages upon concurrent program command, and to control 66 bus lines including 64 XTs and two Block-select lines SSLp and GSLp so that they, after the latch, can be immediately released for next desired concurrent operation to supply next newly selected WL addresses of next multiple selected Blocks of the next selected Segments of the next Groups for the preferred simultaneous operations.

In yet still another specific embodiment, the present invention provides a method for simultaneously precharging and latching and discharging of multiple selected 64 WLs, SSL and GSL lines, LBLs of multiple selected Blocks of the selected Segments of the Groups to achieve faster concurrent Read, Program-Verify, Erase-Verify, and Program operations.

In another alternative embodiment, the present invention provides a common Latch-clear signal configured to allow the resetting of the currently selected Block-decoder, Segment-decoder, and Group decoder when addressed decoders are matched and currently executing operations are completed. This signal is defined as a new command for this HiNAND2 memory.

In yet another alternative embodiment, the present invention provides a flexible Erase operation that allows one to 64 WLs to be randomly and independently selected in just one or more dispersed Blocks in different Segments and Groups. For example, if one Block has 5 WLs being selected for simultaneous Program in total 64 Blocks, then totally, there would be 320 WLs being selected for simultaneous Erase in this operation. Totally, 64×64 WLs can be also selected for concurrent dispersed-Block Erase operation. For a second example, any number combinations of WLs from one to 64 in the 64-cell NAND string in any selected Blocks can be flexibly selected for concurrent erase.

Note, the $V_{WL}$=0V for erased WLs but $V_{WL}$=floating for non-erased WLs. The procedure of setting VWL=0V or VWL=floating have to be set by two steps. In the first step, all 64 WLs, SSL and GSL in each selected block are set to be floating first before TPW voltage being ramped to Vers voltage around 20V. When TPW voltage is 20V, then all 64 WLs would be coupled to the same 20V with initial floating at 0V. Then the second step the multiple selected WLs are discharged to 0V for erase but the remaining WLs are charged to 20V from the corresponding XT signals so that the discharging erased-WL to 0V would not affect the non-erased WL voltage. As a result, any number of WLs in any block can be safely selected for erase without resulting in the Erase disturbance to the non-erased WLs in each selected Block.

In still another alternative embodiment, the present invention provides an Erase-Verify scheme that is preferably performed like a concurrent Read operation. The Erase-Verify operation is performed to check if a LBL capacitor is discharged to determine the selected programmed NAND cells' Vt above the desired programmed Vts. If the precharged $V_{LBL}$ voltage applied in this operation is retained, then the Vts of the selected erased cells have not been erased to a desired negative value of −0.5V, thus the next Erase pulse has to be applied again. If the $V_{LBL}$ voltage is discharged to Vss, then it proves the selected erased cells Vts in one or more WLs in multiple selected Blocks have been lowered to the desired Vt value below of −0.5V, thus the Erase operation can be stopped to complete the Erase cycle. This novel Erase operation is more accurate and faster than conventional Erase operation that was performed to ground all 64 WLs and supply Vdd to CSL line to determine the erased Vt state by checking the corresponding GBL is charged up or not.

In yet still another alternative embodiment, the present invention provides an Erase-protection method for floating SSL output shown below in FIG. 4, floating SEG output shown in FIG. 5 as well as floating PRE output shown in FIG. 9 to protect over those NMOS devices in HiNAND2 array such as the Segment's Odd-select transistor MLBLo and Even-select transistor MLBLe and Block-select transistors MS and MB and the LBLps power line transistor of MDBLs, GBL-divided transistor MGBLp from being gate breakdown during NAND Erase operation that is coupled to 20V.

In a specific embodiment,

4. BRIEF DESCRIPTION OF THE DRAWINGS

FIG. 6A is a diagram showing several preferred sets of bias voltage conditions of each Block-decoder of FIG. 5 to work with the 2D or 3D HiNAND2 array for performing multiple concurrent NAND operations in a same or multiple different NAND planes according to an embodiment of the present invention.

FIG. 6B is a diagram showing several preferred sets of bias voltage conditions of signals XB, XBM, ENS, CLR, CLA, XBP, PH, ENB, HXB, GBLp, SSLp, XT1-XT64, VHH, SSL, GSL, WL1-WL64, and PAS for controlling a dispersed Block Erase concurrent operation according to an embodiment of the present invention.

FIG. 8A is a diagram showing several preferred sets of bias voltage conditions for the Segment-decoder circuit of FIG. 7A to work with the 2D HiNAND2 array shown in FIG. 4 to control multiple simultaneous NAND operations in a same 2D NAND plane or multiple different 2D NAND planes according to an embodiment of the present invention.

FIG. 8B shows several preferred sets of bias voltage conditions of signals Sk, XSM, ESS, CLR, CLA, XSP, PH, ESB, HXS, SEGp, VHV, SEG, and S_PAS for controlling a dispersed Block Erase operation of both 2D and 3D HiNAND2 arrays according to an embodiment of the present invention.

FIG. 8C shows several preferred sets of bias voltage conditions for the DI-decoder circuit of FIG. 7B to work with the HiNAND2 array to control multiple simultaneous NAND operations in a same NAND plane or multiple different NAND planes according to an embodiment of the present invention.

FIG. 8D shows several preferred sets of bias voltage conditions of signals XD, XDM, ESS, CLR, CLA, XDP, PH, ESB, HXD, DIp, VHV, and DI for controlling a dispersed Block Erase concurrent operation according to an embodiment of the present invention.

FIG. 10A shows several preferred sets of bias voltage conditions for the PRE signal generator circuit of FIG. 9 to work with the HiNAND2 array for controlling multiple simultaneous NAND operations in the same NAND plane or multiple different NAND planes according to an embodiment of the present invention.

FIG. 10B shows several preferred sets of bias voltage conditions of XP and group signals from SEG driver such as XSM, ESS, CLR, CLA, XPR, PH, ESB, HXP, PREp, VHV, and PRE for performing a dispersed Block Erase operation according to an embodiment of the present invention.

FIG. 11A shows a simplified circuit block diagram and two tables of bias conditions of three DIV_EN signals for performing a second Read operation at a Group while performing a first Read operation at a different Group along with a simplified HiNAND2 array with a schematic Block diagram of four Groups divided by three GBL transistors MGBL gated by three DIV_EN signals such as DIV_EN[1], DIV_EN[2] and DIV_EN[3] according to a specific embodiment of the present invention.

Figure 11B:
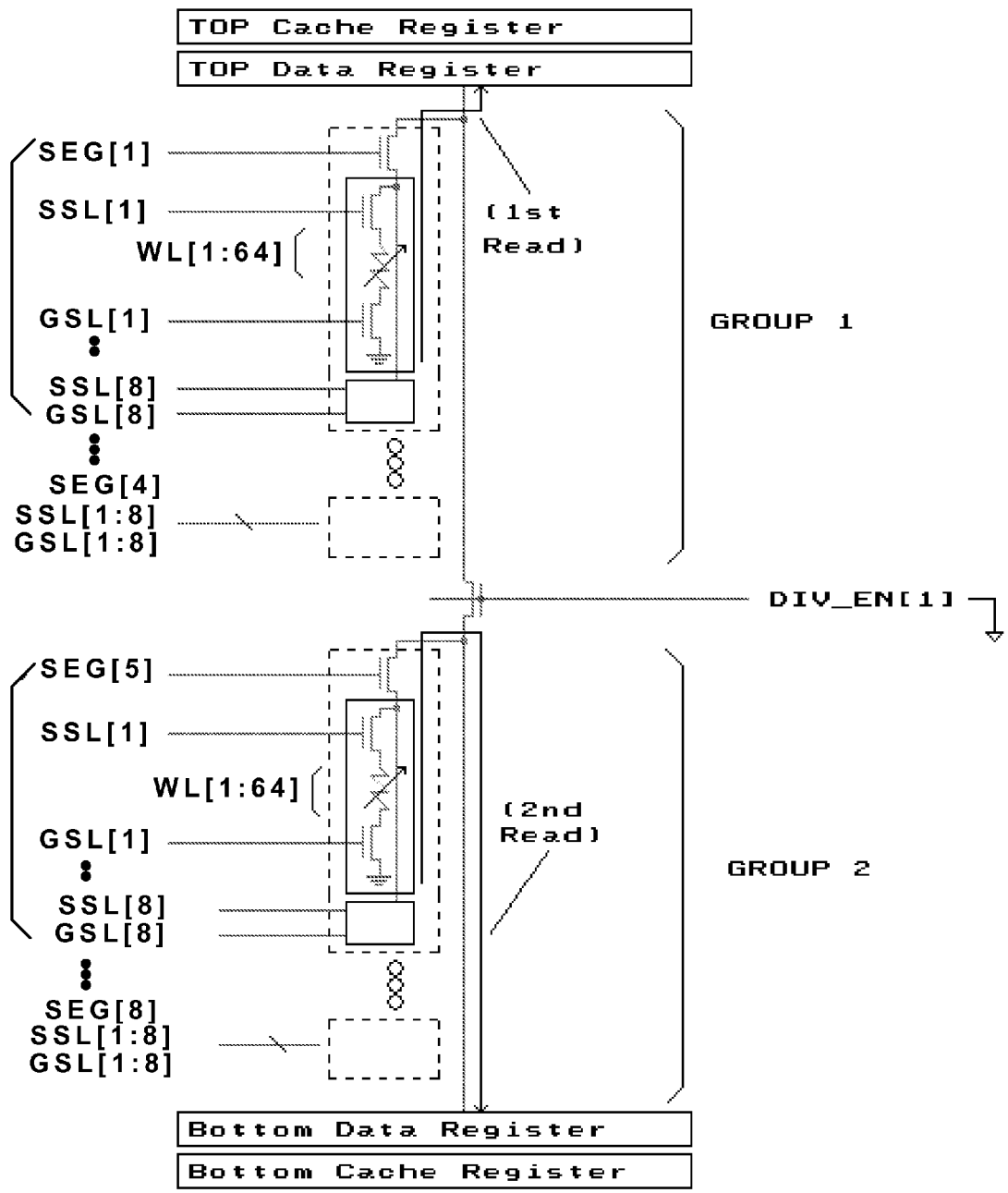

FIG. 11B shows a preferred data flow for concurrently performing a second Read operation along with a first Read operation at two different Groups in a HiNAND2 array according to another specific embodiment of the present invention.

Figure 11C:
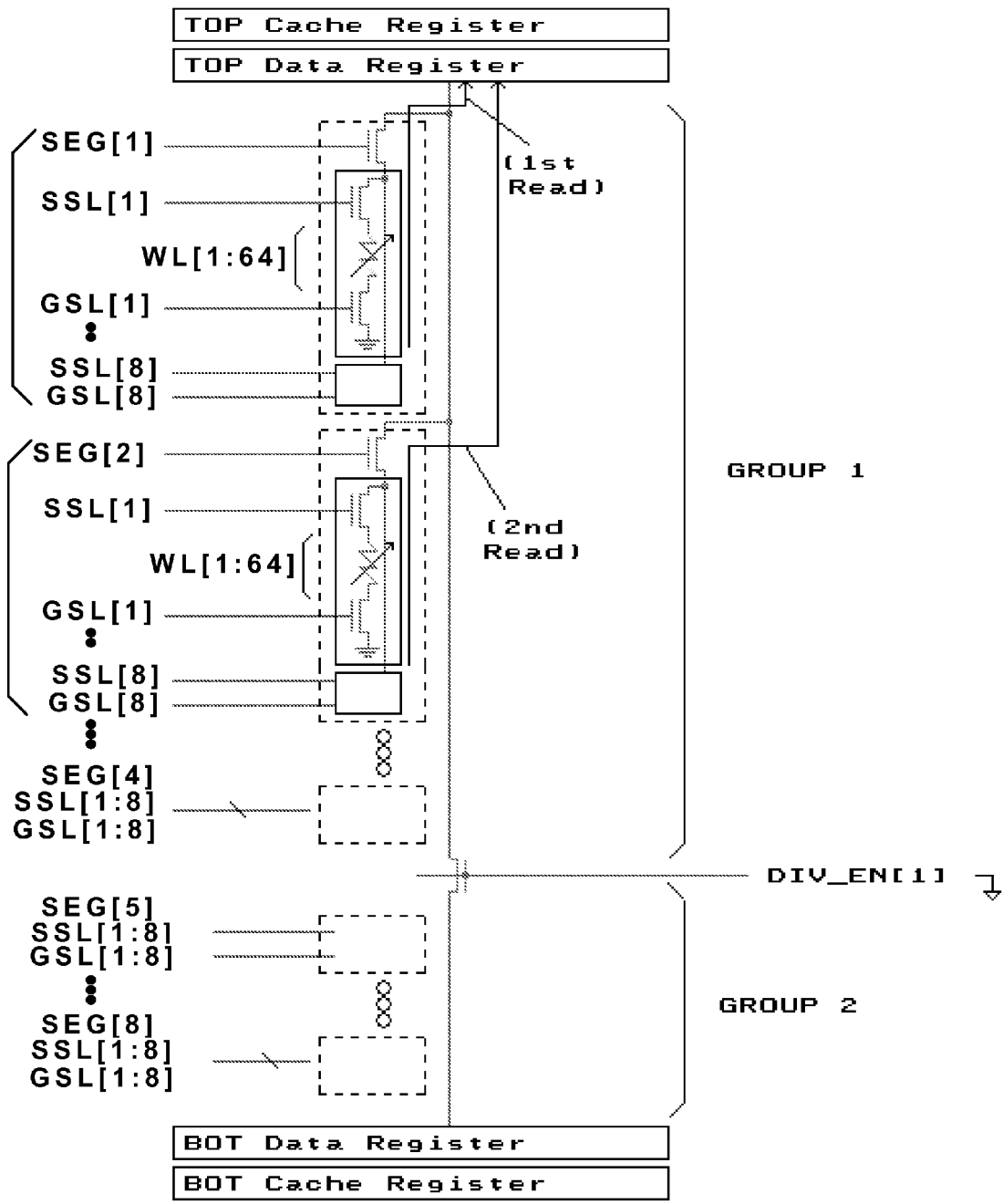

FIG. 11C shows another preferred data flow for concurrently performing a second Read operation along with a first Read operation at a same Group in a HiNAND2 array according to another specific embodiment of the present invention.

FIG. 12A shows two tables of bias conditions of DIV_EN for performing a second Program operation while performing a first Read operation at different Groups along with a simplified HiNAND2 array according to an alternative specific embodiment of the present invention.

Figure 12B:
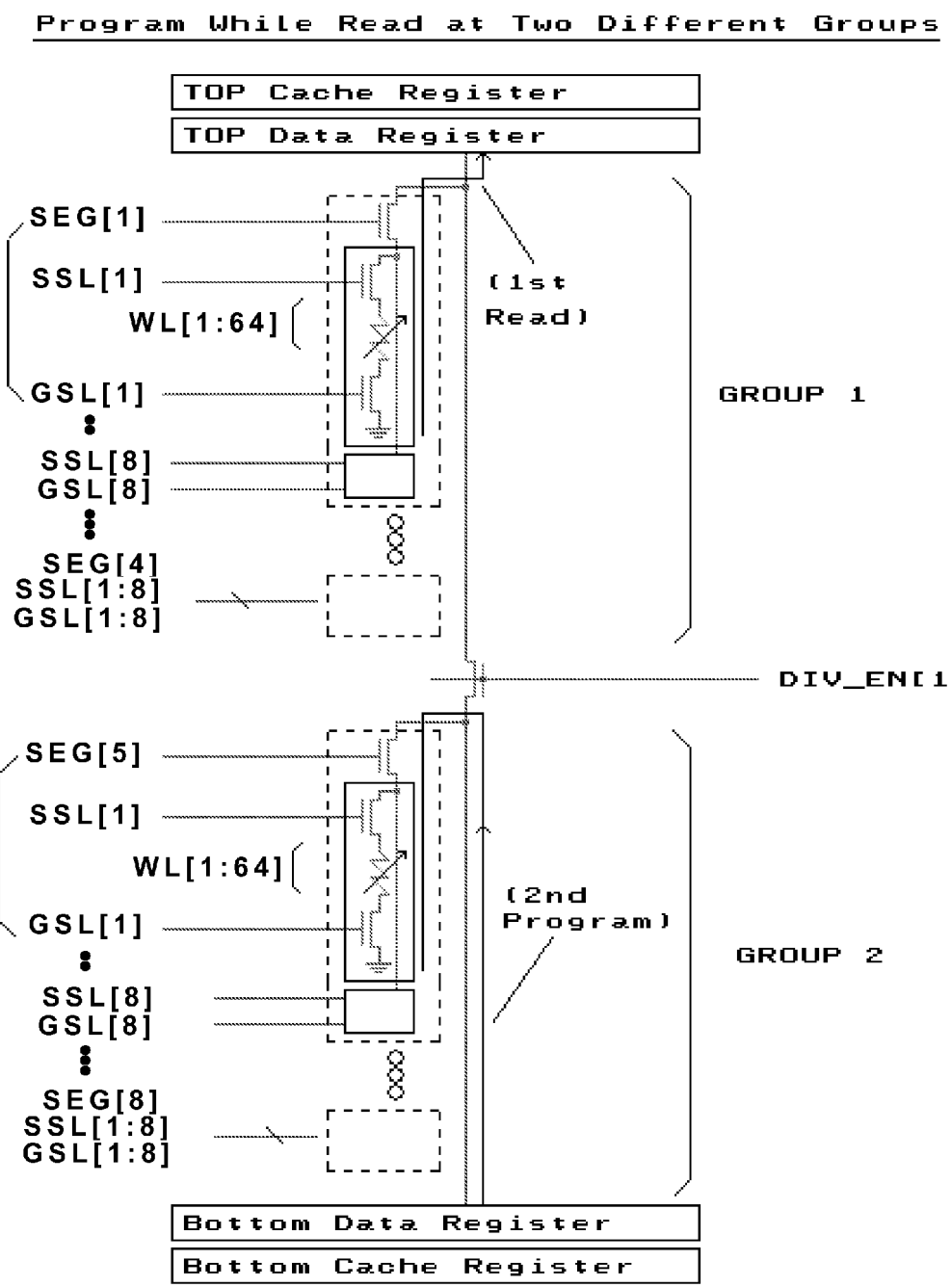

FIG. 12B shows a preferred data flow for concurrently performing a second Program operation along with a first Read operation at two different Groups in a HiNAND2 array according to another alternative specific embodiment of the present invention.

Figure 12C:
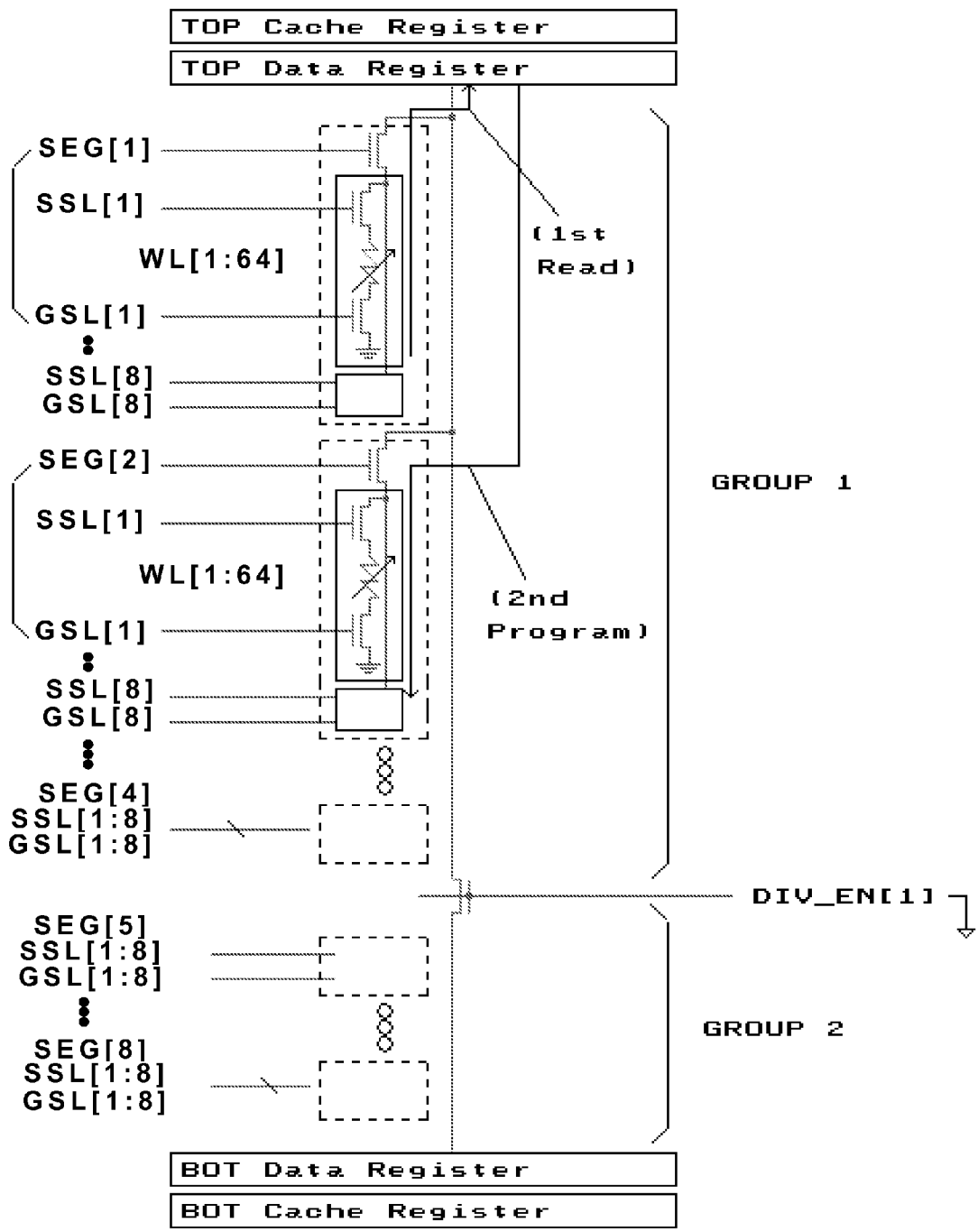

FIG. 12C shows a preferred data flow for concurrently performing a second Program operation along with a first Read operation at a same Group in a HiNAND2 array according to another alternative specific embodiment of the present invention.

Figure 13A:
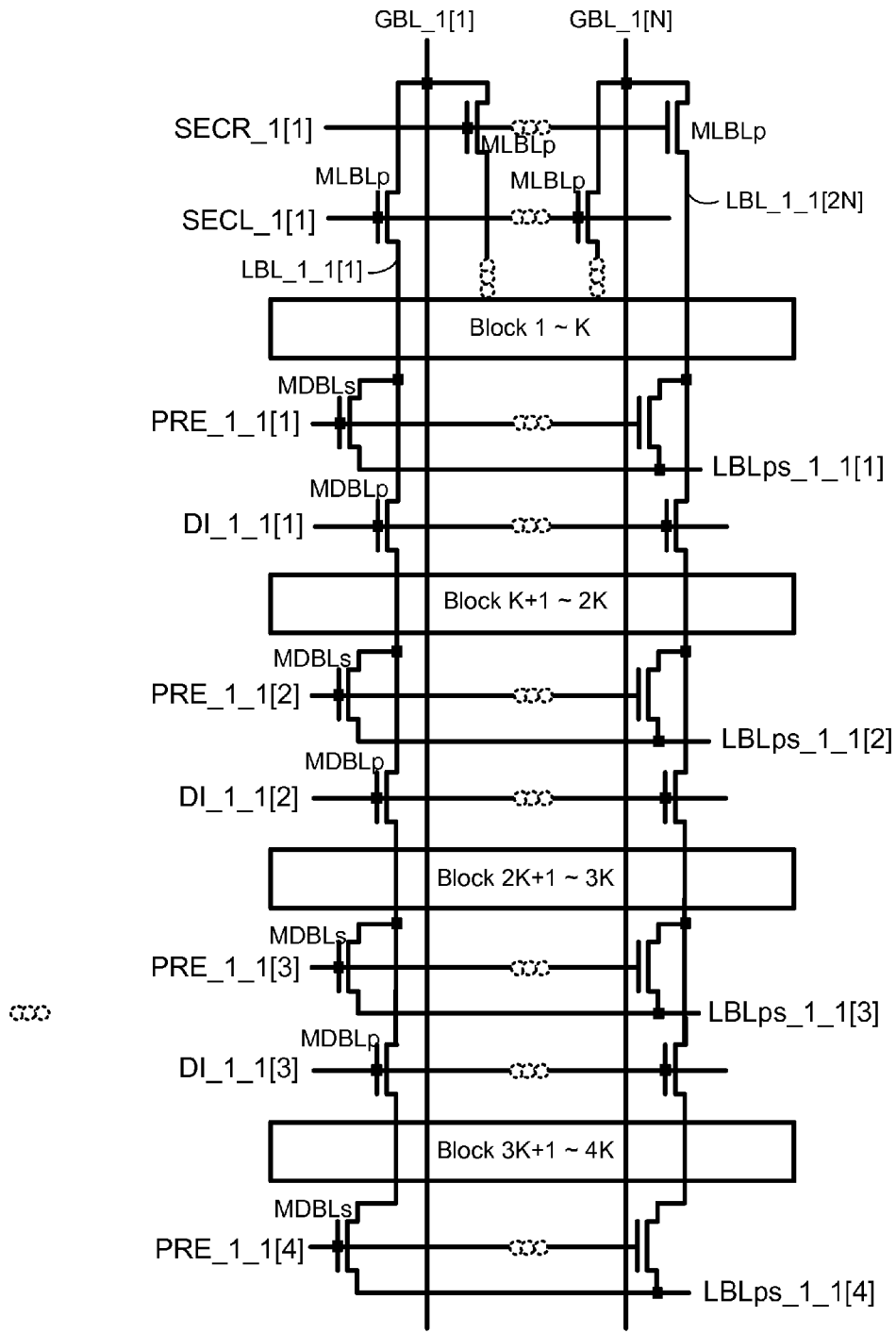

FIG. 13A shows one simplified Segment circuit of a 2D HiNAND2 array with four broken-LBL lines configured to allow the performance of the preferred concurrent Read, Program, Program-Verify, and Erase-Verify operations in a same plane or different planes according to an embodiment of the present invention.

FIG. 13B shows three tables that contain the preferred bias voltages for respective control signals such as DI, PRE, and power lines of LBLps for the preferred concurrent operations in multiple Segments in multiple Groups of the simplified 2D HiNAND2 array of FIG. 13A and the preferred 3D HiNAND2 array as shown in FIGS. 3A-3E in according to an embodiment of the present invention.

5. DETAILED DESCRIPTION OF THE INVENTION

This invention is related to 2-level BL-hierarchical NAND memory architecture and associated concurrent operations. Specifically, preferred 2D and 3D HiNAND2 memory arrays including top-level Global bit lines (GBLs) and bottom-level Local bit lines (LBLs) associated with multiple Blocks of NAND cells in multiple divided sub-Segments in multiple Segments in multiple Groups and a featured Latch design in various decoders for each Block, Segment, and Group with one common dedicated metal0 power line per Segment provide 2N-bit LBL dynamic page buffers (DPB) made by 2N LBL metal parasitic capacitors per Segment and further provide 2N-bit broken-LBL DPB made by 2N broken-LBL metal parasitic capacitors per sub-Segment. The novel memory architecture and decoder designs of the present invention allow performance of multi-task flexible concurrent/pipeline operations including multiple-WL or partial-WL Program operation in sub-Segment-based dispersed Blocks and multiple-WL or partial-WL Read, Erase-Verify, and Program-Verify operations in Segment-based dispersed Blocks with much enhanced array flexibility and multiple-fold performance improvements in same or different planes of 2D or 3D HiNAND2 flash memory.

In NAND Program and Erase operations, the FN-channel tunneling scheme is commonly used, regardless of 2D or 3D NAND flash. The following explanations should be treated as more like a general description for both 2D and 3D NAND flash operations. If the following descriptions are not specifically mentioned or differentiated between 2D and 3D NAND below, it should be taken generally as for both 2D and 3D NAND designs.

In today's conventional NAND technology, a typical high-density, nGb, NAND flash array architecture is comprised of a plurality of NAND planes cascaded in rows in X-direction and columns in Y-direction. The number of rows and columns of NAND planes can be 2, 4 or 8 or more and is optimally determined by the trade-off of the chip layout and performance.

Each NAND plane includes a plurality of NAND blocks that are then physically cascaded in Y-direction and are connected by a plurality of very long, parallel and unbroken 1-level hierarchical metal1 BLs. And each NAND block further includes a plurality of NAND strings cascaded in a row in the X-direction. Each NAND string includes a plurality of M NAND cells in series and is sandwiched by one top and one bottom string-selected transistors. The value of M can be 8, 16, 32, 64, 128 or any arbitrary integer number, depending on the NAND specs and applications. All gates of M NAND cells in same physical locations and two select transistors in the plurality of corresponding NAND strings within same block are connected together to form M+2 long, parallel and unbroken WLs, SSL, and GSL lines with a large horizontal parasitic poly2 capacitors running in X-direction.

The numbers of optimal planes, groups, segments, blocks and strings are fully determined by the trade-off of the design factors such as the optimal chip size, chip performance, design features, specs, P/E cycles and data reliability concerns of the NAND flash memory. In an exemplary case of 1-row and 2-plane NAND flash memory, the main NAND plane-decoder is preferably placed in the middle of the NAND array between the Odd and Even number NAND planes. The Block-decoder can be placed in the middle of the NAND array between two NAND planes in one row so that each Block-decoder's multiple outputs can be used to drive the multiple selected word lines (WLs), SSL line, and GSL line of one selected corresponding NAND Block placed either in the Odd plane or Even plane.

In this kind of 2-plane NAND array architecture, all long horizontal physical WLs, SSL line, and GSL line have been divided into two equal one-half shorter lines in one physical row for two different planes. Thus, each plane has one independent SPB and Cache with one-half size of 1-plane NAND array from chip layout. The SPB and Cache are doubled in two separate planes to store 2N-bit NAND page data read out in one cycle from each corresponding selected WL of corresponding block, segment and plane if ABL Read scheme is used and then byte-by-byte being sequentially sent to the off-chip flash controller via byte-based I/O pins during the NAND Read operation. Conversely, for NAND program operation, the program data flows sequentially from byte-based I/O to the Cache and then transferred to SPB in page-based mode and then to the selected the plurality of pages of cells in NAND array through the plurality of very long GBL lines.

In the NAND's Read and Program operations, two separate selected pages out of two separate selected Blocks in two separate selected NAND planes can be performed simultaneously and independently. Even one plane can be first selected for Program operation but another plane can be selected for simultaneous Read operation or vice versa. For example, one plane is first selected for Read but the second page of the second plane is selected for Program. Or two selected separate pages of two selected separate Blocks can be selected for simultaneously program to achieve double Program and Read speed and more flexibility usage of Read in one plane while programming another page in another plane or vice versa. Therefore, the conventional multiple-plane NAND memory may be treated as multiple independent NAND arrays or memories for simultaneously performing NAND operations such as Read, Program, Erase, Program-Verify, and Erase-Verify and even file copy-back functions for achieving more flexibility and faster operation of NAND memory system.

But when 2D and 3D NAND densities are getting close to or even above 1 Tb soon, a 2-plane NAND memory has density of about ½ Tb for each plane. The above said traditional 'simultaneous' Read and Program operation has a limitation to be performed only in half of total NAND memory. In other words, if one plane is being selected for Read or Program operation, the same plane of half of total NAND memory cannot be further simultaneously performed with other operations again. In other words, the conventional NAND array architecture can only provide one big memory usage limitation, one key operation in one NAND divided plane. More than one key NAND operation simultaneously can only be performed in more than one NAND plane, rather than in the same plane.

Two major reasons of above limitations of one key operation in one plane only may include a) the occupied global bit line (GBL) associated to: a) the NAND plane cannot be released for second simultaneous operation in the same NAND plane; and b) the occupied 64XTs, SSL, and GSL bus lines and Block-decoder cannot be released for the second simultaneous operation in the same NAND plane. The plurality of the GBLs in each selected plane are exclusively taken or occupied with Vdd and Vss data pattern for one selected whole lengthy Read and Program operations. For example, to perform Read and Program operations of a SLC NAND, 25 µs Read time and 250 µs Program time are required for one selected page in one selected Block in one selected NAND plane. During these Read and Program times, whole selected GBLs are occupied by the first operation and cannot be released out for any new or second simultaneous operation in same NAND plane again. It is because new operation needs to use these common GBL again with different voltages set up. The required different GBL voltages for more than one simultaneous operation will result in the data contention issue in same NAND plane. Thus that is why more than one simultaneous Read and Program operations are prohibited in the conventional NAND specs. During Read or Program operation for a selected 64-cell NAND string in one plane, the separate 64XTs, SSL, and GSL bus lines and the selected Block-decoder are fully occupied in first operation in whole lengthy Read and Program operations and cannot be released out for any new operation. For any new or second NAND operation, a new set of 64XTs, SSL, and GSL voltages has to be set up on the common XT, SSL, and GSL bus again and new Block-decoder selection that are not allowed to avoid the voltage contention issue as above said same GBL issue.

Due to the limitations for the conventional 2D NAND memory architecture, novel hierarchical array and Block-decoder schemes are desired with improved techniques to allow the release of plurality of GBL lines, XT bus lines and Block-decoder in almost whole length of long Read and Program operations. As a result, all key operations of Read, Program, Program-Verify, and Erase-Verify can be flexibly performed almost in all NAND planes simultaneously. It is also highly desired to have much enhanced memory usage of extremely high-density NAND memory chip and NAND memory system.

The same novel hierarchical array scheme and Block-decoder and operating methods for simultaneous Read and Program in all NAND planes disclosed by the present application can be similarly applied to all other NAND flash memories without any limitations. In addition to the above said advantages over today's 2D Floating-gate NAND memory, the same disclosed scheme can also benefit other types of NAND flash memories such as 1-poly charge-trapping 2D NAND memories as well as 3D NAND flash memories that are either made of Vertical-Gate 3D NAND or Vertical-Channel 3D NAND, regardless of PMOS NAND or NMOS NAND.

In the following detailed descriptions and references are made toward the accompanying drawings, flow charts, and tables that form a part hereof and in which is shown, by way of illustration, specific embodiments in which the invention may be practiced. In the drawings, like numbers describe substantially similar components throughout the several views and embodiments. These embodiments are described in sufficient detail with a goal to enable those skilled in the art to practice the invention. Other embodiments may be made without departing from the scope of the present invention. The following detailed description is not to be taken in a limiting sense, and the scope of the present invention is defined only by the appended claims and equivalents thereof.

In conventional 2D or 3D NAND array architectures, the popular NAND arrays in production are comprised of 1-level non-broken metal1 GBL structure that has consumed too much power and speed degradation as well as least array flexibility usage due to a plurality of long and heavy parasitic GBL lines or capacitors in NAND operations. For example, the most popular 2D NAND array-matrix architecture is comprised of a plurality of vertical Blocks connected by N BL metal1 lines, GBLs. Each metal1 GBL is using a long straight, unbroken with a tight 2λ, x-pitch, to connect the plurality of Blocks in Y-direction in each column of NAND cell array. The number of total physical GBLs, depending on each page size or WL size. For an 8 KB Page size, totally, there are 8 KB GBLs per one physical WL or page. But in reality, there are some spare bytes reserved for the ECC storage purpose in each physical WL.

Most of NAND design provides 16 bytes of ECC spare area per 512 bytes of the regular NAND storage area. Each physical WL or Page is being divided into several logic Pages or Sub-WLs. For example, for a 2 KB physical WL, it can be divided into four logic pages with 512 B per one logic page. During program, one whole 2 KB can be selected for a full physical page program or it can be programmed in unit of each logic page but with some limitation in program cycles. It is because the partial WL logic program will have more WL-gate HV program disturbance, thus P/E cycles of product life is drastically reduced if partial-WL program is being frequently used.

The metal1 GBL is a tight 2λ vertical line, while the common source line, SL, is connected to all NAND-string bottom source nodes and is using another layer of metal0, which is a horizontal (X-direction) line and is laid out to be perpendicular to the plurality of N metal1 vertical GBL lines. In this case, a full physical page or WL Program is most preferred used in prior-art NAND for a faster program speed. But this full-page Program has encountered BL-BL adjacent coupling noise effect. The Program and Program-Inhibit yield are affected by the stored data in adjacent BLs.

In order to reduce the BL-BL proximity coupling effect, a second example of a 2D NAND array-matrix architecture was provided with whole GBL lines being divided into two interleaving BLs groups such as Odd and Even GBL lines. Each Odd and Even GBL is still using a long, straight, unbroken, and tight 2λ metal1 line from array top to array bottom to connect the plurality of respective vertical (Y-direction) Odd and Even Blocks. In this Odd and Even GBL array scheme, no higher-level metal2 GBL is used to save the cost of array and yield.

For this Odd and Even GBL NAND array, the Program operation is usually performed in a 2-cycle step. The first cycle is to program Odd or Even GBL cells and then is followed by a second cycle for programming Even or Odd GBL cells in each physical WL or Page. For a NAND Program operation, a full page or WL Program in 1-cycle is preferred. But in reality, because the BL-BL noise coupling effect becomes so severe the program data reliability becomes a challenge when NAND technology node is scaled below 3×nm. Thus a 2-cycle program step is used at the expense of less P/E cycle.

In summary, above two conventional NAND array schemes are to avoid using an extra metal2 GBL and using metal1 tight LBL for connecting the plurality of respective Odd and Even Blocks to reduce the array cost. Unlike prior-art NAND uses only one tight straight unbroken 2λ metal1 Y-direction GBL architecture in a full page scheme or uses similar a tight 2λ metal1 GBL only for the divided Odd and Even GBL scheme, this new HiNAND array scheme is preferably to use one tight 2λ broken or unbroken metal1 LBL but also use one extra loose 4λ metal2 GBLs per two metal1 LBL lines for a preferred Odd and Even LBL line scheme. The number of divided Odd and Even metal1 LBL line per one metal2 GBL is preferred more than one for a more flexible transferring the sensed or the programmed data flow through these 2-level hierarchical BL scheme for performing simultaneous NAND operations that include Program, Read, Program-Verify and Erase-Verify etc.

Since today's NAND has three metal layers including the tight 2λ metal1 for GBL to connect Blocks in Y-direction, but the loose metal2 and the loose metal3 layers are just used in those areas such as Page Buffer and NAND's peripheral circuits. Since metal2 and metal3 layers are available in loose layout design rules, thus the proposed metal2 lines used in this preferred HiNAND array is still using this loose 4λ rule so that no extra steps or costs are involved for adding the preferred metal2 loose GBLs. Since it uses two metal layers with 2-level BL hierarchical structure, this NAND array is termed as HiNAND2 array throughout the specification for the present invention.

For a HiNAND2 array architecture, from electric circuit viewpoint, each column of GBL of the HiNAND2 array is preferably divided into 2-level of divided BLs using the loose and broken metal2 GBL as the higher level of BLs and the tight and broken or unbroken metal1 LBL as the lower level BL. The main purpose of top metal2 GBL is used as a highway for transferring the bidirectional data traffic or flow in and out from NAND array and on-chip PB Buffers in smooth way so that a least delay and free of data contention can be achieved for the preferred simultaneous operations of the present invention.

In addition, the key purpose of using metal1 LBL line is to use the available LBL parasitic metal1 capacitor as a temporary PB for storing the required program page data during the lengthy time of page Program operation or as the temporary voltage storages for the sensed NAND data during the page Read or Program-Verify or Erase-Verify operations.

Since the HiNAND2 array has a 2-level hierarchical BL structure so that the bidirectional data traffic in different time intervals for performing simultaneous operations can be much easily and flexibly implemented. The conventional 1-level BL hierarchical structure NAND array cannot provide the similar data traffic control as the present invention. Thus simultaneous multiple operations in the same NAND plane cannot be realized within the conventional NAND design.

In an embodiment, in the HiNAND2 array of the present invention, each GBL line is preferably divided into J broken Groups. Each Group is then further divided into L Segments through multiple Odd and Even BL divided devices. Lastly, each Segment is further divided into K Blocks connected by a local LBL metal1 line. Each HINAND2 Block includes multiple NAND Strings. Each String has N NAND cells connected in series and are sandwiched by top and bottom String-select NMOS transistors, MS and MG in this patent. The values of N can be 16, 32, 64, 128 or any other arbitrary integer number. Each new HiNAND2 Segment comprises a plurality of K NAND Blocks arranged in Y-direction and each new HiNAND Block further comprises a plurality of NAND Strings one next to another in X-direction.

Unlike the 1-level BL decoder for prior-art NAND, new 2-level BL decoders such as top Group-decoder, middle Segment-decoder, and bottom Block-decoder are provided. The numbers of these extra decoders are only few in a whole array, the increased array overhead is negligible but the enhancement of NAND array operation flexibility is tremendous.

For example, a regular 64 Gb NAND may have 4,096 Blocks in Y-direction and each Block has 64-cell per string with one SSL and GSL transistors. When the HiNAND2 array is divided into 16 Groups using 15 GBL-divided transistors with a size same as GSL transistor. Thereby, the increased overhead of a 64-cell NAND string of each added GBL length is approximately ≈15×1/(4096×15)≈0.02% assuming each metal2 divided transistor takes about 1/15 of a whole 64-cell string. Furthermore, another addition is a plurality of two Odd-and-Even divided transistors with two separate shorter metal1 LBLs to each metal2 GBL with a device size like SSL and GSL transistors on Segment-base, the overall overhead is also negligible. For example, assuming each Group is divided down to 8 Odd and Even LBLs, then each GBL column will have 8 metal1 LBL-divided devices. For total 16 Groups in the NAND array, then the total numbers of metal1 LBL-divided transistors are 8×16=128. For a total 4,086 Blocks, the overhead to increase the GBL length is approximately ≈128×1/(4096×15)≈0.2%.

Some detail descriptions about Read, Program, and Verify operations associated with the HiNAND2 array can refer to the U.S. patent application Ser. No. 14/341,739, No. 14/316, 936, and No. 14/283,209, filed by the same inventor, incorporated as references for all purposes. The major difference is that the HiNAND2 array of the present invention includes a loose metal2 GBL that is connected to one pair of Odd and Even metal1 LBLs. Thus, the Program page-data from I/O or the read page-data from one WL of NAND cell array have to be transferred by 2-cycle step as explained above. One cycle for the odd number half NAND cells are connected to the Odd metal1 LBL lines and another cycle for the even number half NAND cells are connected to the Even metal1 LBL lines.

Figure 1A:
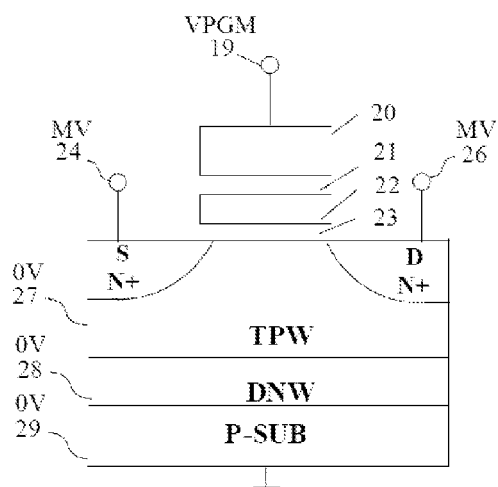
FIG. 1A is a cross-sectional view and the preferred program-inhibit bias condition for a 2D 2-poly floating-gate NAND cell according to an embodiment of the present invention.

FIG. 1A is a cross-sectional view and the preferred program-inhibit bias condition for a 2D 2-poly floating-gate NAND cell of the present invention. The program-inhibit bias condition includes a medium-high voltage (MV) $V_{inhibit}$ (≥7V) is applied to both drain and source nodes along with a Vpgm for cell's control gate, a TPW voltage of Vss for Bulk, Vdd for DNW and Vss for P-sub. As shown, the NAND cell, referred as a 2D 2-poly HiNAND cell in this invention, is formed inside the Triple-P-well (TPW) 27, within the Deep-N-well (DNW) 28 on top of P-substrate 29, structurally the same as conventional NAND cell. In an alternative embodiment, the 2D HiNAND cell can also be a 1-poly MONOS cell using a charge-trapping layer made from Nitride for data storage. In another alternative embodiment, this HiNAND cell can be made of either 2-poly floating-gate transistor with poly1 layer 20 on top of ploy2 layer 22 separated by a thin oxide layer 21. Poly2 layer is separated from the channel by another thin oxide layer 23 in between. Similarly, for a 3D NAND cell of the present invention, the cell program-inhibit bias condition is kept almost identical to above 2D NAND one.

In the present invention, the PI voltage of MV is preferably set to be higher than 7V at each 2D NAND cell's N+ drain node 26 and N+ source node of 24 when gate 19 of the NAND cell is coupled to Vpgm that is set between 15V to 20V with the bias condition of TPW=Vss, DBW=Vdd and P-sub=Vss. In a conventional NAND cell, there is no such direct $V_{inhibit}$ voltage applied to the drain node 26 and source node 24 of each selected NAND cell in the selected WL because the drain and source nodes have to rely on a very long GBL to pass the voltage. This long GBL metal1 line has too much parasitic capacitance, about 1-3 pf. For a total 8 KB physical size of NAND array, the total GBL power consumption during Program and Read operations would be too high. Thus, the conventional NAND design uses a self-Boosting PI method that only requires each GBL to couple Vdd voltage only to reduce the power consumption by precharging all BL before Program operation. The $V_{inhibit}$ voltage is later induced by NAND cell's poly-gate ramping 20V coupling from poly2 gate to NAND cell's channel.

There are many PI schemes used in NAND string such as SB, LSB and EASB. But in this patent, a preferred direct PI voltage of $V_{inhibit}$ is applied to each channel of a plurality of the selected NAND cells in one WL or more than on the multiple WLs. The $V_{inhibit}$ voltage is not coupled through the long GBL that has too high parasitic capacitance for high-density NAND array. Instead, the $V_{inhibit}$ is coupled from each selected horizontal (X-direction) metal0 LBLps_1 power and source line into each selected metal1 vertical (Y-direction) LBL smaller parasitic capacitor within each HiNAND Segment array by applying a gate voltage higher than $V_{inhibit}$ to the selected PRE_1 node. Thus, for one WL program, only one selected LBLps_1 power line plus 2N shorter LBL metal1 parasitic capacitors to be charged. As compared to precharge long N GBLs, this $V_{inhibit}$ precharge current is negligible.

For example, assuming each metal2 GBL is divided into 16 Groups and each Group is further divided into 16 metal1 LBL, then the total length of LBL is only 1/16~0.4% of GBL. Thus, the charges of each $C_{GBL}$ for a conventional NAND is $P_{GBL}$=1.8V×$C_{GBL}$. But the present invention provides $P_{LBL}$=7.2V×$C_{LBL}$, where $C_{LBL}$=1/256×$C_{GBL}$. Thus, $P_{LBL}$=1/64 $P_{GBL}$. Thus the precharge of $V_{inhibit}$ voltage to all local LBL lines can be neglected but this preferred program-inhibit method provides the highest PI voltage initially in each non-selected NAND cells without a concern of BL-BL coupling effect in the selected one WL for page Program or multiple-WL Block program operation.

Figure 4:
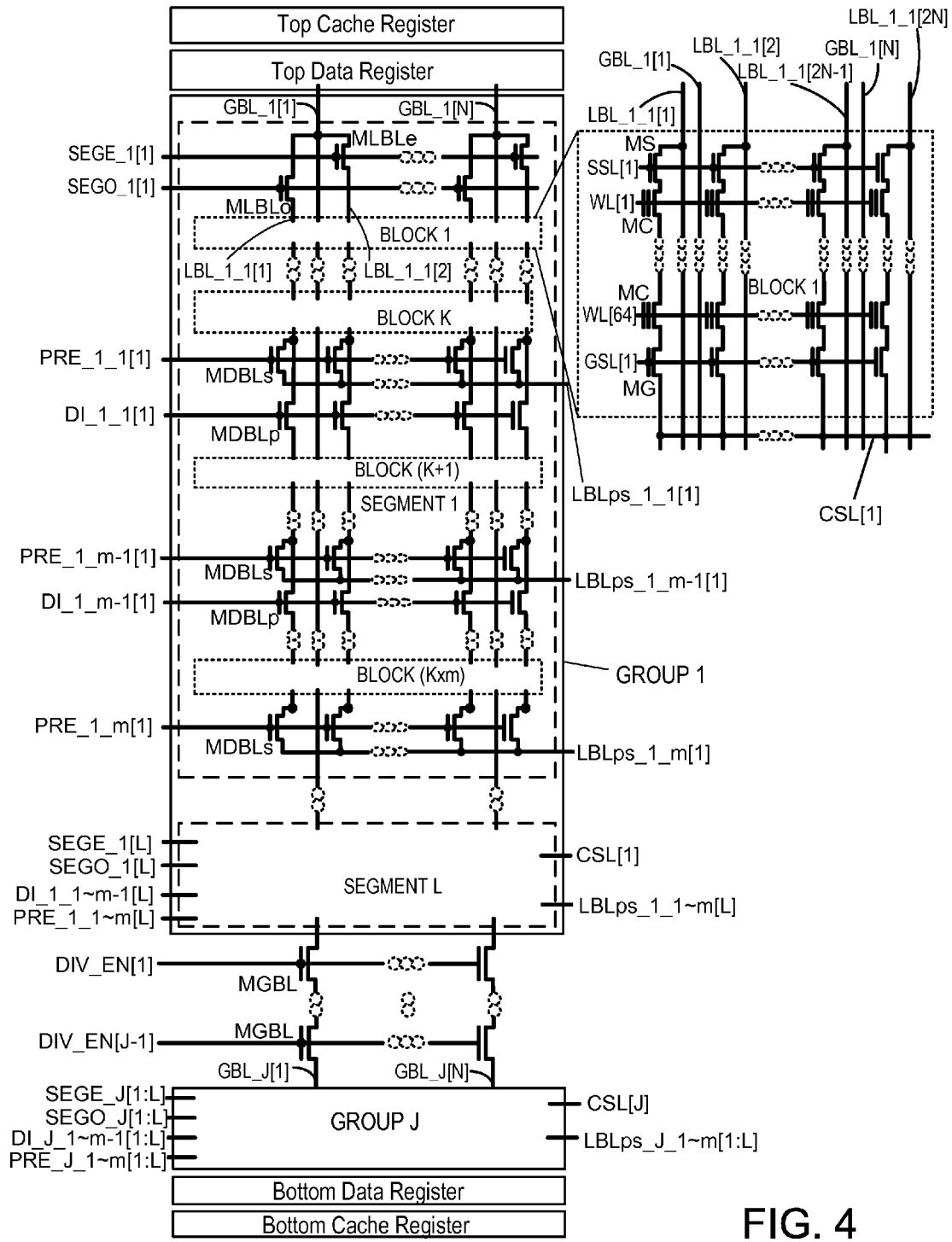
FIG. 4 is a circuit diagram of a 2D HiNAND2 array with 2-level BL-hierarchical structure with both broken-GBL and broken-LBL lines according to an embodiment of the present invention.

In Page or Block Program operation, the first step is to precharge all 2N LBL lines in one or multiple Segments to $V_{inhibit}$ in 1-cycle through each Segment's MBLs transistor one per LBL from each selected metal0 horizontal LBLps_1 line that is coupled to $V_{inhibit}$ HV from LBLps_1 HV decoder circuit not shown in FIG. 4. The corresponding Segment Odd and Even LBL-divided transistor, MLBLo and MLBLe, have to be shut off to prevent leakage from Segment's two metal1 LBL lines to Group's one metal2 GBL line per column shown in FIG. 4.

The second step is to connect all selected Segment 2N metal1 LBL lines to all Group's N metal2 GBL to the Page Buffer. All 2N LBL lines are connected to Vss or Vdd in accordance with the 2N-bit data pattern in 2N-bit Static PB on top or bottom of the HiNAND array.

For this two Odd and Even metal1 LBL lines per one GBL line array structure, the Odd LBL-divided transistor MLBLo can be turned on first by coupling to Vdd to connected to each corresponding bits of a 2N-bit SPB through one metal2 GBL. In this case, each metal2 GBL is shared by both Odd and Even number LBLs for allowing the use of a 4λ x-pitch metal2 GBL layout. But at the 2N-bit SPB, an Odd and Even BL decoder has to be built in to allow the connection of each metal2 GBL to respective Odd and Even bits of each bit of SPB. In the first step of Odd number LBLs connection to the corresponding bits of PG through the common metal2 GBL, the programmed Odd NAND cells' Vss voltage will discharge the corresponding Odd number LBLs from $V_{inhibit}$ to Vss within 50 ns. But those un-programmed bits will retain $V_{inhibit}$ in each corresponding respective N Odd number LBL lines.

After the first cycle, the N Odd LBL-divided transistors MLBLo are shut off by grounding SEGO_1 and then the N Even LBL-divided transistors MLBLe are turned on by coupling their common gates of SEGE_1=Vdd. Then the N Odd metal1 LBL lines would be connected to N Even LBLs in the 2N-bit SPB through the common N metal2 GBL lines. Now, the similar process will repeat, and then the N Even NAND cells in the N Even metal1 LBL lines would either retain $V_{inhibit}$ or discharge to Vss in accordance with N Even-number bits data pattern stored in 2N-bit SPB. As a result, after two cycles of Odd and Even line discharge operations, all Odd and Even N NAND cells in one or multiple WLs are set by the full page of Odd and Even stored data pattern in the 2N-bit SPB.

Figure 1B:
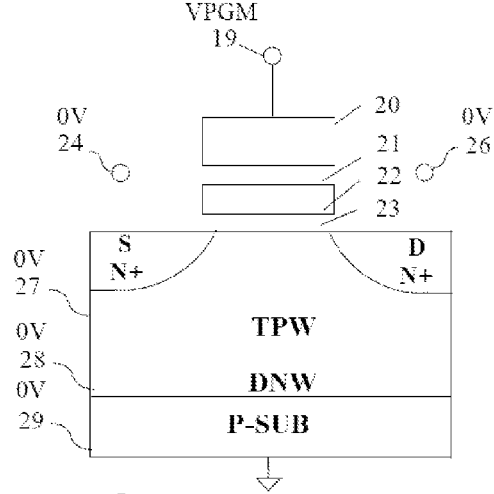
FIG. 1B is a cross-sectional view and the preferred program bias condition for a 2D 2-poly floating-gate NAND cell according to an embodiment of the present invention.

FIG. 1B is a cross-sectional view and the preferred program bias condition for a 2D 2-poly floating-gate NAND cell of the present invention. The program bias condition includes a Vss is applied to both drain and source nodes along with a same Vpgm for cell's control gate, a TPW voltage of Vss for Bulk, Vdd for DNW and Vss for P-sub according to an embodiment of the present invention. As shown, the programmed cells' Vt would be increased from the erased state of negative value to a positive Vt value. Depending on SLC, MLC, TLC, and XLC NAND storage type, the number of programmed states and values are optimized differently. In this application, the conventional way of Program-Vt and the ΔVt margin between any two adjacent program states can be set to be the same. Similarly, for a 3D NAND cell of the present invention, the cell program bias condition is also kept almost identical to above 2D NAND one.

In an embodiment, the Vss program voltage in the channels of the selected programmed cells in Page Program or Block Program are preferably set to be a solid Vss after the gates' voltage of all 64 WLs are ramped from Vss to Vpass of about 10V by turning on SSL gate with Vdd and GSL gate to Vss to avoid the string leakage in this step (see FIG. 4). Then, the channel solid Vss is turned to a floating Vss voltage by grounding MS's gate of SSL signal with MG's gate of GSL voltage still remaining grounded and all 64 WLs are remaining Vpass voltage. The third step is to ramp only the selected WL from Vpass to Vpgm. The Vss floating channel voltage would be increased to ΔVss by less than 0.1V in the 64-cell NAND string. Thus, the voltage drop between Vpgm on the poly2-gate and cell channel is still kept around Vpgm due the negligible ΔVss<0.1V.

Similarly, the floating $V_{inhibit}$ in the non-selected NAND cells' channels in multiple selected WLs will be increased as well when one selected WL voltage is ramped from Vpass to Vpgm with the rest of WLs remaining at Vpass. The initial $V_{inhibit}$ below the NAND channels, $V_{inhibit}$=Vpass−Vtmax, where Vtmax is the highest Vt of NAND cells. The $V_{inhibit}$ will be increased few voltages and only clamped by NAND cell's junction BVDS. As a result, the HiNAND2 Program is performed under the initial conditions of floating Vss and floating $V_{inhibit}$ in selected NAND cells' regions. Since $V_{inhibit}$>Vdd, thus the HiNAND2 array has superior page Program as compared to prior-art NAND scheme with least Vt degradation. This is one of the Program schemes used in this invention to achieve the highest simultaneously multiple operation in the same or different LBL metal1 lines of same and different Segments of the same or different selected Groups of this HiNAND2 array.

Figure 1C:
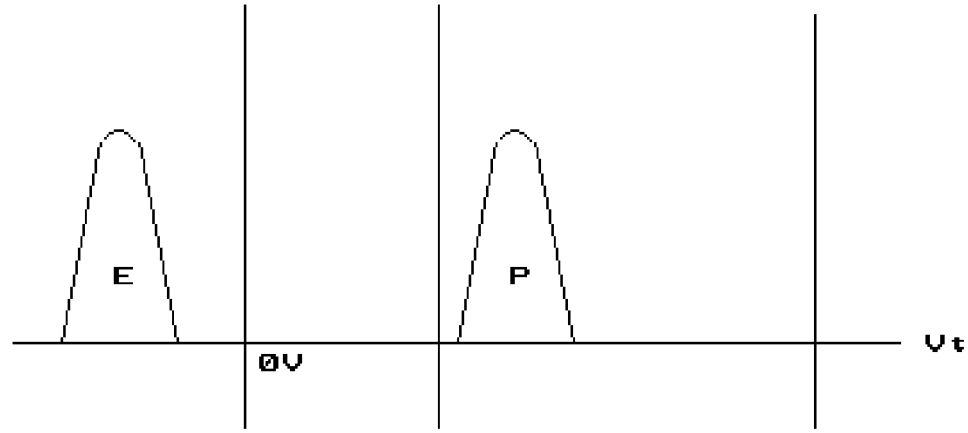
FIG. 1C is a diagram showing typical two Vt distributions of a 2-state SLC NAND cell, regardless of 2D or 3D NAND data storage.

FIG. 1C is a diagram showing typical two Vt distributions of a 2-state SLC NAND cell, regardless of 2D or 3D NAND data storage. As shown, the first lower Vt state is a negative erased state with a Vt0≤−0.5V, which is denoted as E-state. The second higher Vt state is a positive programmed state, Vt1, which is denoted as P-state. The Read WL voltage is denoted as VR for a SLC Read on one selected WL while $V_{READ}$ voltage is applied to all non-selected 63 WLs in the selected NAND string. The VR value for the single selected WL is set between Vt0 and Vt1 to meet Vt0<VR<Vt1 for distinguish the two Vt states. But the $V_{READ}$ voltage is preferably set for 64 non-selected WLs with a preferred value greater than Vt1, e.g. $V_{READ}$>Vt1+ΔV, with a sufficient voltage margin ΔV=1V for ensuring a good conduction for non-selected NAND cells in the same string as a role of pass-transistor during the preferred Page Read, Page Program-Verify, Page Erase-Verify operations. The above single Page Read and single page Program-Verify operations have no different setup in the VR voltage between conventional NAND array and the HiNAND2 array of the present invention.

But for the preferred Block Read, Block Program-Verify, and Block Erase-Verify operations of the present invention, multiple WLs have to be coupled with the same VR voltage. For a Block size of 64 WLs, one option is to have total separate 64 dispersed WLs in 64 dispersed Blocks coupled with VR for 64-WL simultaneous Read, Program-Verify, and Erase-Verify for substantial latency reduction by 64-folds.

But in this application, the multiple WLs' VR, Vpass, and Vpgm are preferably latched in their corresponding WLs' parasitic capacitors once the operations are being started. Thereby the multiple 64 XT and SSL and GSL voltages in multiple 64 XT bus can be released for the next desired operations to be performed during the prior lengthy Read and Program operations to drastically save the whole Program and Read time.

Figure 2A:
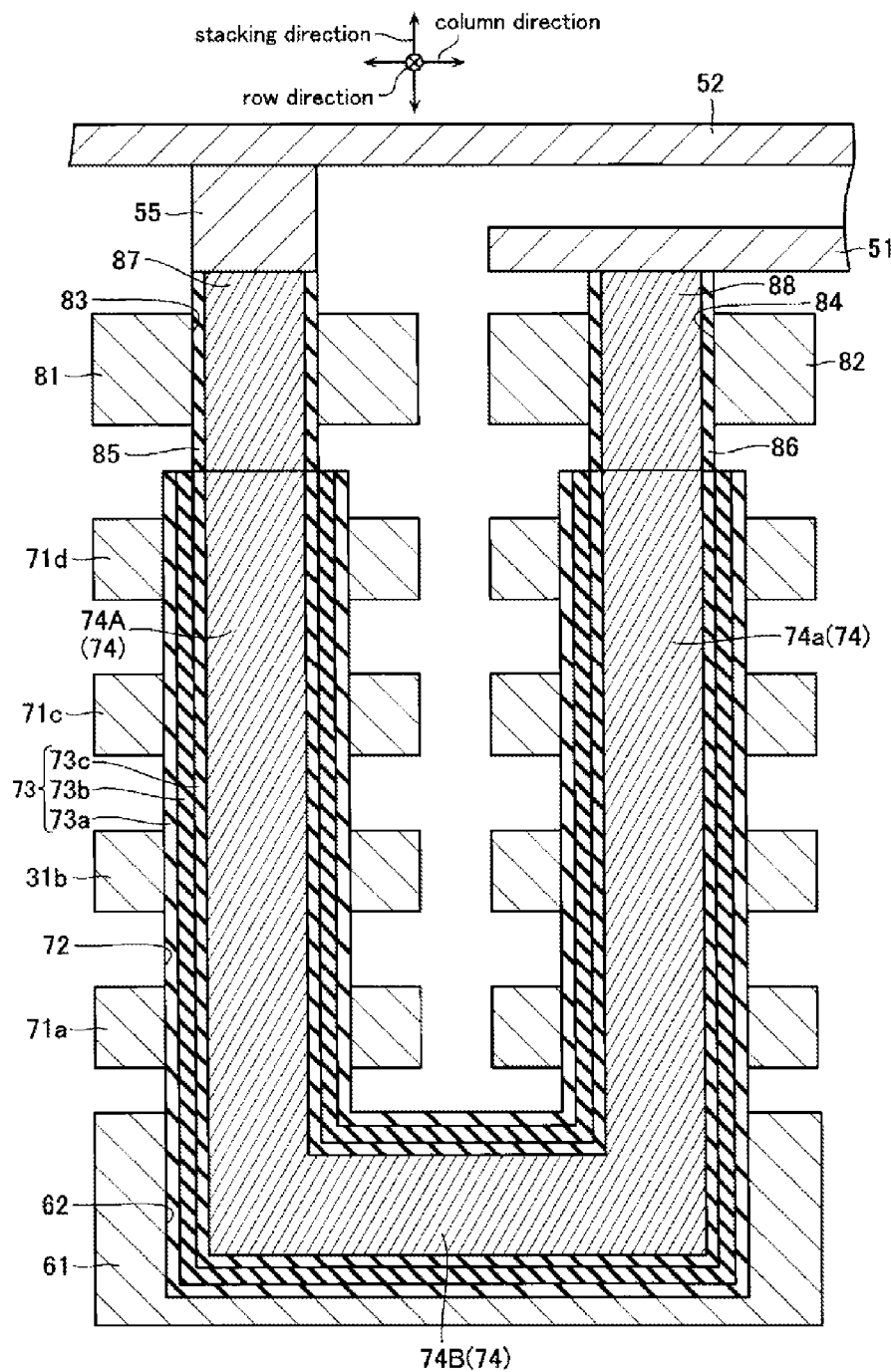
FIG. 2A is a diagram of a conventional 3D vertical-channel NAND string with only four 3D NAND cells in series in each arm of a U-shaped structure.

FIG. 2A is a diagram of a conventional 3D vertical-channel NAND string with only four 3D NAND cells in series in each arm of a U-shaped structure. There are eight 3D NAND cells in one 3D U-shape NAND string. As shown, the 3D NAND 8-cell string is configured with one separate drain-string-select transistor 81 and one source-string-select transistor 82 respectively coupled at two ends. Layer 51 is a Vss metal0 line running in row direction of memory array and layer 52 is a metal1 bit line (BL), running in column direction and perpendicular to the metal0 Vss line. This 3D NAND string is formed on U-shaped body 74 with eight cells, such as 71d, 71a, etc including a gate insulation layer 73 being stacked in stacking direction. Additionally, a back-gate transistor 61 with same gate material including back-gate hole 62 is formed on the same body 74B(74) at the bottom of the stack. The Blocking insulation layer 73a, charge-trapping layer 73b, and tunnel insulation layer 73c are shared by all 8 cell transistors and the back-gate transistor 61. But the drain and source NMOS string-select transistors 81 and 82 are respectively using the non-charge-trapping layers 87 and 88 with gate insulation layer 85 and 86 in between. The drain and source side holes 83 and 84 are formed respectively to penetrate the gates 81 and 82. The non-charge-trapping layer 87 of the drain-string-select transistor 81 is connected to the metal1 layer 51 via another metal layer 55 in the stack direction. The detailed description of the memory unit device can be referred to a vertical-channel 3D NAND scheme shown in U.S. Pat. No. 8,169,826 B2, titled with "Nonvolatile Semiconductor memory Device", and incorporated fully for references. The biased WL gate, SSL and GSL and BL voltages of Read and Program operations are substantially similar to the 2D NAND strings.

There are more several options of 3D vertical-channel NAND strings having more than 16 NAND cell and array architectures. The present invention provides several embodiments of 3D NAND plane/array designs based on the 3D NAND string shown above as a building Block. These 3D NAND embodiments are configured with a 2-level hierarchical BL structure introduced for the 2D HiNAND2 array of the present invention, achieving the fastest and most flexible multiple operations. But in the 3D HiNAND2 array, each metal2 GBL lines does not need to connect to two odd and even metal LBL lines as 2D HiNAND2 for a loose 4λ x-pitch to save cost.

Figure 2B:
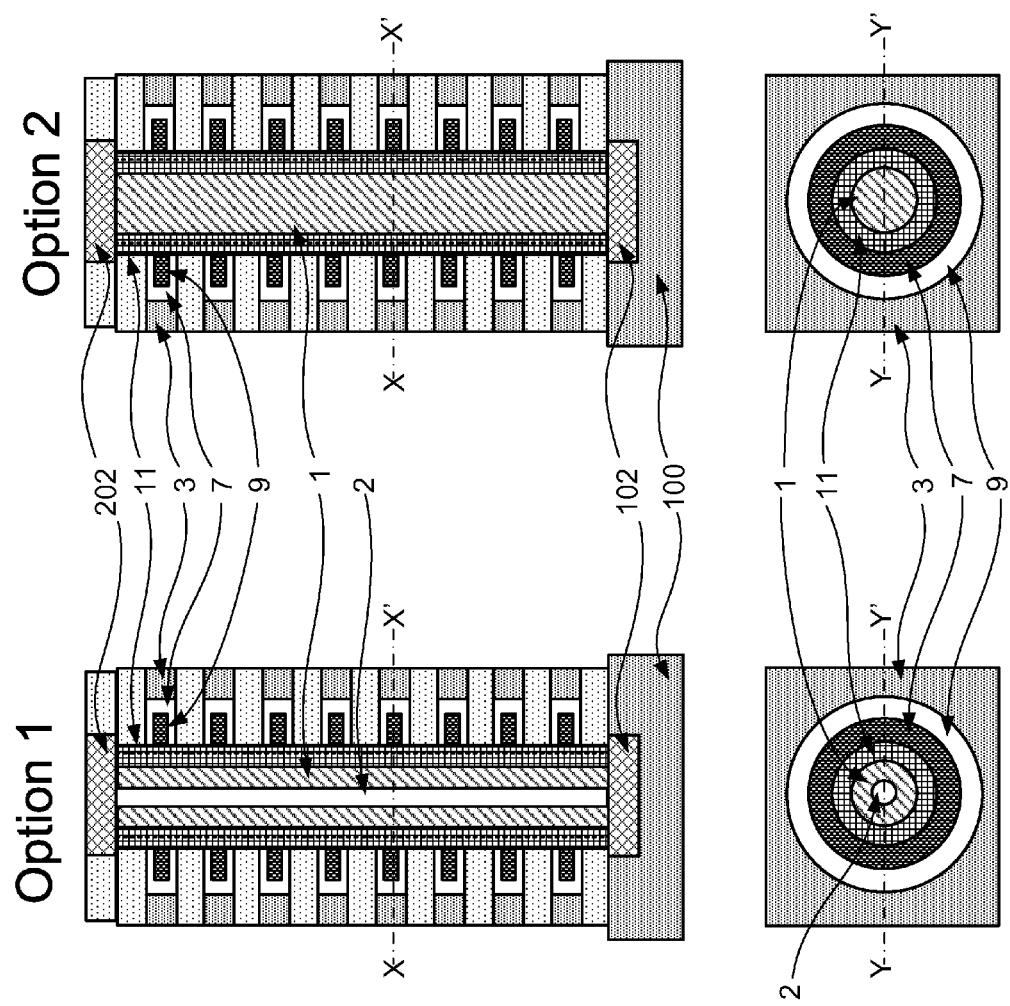
FIG. 2B is a diagram of another conventional 3D vertical-channel NAND string with only four 3D NAND cells in series in series in each arm of a U-shaped structure.

FIG. 2B is a diagram of another conventional 3D vertical-channel NAND string with only four 3D NAND cells in series in each arm of a U-shaped structure. As shown, two optional cell configurations are provided in the 3D NAND string. To the left side of the figure, the cell is optionally formed on substrate 100 with a lower electrode 102 below channel 1 and an upper electrode 202 over the channel 1 having a pillar shape perpendicular to the substrate 100. A plurality of control gate electrodes 3 formed over a stack of multiple device levels around the pillar shaped channel 1. A Blocking dielectric 7, having a C-shape in the side cross-sectional view, is located adjacent to and surrounded by the control gate electrodes 3. A plurality of discrete charge-trapping segments 9 is respectively disposed in the opening portion of the C-shaped Blocking dielectric 7 and coupled around the channel 1 via a surrounding tunnel dielectric 11. To the right side of the figure, the channel 1 is optionally filled with an insulation fill material 2. The top cross-sectional view reveals clearly the relative positions of the channel 1 (as well as fill material 2), the tunnel dielectric 11, the charge-trapped segments 9, and the Blocking dielectric 7. The upper electrode 202 is the equivalent local metal1 line laid out to connect each vertical-channel 3D NAND String and the lower electrode 102 is connected to metal0 CSL line. The corresponding metal LBL line 202 is connected to the drain node of a 3D select transistor and is running in column direction but the source node of another 3D select transistor is connected to a Vss layer 102 in row direction, forming a 6-cell 3D string with formation in vertical channels. The details of the vertical-channel 3D NAND cell technology shown above can be referred to U.S. Pat. No. 8,461,000, titled with "Method of Making Ultrahigh Density Vertical NAND Memory Device", incorporated fully as references. Similarly, the present application is to show that this kind of 3D NAND array can be applied with a 2-level BL-hierarchical structure with top metal2 GBL lines and bottom local metal1 LBL lines for superior NAND operations.

Overall, the 3D line pitch is not that tight as 2D case, thus one metal2 GBL line can be connected to one metal1 LBL line only. In this way, the odd and even page data can be sensed and loaded into SPB in 1-cycle. The details of 2-level BL-hierarchical structure of the 3D HiNAND2 array will be shown in FIG. 3A to FIG. 3D in following sections.

Figure 3A:
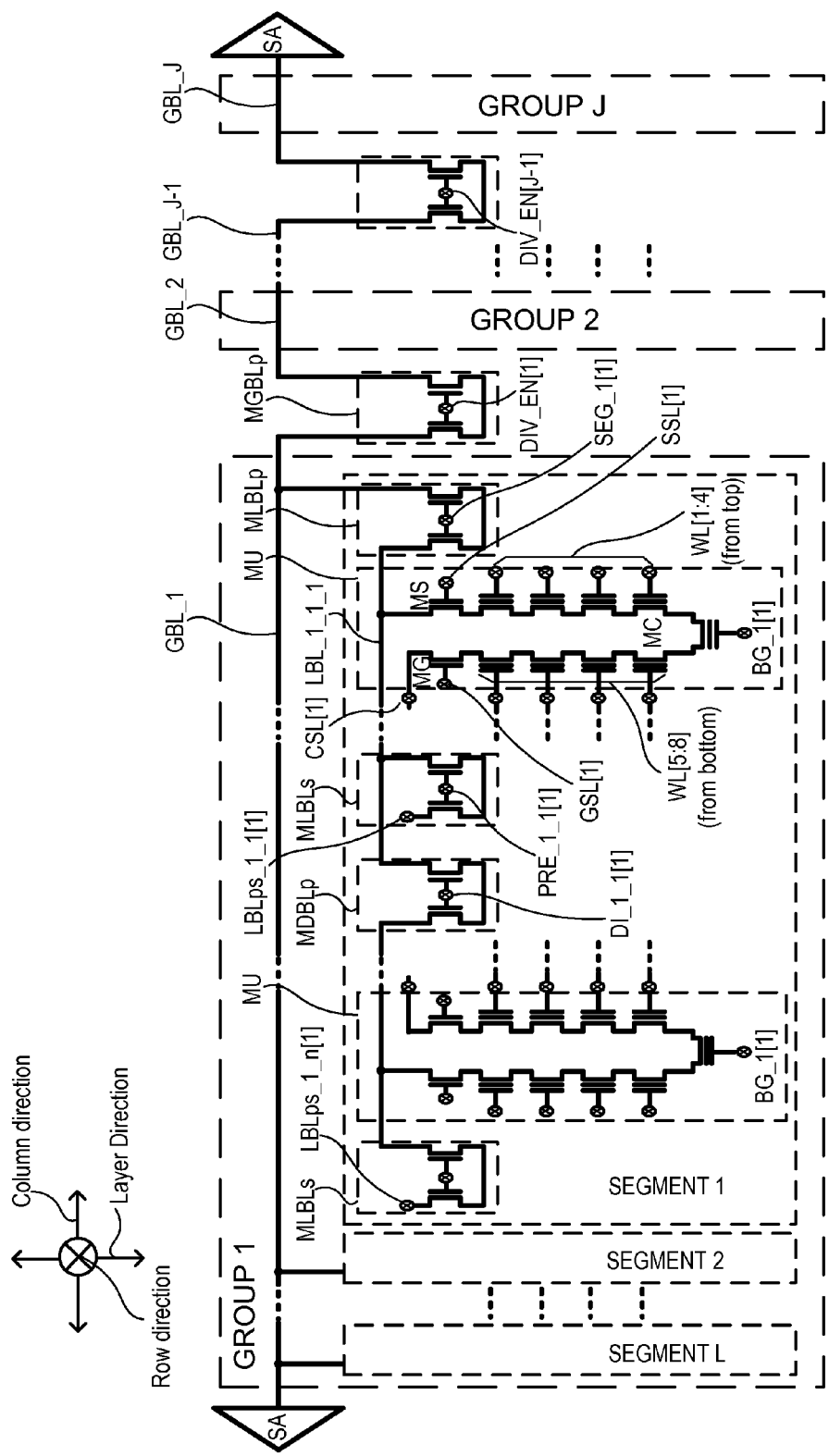
FIG. 3A is a circuit diagram of a 3D vertical-channel HiNAND2 array with a 2-level BL-hierarchical structure with both broken-GBL and broken-LBL according to an embodiment of the present invention.

FIG. 3A is a circuit diagram of a 3D vertical-channel HiNAND2 array with a 2-level BL-hierarchical structure with the top-level broken-GBL and the bottom-level broken-LBL according to an embodiment of the present invention. In the embodiment, a first paired-device MGBLp, each being an 1-poly 3D NMOS transistor, is used as a broken-GBL connector and a second paired-device MLBLp, each being a same 1-poly 3D NMOS transistor, is used as a broken-LBL connector. As shown, this 3D HiNAND2 array is divided into J Groups by J-1 first paired-device MGBLp coupled to respective gate signal DIV_EN[1] to DIV_EN[J-1] in column direction, respectively. The broken GBL lines are termed as GBL_1, GBL_2 to GBL_J-1 and GBL_J. The first paired-device MGBLp is preferably made of same NMOS transistors like top and bottom string-select transistors in a 2D NAND string with gates running in row-direction. The source and drain nodes of each first paired-device MGBLp are laid along layer direction as marked. The BVDS of the first paired-device MGBLp is made with a value more than 7V to sustain the program-inhibit channel voltage. In this case, pitch size of the metal2 broken-GBL lines is made of 2λ.

Unlike 2D HiNAND2 array having two metal1 LBL lines with 2λ pitch per one 4λ metal2 broken-GBL line, each 2λ metal2 broken-GBL line is connected to one 2λ metal1 broken-LBL line through the second paired-device MLBLp with gates tied to SEG_1[1] to SEG_1[L] for building a plurality of Segments per Group (Group 1 in this case). In addition, another end of each Segment's metal1 broken-LBL line is connected to one LBLps power line through a third paired-device MLBLs with gates coupled to a signal PRE_1_1[1] to PRE_1_n[1] and laid along row direction as marked. Each source node of MLBLs is connected to corresponding one power line selected from LBLps_1_1[1] to LBLps_1_n[1]. Note, the gate voltage PRE of each third paired-device MLBLs can be coupled to $V_{inhibit}+Vt+\Delta V$ for allowing full passage of $V_{inhibit}=7V$ during the Read, Program-Verify, and Erase-Verify operations as the preferred 2D HiNAND2 array disclosed above. And each group is comprised of a plurality of 3D NAND strings (MUs) with WLs running in row-direction. The voltage of LBLps power line can be coupled to $V_{inhibit}$ MV voltage from a LBLps decoder connected to MV power lines.

Each long metal2 GBL line and each corresponding shorter metal1 LBL line have been divided into several smaller 3D broken-GBL lines and 3D broken-LBL lines characterized by 3D capacitors in each Group. Both ends of each metal2 GBL line is connected to two sense amplifiers (SAs) which is equivalent to one bit of 2N-bit of SPB as explained in above 2D HiNAND2 of the present invention.

The 3D Block-decoder, 3D Segment-decoder, and Group-decoder would have the similar circuits as 2D HiNAND2 but are in either 3D forms or 2D forms which are "don't-care" for implementing this preferred desired NAND operations as explained above. Thus multiple NAND operations can be performed simultaneously in a same or different NAND planes would be same regardless of 3D HiNAND2 array or 2D HiNAND2 array as long as any time interval of metal1 LBL line and metal2 GBL line are available without causing the data contention of data flow.

Note, each 3D HiNAND2 string or a MU shown in FIG. 3A has one 2-poly MC NAND cell at bottom with its gate tied to a BG_1[1] signal to control the connection or disconnection between the 3D NAND cells in left and right arms. More detailed descriptions about performing multiple NAND operations based on the 3D HiNAND2 array of FIG. 3A can be found in U.S. patent application Ser. No. 14/341,739, filed Jul. 25, 2014, commonly assigned and incorporated as reference for all purposes.

Figure 3B:
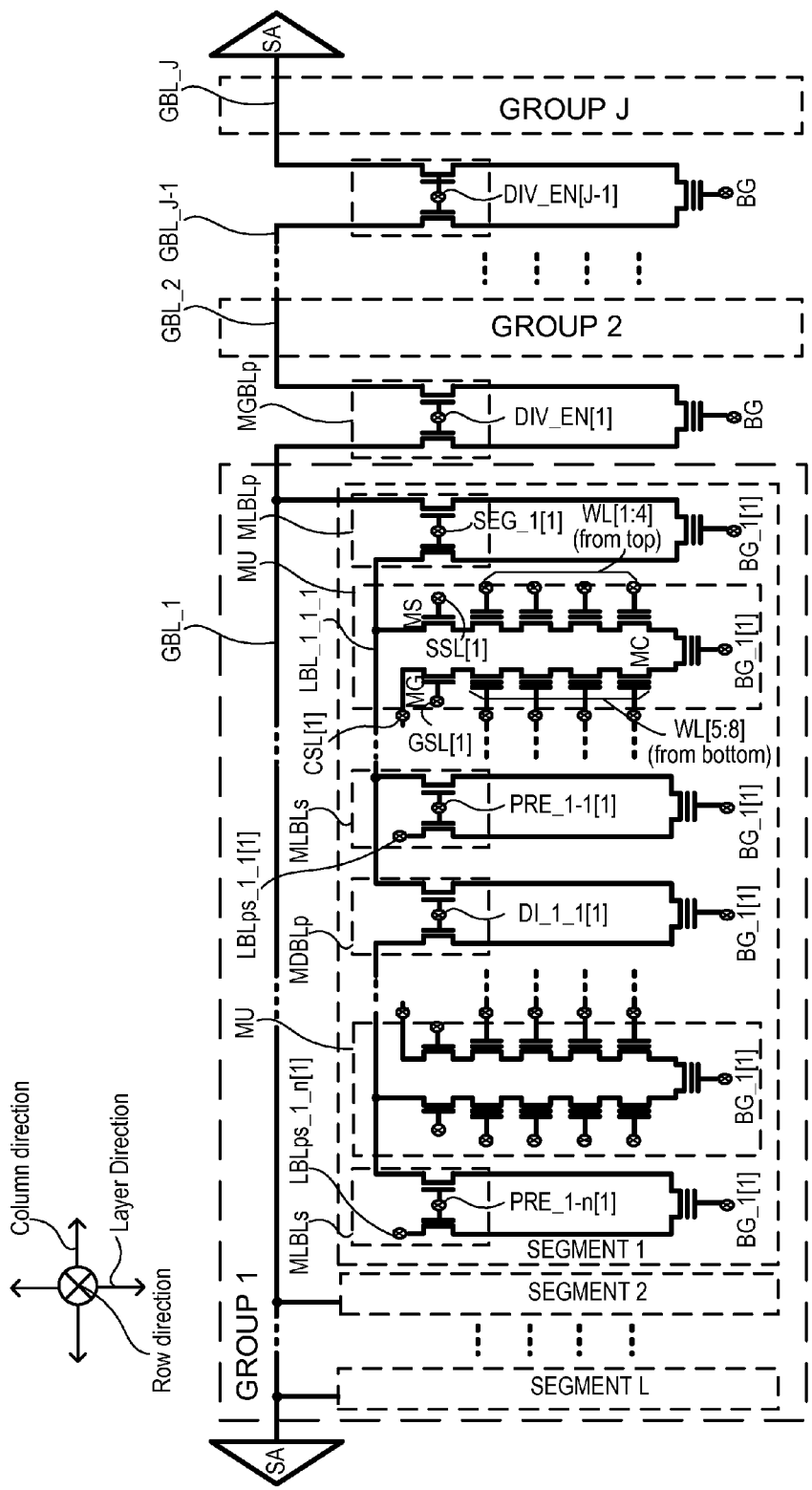
FIG. 3B is a circuit diagram of a 3D vertical-channel HiNAND2 array with a 2-level BL-hierarchical structure according to another embodiment of the present invention.

FIG. 3B is a circuit diagram of a 3D vertical-channel HiNAND2 array with a same 2-level BL-hierarchical structure with top-level broken-GBL lines and bottom-level broken-LBL lines according to another embodiment of the present invention. In the embodiment, one additional 2-poly 3D-cell like transistor is inserted in series with above the first paired-device MGBLp of FIG. 3A for forming a broken-GBL connector and another 2-poly 3D-cell like transistor is inserted in series with the second paired-device MLBLp of FIG. 3A for forming a broken-LBL connector. It is another optional configuration of a 3D HiNAND2 array with a 2-level BL-hierarchical structure with only difference from the previous configuration (FIG. 3A) in the broken-GBL connector and broken-LBL connector. As signal BG=Vdd+Vt+ΔV, it allows GBL line with full Vdd and Vss passage. Again, each NAND MU of FIG. 3B has one 2-poly MC NAND cell at bottom with its gate tied to BG_1[1] to control the connection or disconnection between the 3D NAND cells in left and right strings. More detailed descriptions about performing multiple NAND operations based on the 3D HiNAND2 array of FIG. 3B can be found in U.S. patent application Ser. No. 14/341,739, filed Jul. 25, 2014, commonly assigned and incorporated as reference for all purposes.

Figure 3C:
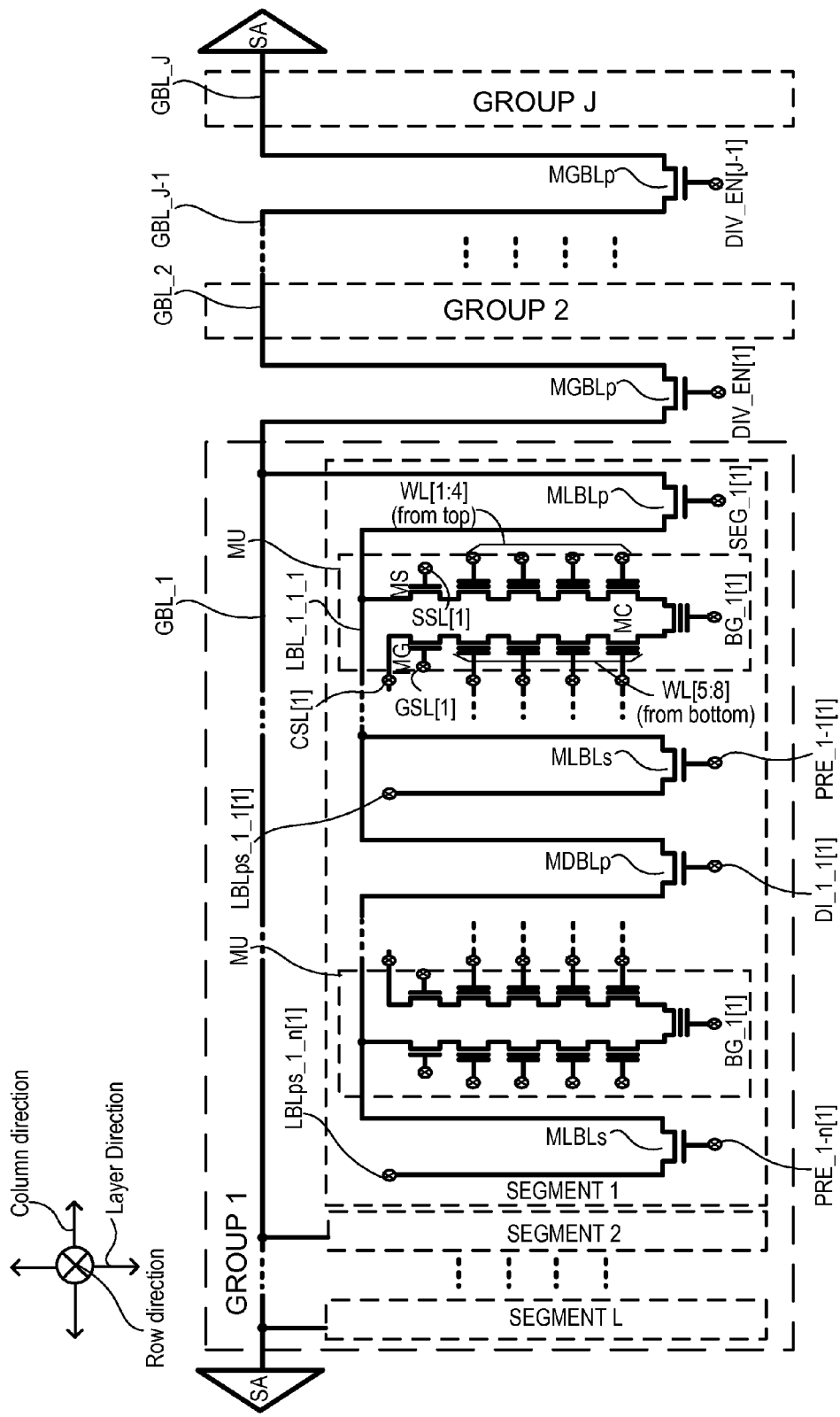
FIG. 3C is a circuit diagram of a 3D vertical-channel HiNAND2 array with a 2-level BL-hierarchical structure with both broken-GBL and broken-LBL according to yet another embodiment of the present invention.

FIG. 3C is a circuit diagram of a 3D vertical-channel HiNAND2 array with a similar 2-level BL-hierarchical structure but using only one 1-poly 3D NMOS device of MGBLp and 2-poly MLBLp for above respective broken-GBL and broken-LBL connectors according to yet another embodiment of the present invention. This is a third optional configuration of 3D HiNAND2 array with both metal2 GBL line and metal1 LBL line been divided into several broken-GBL and broken-LBL lines associated with corresponding 3D capacitors in each 3D Group. The only difference among FIG. 3A and FIG. 3B and FIG. 3C is the way to make the broken-GBL connector and broken-LBL-connector. In this case, one 1-poly NMOS transistor MGBLp is used to connect two metal2 broken-GBL lines and one 1-poly NMOS transistor MLBLp is for connecting a local metal1 broken-LBL line with a corresponding metal2 broken-GBL line. Another 1-poly 3D NMOS transistor MLBLs is for diving two adjacent metal1 broken-LBL lines. The MLBLs transistor is gated by SEG_1 and the MGBLp transistor is gated by DIV_EN. Again, each NAND MU of FIG. 3C has one 2-poly MC NAND cell at bottom with its gate tied to BG_1[1] to control the connection or disconnection between the left and right 3D NAND strings. More detailed descriptions about performing multiple NAND operations based on the 3D HiNAND2 array of FIG. 3C can be found in U.S. patent application Ser. No. 14/341,739, filed Jul. 25, 2014, commonly assigned and incorporated as reference for all purposes.

Figure 3D:
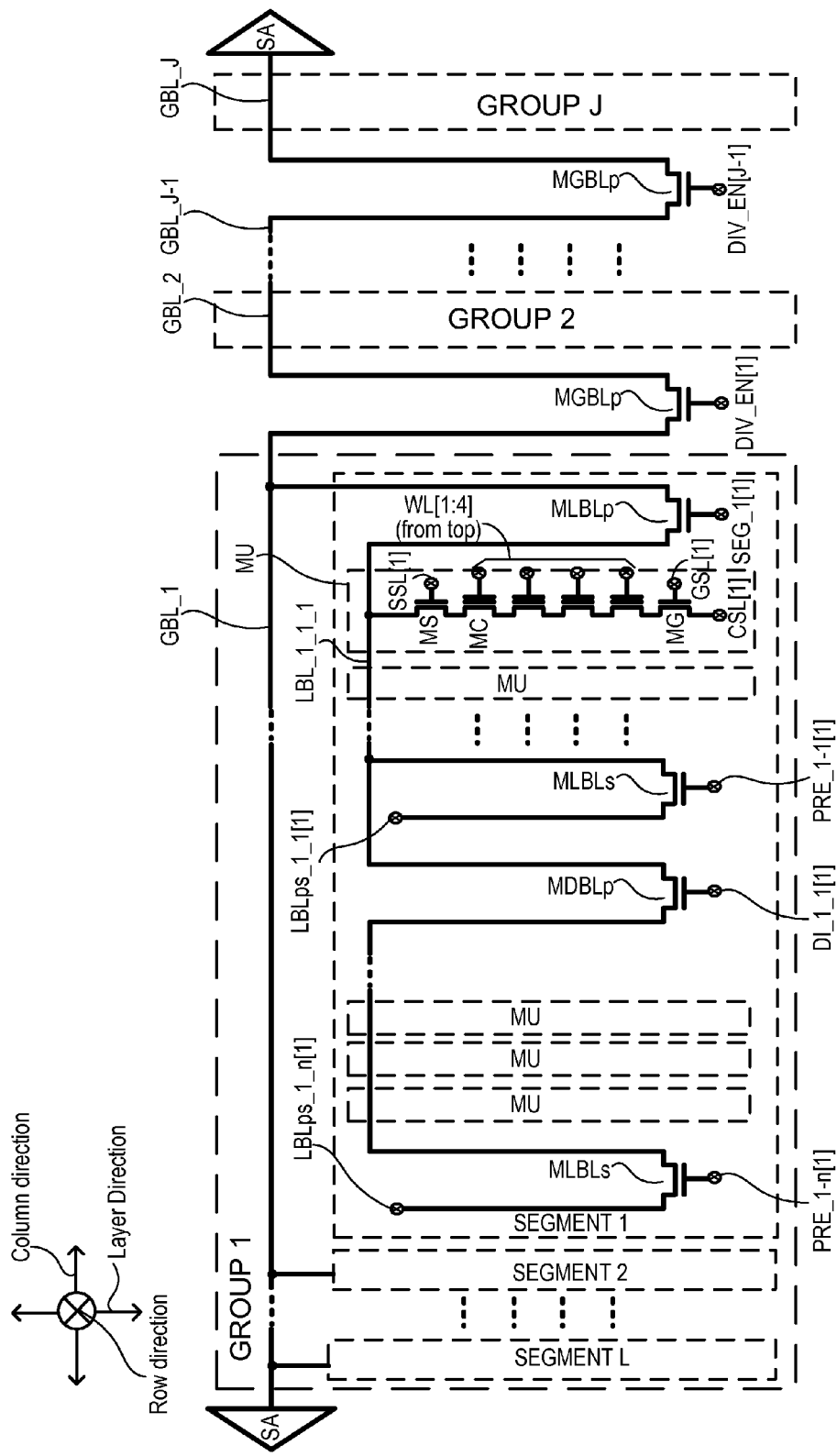
FIG. 3D is a circuit diagram of a 3D vertical-channel HiNAND2 array with a 2-level BL-hierarchical structure with both broken-GBL and broken-LBL according to still another embodiment of the present invention.

FIG. 3D is a circuit diagram of a 3D vertical-channel HiNAND2 array with a similar 2-level BL-hierarchical structure but using only one 1-poly 3D NMOS device MGBLp and 1-poly 3D NMOS device MLBLp for respective broken-GBL connector and broken-LBL connector according to still another embodiment of the present invention. It is another optional configuration of the 3D HiNAND2 array with 2-level BL-hierarchical structure. As shown, both metal2 long GBL line and metal1 LBL line have been divided into several smaller broken-GBL lines and broken-LBL lines associated with corresponding 3D capacitors in each 3D Group. The only difference among FIG. 3C and FIG. 3D is the way to make each 3D NAND cell string. For example, each 3D NAND string shown in FIG. 3D is coupled by a top string-select transistor MS connected to metal1 broken-LBL line and a bottom string-select transistor MG connected to a CSL metal0 line running in row direction as marked. More detailed descriptions about performing multiple NAND operations based on the 3D HiNAND2 array of FIG. 3D can be found in U.S. patent application Ser. No. 14/341,739, filed Jul. 25, 2014, commonly assigned and incorporated as reference for all purposes.

Figure 3E:
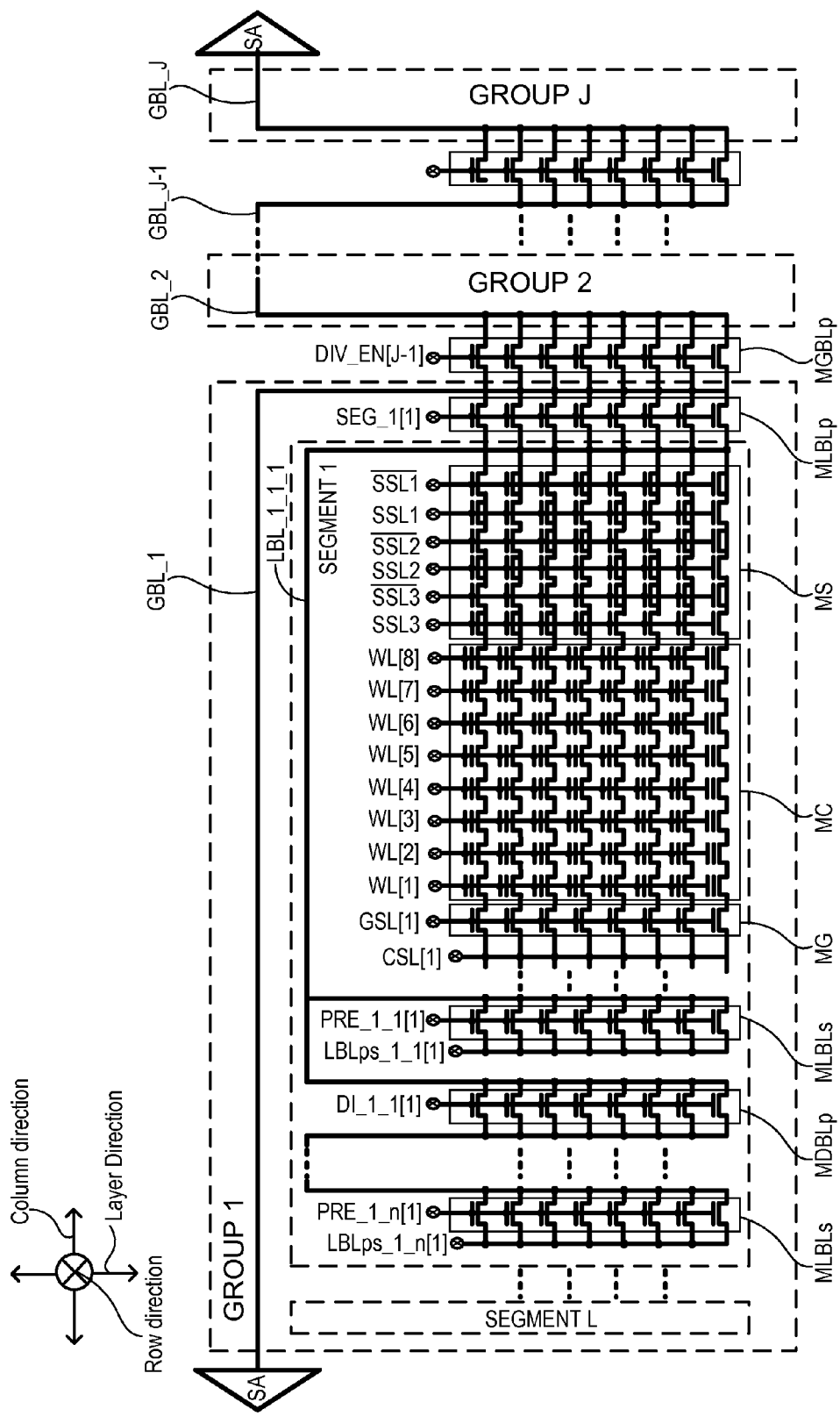
FIG. 3E is a circuit diagram of a 3D vertical-gate HiNAND2 array with a 2-level BL-hierarchical structure with both broken-GBL and broken-LBL according to an alternative embodiment of the present invention.

FIG. 3E is a circuit diagram of a 3D vertical-gate HiNAND2 array with a 2-level BL-hierarchical structure array with both broken-GBL and broken-LBL according to an alternative embodiment of the present invention. Unlike those 3D HiNAND2 arrays with vertical-channel configuration shown above, each of broken-GBL connector MGBLp, broken-LBL connector MLBLp, and power line transistor MLBLs, as well as string-select transistors MG and MS is made of a plurality of NMOS transistors connected deep in layer direction and in parallel with shorted drain and source nodes with their gates all tied to DIV_EN, SEG_1, PRE_1 and DI_1_1, GSL and LSL respectively. Both a metal2 GBL line and a metal1 LBL line have been divided into several smaller metal2 broken-GBL lines with 2λ width and metal1 broken-LBL lines with 2λ width associated with corresponding 3D capacitors in each 3D Group.

Similarly, this vertical-gate 3D HiNAND2 array can also perform multiple 3D NAND operations in a same or different 3D NAND plane simultaneously as long as each metal1 broken-LBL line and each corresponding metal2 broken-GBL line are available without having the data contention issue. More detailed descriptions about performing multiple NAND operations based on the 3D HiNAND2 array of FIG. 3E can be found in U.S. patent application Ser. No. 14/341,739, filed Jul. 25, 2014, commonly assigned and incorporated as reference for all purposes.

FIG. 4 is a circuit diagram of a 2D HiNAND2 array with a 2-level BL-hierarchical structure including broken-GBLs and broken-LBLs according to an embodiment of the present invention. As shown, the HiNAND2 array comprises J NAND Groups (of NAND cells) in column (Y) direction connected by N top-level long metal2 GBL lines being divided into J equally or unequally metal2 broken-GBL lines or capacitors such as GBL_1[1:N] through GBL_j[1:N] by J-1 GBL-divided 1-poly NMOS devices MGBL with their gates connecting to control signals DIV_EN[1] through DIV_EN[J-1], respectively. Each Group is divided into L paired Odd and Even number Segments in Y direction connected by N metal2 broken-GBL lines and each Segment further comprises a plurality of Blocks that are connected by 2N metal1 LBL lines. Correspondingly, within each Segment each top-level metal2 broken-GBL line is connected to two bottom-level local metal1 LBL lines respectively through two Odd-select and Even-select 1-poly NMOS devices MLBLo and MLBLe with their gates respectively connecting to two control signals SEGO and SEGE. In a specific embodiment, each metal2 broken-GBL line does run through all Segments in a Group, but each local metal1 LBL line does not run through from one Segment to another. Instead, each local metal1 LBL line within each Segment, such as LBL_1_1[1] for Segment 1 of Group 1, is further broken into m shorter broken-LBL lines (each acted as a parasitic poly capacitor) associated with m sub-Segments separated by m-1 LBL-divided 1-poly NMOS devices MDBLp with their gates connecting to control signals DI_1_1[1] through DI_1_m-1[1]. Accordingly, each sub-Segment contains K Blocks of NAND cells, such as Block 1 through Block K, or Block K+1 through Block 2K, . . . , or Block (m-1)×K+1 through m×K, arranged in series along column (Y) direction of the HiNAND2 array.

In an embodiment, another 1-poly NMOS device MDBLs is inserted to connect each shorter broken-LBL to a common power line LBLps. Total 2N MDBLs 1-poly NMOS devices are associated with each sub-Segment and are commonly gated by a control signal PRE serving at least a purpose for charging parasitic capacitors associated with these shorter metal1 broken-LBL lines. Each Block has, for example, 64 rows 2N columns of NAND cells. Each column of the NAND cells in a Block is also called a NAND string. Each NAND string in a Block has 64 NAND cells connected in series and sandwiched by a string-select 1-poly NMOS transistor MS at drain end and another string-select 1-poly NMOS transistor MG at source end which is coupled with a common source line (CSL) made in a metal0 level (laid at one level lower than the metal1 level) line arranged in row (X) direction. The CSL line associated with every Block in one Group is commonly connected (not explicitly shown in FIG. 4). Alternatively, each CSL can be shared by two neighboring Blocks (not shown explicitly in FIG. 4).

In an embodiment, the J-1 GBL-divided NMOS devices, MGBL, are configured to connect to one 2N-bit top Data Register and one 2N-bit top Cache Register located at top of the HiNAND2 array as well as one 2N-bit bottom Data Register and one 2N-bit bottom Cache Register located at bottom of the HiNAND2 array to allow the preferred full flexibility of simultaneously performing multiple NAND operations in a same or different planes.

As shown, each top-level metal2 broken-GBL in Y direction preferably connect to a pair of Odd-number and Even-number local metal1 LBL lines in Y direction respectively through two LBL-divided NMOS transistors, MLBLo gated by SEGO and MLBLe gated by SEGE per each Group. As a result, unlike the tight-spaced metal1 LBL lines with 2λ pitch width in X direction, the Odd and Even BL scheme configuration proposed in FIG. 4 makes the metal2 GBL lines with loose 4λ pitch width in X direction. In addition, the bottom node of each local metal1 LBL line in each Segment is terminated to a drain node of each 1-poly NMOS transistor MDBLs with its source node connected to one power line LBLps (another metal0-level line). The gate of the transistor MDBLs is connected to corresponding PRE signal.

Although the Odd and Even BL scheme is also used in conventional NAND, it does not have extra level of metal BL. The purpose of conventional Odd and Even BL scheme is merely for half-page to be selected for Program with half-page coupled to a Vdd for Program-Inhibit to avoid BL-BL coupling noise effect. But in certain embodiments of the present invention, the Odd and Even bottom-level metal1 LBL lines per one top-level metal2 GBL line is not for performing half-page Program, instead, for performing whole page Program in two cycles to load the Odd number half-page and the Even number half-page program data patterns.

In an example, each preferred NAND Group in a 2D HiNAND2 array includes L NAND Segments, and each NAND Segment further includes K×m Blocks (or m sub-Segment each with K Blocks) along with one shorter metal1 LBL line or parasitic capacitor. Each NAND Block further includes N NAND strings and each string has 64 NAND cells connected in series in Y direction with one top string-select NMOS transistor MS gated by a SSL line in X direction and one bottom string-select NMOS transistor MG gated by a GSL line in X direction. In this example, each string contains 64 NAND cells. Of course, the number of cells in each string can also be 8, 32, 128, or other integers, depending on NAND array design.

Figure 5:
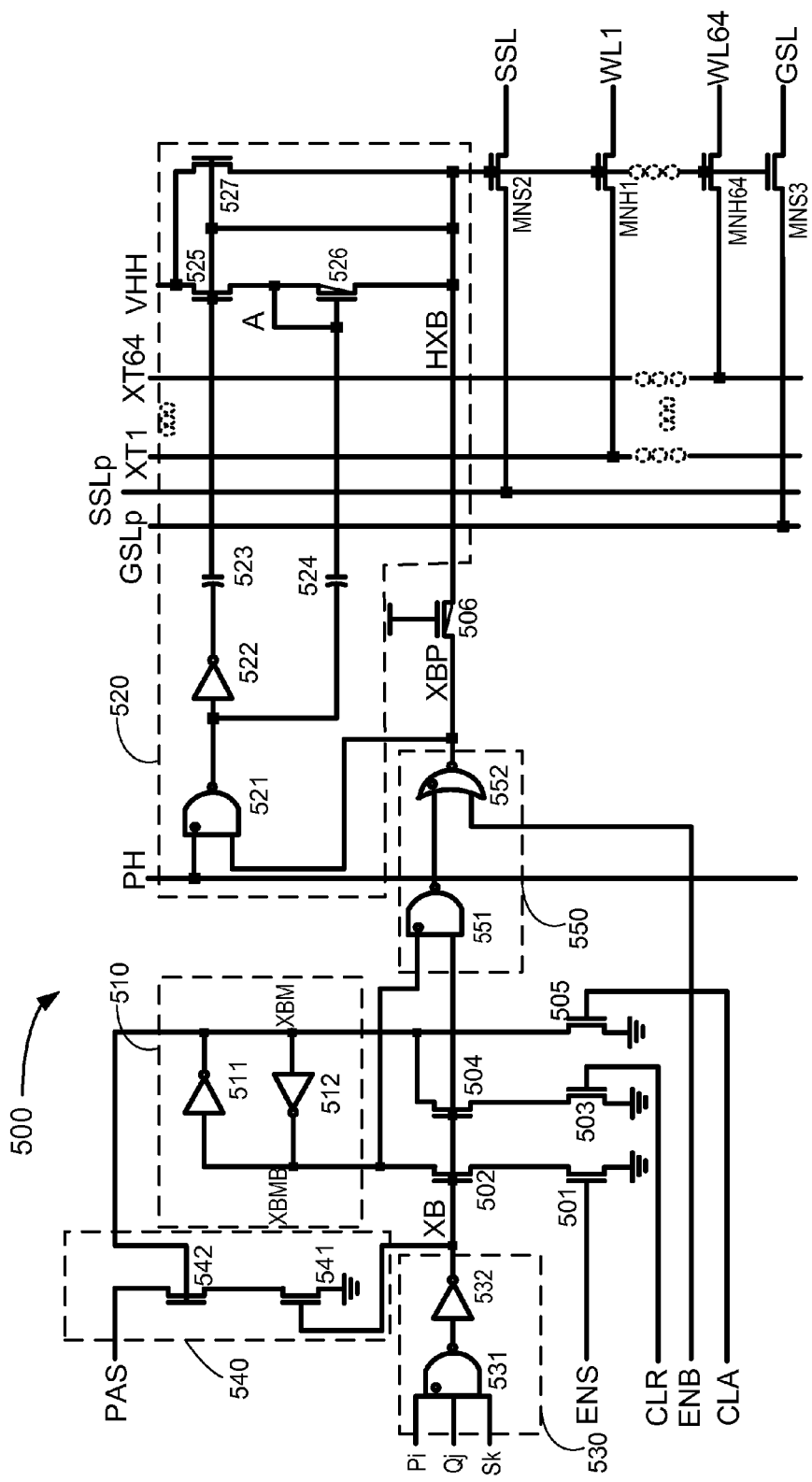
FIG. 5 is a circuit diagram of a Block-decoder circuit associated with the 2D or 3D HiNAND2 array according to an embodiment of the present invention.

FIG. 5 is a diagram of a Block-decoder circuit associated with the 2D or 3D HiNAND2 array according to an embodiment of the present invention. As shown, a preferred Block-decoder circuit 500 includes one latch 510, one pump circuit 520, one pre-decoder 530, one busy reporter 540, and a XB driver 550 and to connect or disconnect one common set of 64 XTs, SSLp, and GSLp bus lines from each Block's 64 WLs, SSL, and GSL lines associated with a 2D or 3D HiNAND2 array. The pre-decoder 530 includes three inputs Pi, Qj, and Sk of a NAND2 device 531 plus an INV1 device 532 and an output XB node. The pump circuit 520 includes 64 vertical XT inputs, a GSLp line, and a SSLp line respectively for the corresponding 64 WLs, one SSL string-select line, and one GSL string-select line in one selected Block of the 2D or 3D HiNAND2 array. The latch 510 is made of two Invertors 511 and 512 configured to enable or disable the pre-decoder 530 output XB to control the pump circuit 520. In addition, the busy reporter 540 is a special status reporter circuit with a built-in PAS output to allow system to know the Latch status of each selected Block.

Other preferred control signals for this Block decoder circuit 500 include CLR (Clear selected-Block's Latch), ENB (Enable B), CLA (Clear all Blocks' Latch), MPG (Program), and the Latch status reporting node, PAS. In this situation, the triple-Pwell (TPW) voltage will be coupled to 20V with XHB node at Vss. As a result, no leakage of floating 20V on the SSL line to SSLp bus through transistor MNS2. Thus, MS string-select device in the NAND string (see FIG. 4) would see 20V of SSL line on gate and 20V on triple-Pwell without the stress across gate and channel. Thus, the MS transistor is protected during the Erase operation.

The multiple outputs of each Block-decoder circuit 500 include horizontal lines SSL, WL1 to WL64, and GSL with 64 XT vertical inputs such as XT1 to XT64 along with one HV input, VHH, and two inputs SSLp and GSLp for Block-select control signal power lines. All transistors associated with those outputs are gated by HXB node and enabled by the XBP signal.

As compared with conventional Block-decoder circuit incorporating a similar latch circuit, the placements and functions of the latch circuit 510 in this Block-decoder circuit 500 of the present invention are different. Unlike the conventional Latch circuit which is designed and placed directly at output node XB, the preferred Latch circuit 510 in the present Block-decoder circuit 500 is used as a control signal to enable or disable the pre-decoder 530 output XB to pump circuit 520. In other words, once the latch circuit 510 is enabled, the Block is selected to pump up HXB node to pass the HV from XT1 through XT64 to WL1 through WL64, from GSLp to GSL, and from SSLp to SSL. Once 64 WLs, SSL, and GSL are charged to desired voltages, then the latch circuit 510 switches off to trap all Vpass and Vpgm in Program operation or $V_{READ}$ and VR for Read and Verify operations in corresponding parasitic capacitors of WL1 through WL64, SSL, and GSL. Thus the bus of XT1 through XT64, SSL, and GSL can be released for next operation that might need them. The Latch status can be sensed to pull-down PAS node once a Block-address is matched. More detail features of the Block decoder circuit design along with the novel BL-hierarchical HiNAND2 array of the present inventions can be found throughout the specification and particularly below.

In an embodiment, the Block-decoder circuit 500 allows all newly (or secondly) required sets of voltages for controlling multiple sets of 64 WLs, SSL, and GSL of multiple selected Blocks in any HiNAND2 array to be latched on multiple selected parasitic WL, SSL, and GSL capacitors in one same time interval or in different time intervals when an existing (or first) Read or Program operation is being executed.

In another embodiment, all voltages of the XT1 through XT64 signals on the plurality of XT-bus can be independently and collectively latched on multiple selected sets of 64 WLs, SSL, and GSL lines of firstly selected multiple random Blocks on different time intervals and then immediately released for simultaneous operations using the same XT-bus right after the previous operations for Program, Read, and Program-Verify in a same or multiple different NAND planes.

In yet another embodiment, in addition to the desired set of voltages being latched in multiple corresponding parasitic capacitors associated with 64 WLs, SSL, and GSL lines in the HiNAND2 array, the required BLs voltages for Read and Program operations in the array are also preferably latched in local 2N-bit metal1 LBL parasitic line capacitors through N-bit metal2 GBL parasitic line capacitors in a 2-level BL array.

Particularly, in a Block select mode, the pre-decoder 530 has three pre-decoder inputs generated respectively by P-dec, Q-dec, and S-dec. For example, Sk is generated from a selected Segment-decoder in a selected Group-decoder. When all 3 inputs of Pi, Qj, and Sk are met with a right address, then XB node is set to Vdd to make a native transistor 506 (with Vt~0), 1-poly NMOS transistors 504 and 541 in conduction states. The values of i for Pi, j for Qj, and k for Sk can be different series of integers. For example, for 1024 Blocks per plane, it needs total 10 address inputs. For a two-level bock decoder, if Pi pre-decoder has three address inputs, there will be $2^3=8$ outputs including P0~P7 (i=0, 1, ... 7). Qj pre-decoder has three address inputs, there will be $2^3=8$ outputs including Q0~Q7 (j=0, 1, ... 7). Sk pre-decoder has four address inputs, there will be $2^4=16$ outputs including P0~P15 (i=0, 1, ... 15). Other variations of input number assignment for each pre-decoder are possible and subjected to the HiNAND2 array organization and number of total Blocks in each NAND plane.

Then when the CLA is subjected to one-shot of Vdd, the XBM node will be set to Vss to make the XBMB node of the Latch circuit 510 to Vdd to enable XB node (Vdd) into a XB driver (including a NAND3 device 551 and a NOR1 device 552) to set XBP node at Vdd to enable the XT-pump circuit that is comprised of NAND1 device 521 with a PH clock input, Inverter 522 connected to capacitors 523 and 524, transistor 525 connected to VHH, and other transistors 526 (a native transistor with Vt~0), 527, and 506 (native transistor). The input of native transistor 506 is connected to a LV at XBP node and the output is connected to another HV at HXB node which is to enable Block pump circuit 520 to control the flow of GSLp, XT1 through XT64, and SSLp bus lines to the corresponding SSL, WL1 through WL64, and GSL lines in the selected Block.

In addition, the setting of PAS signal to Vss by one-shot pulse of ENB signal to inform Chip or system when the address of Block-decoder 530 is matched and the Latch circuit 510 (made of two invertors 511 and 512) is set with XBM node at Vdd. Later, the Latch circuit 510 can be cleared by one-shot of CLR signal to make XBM node at Vss. More details of this preferred Block-decoder operation along with the HiNAND2 array will be found with reference to FIGS. 6A and 6B and corresponding descriptions shown below.

FIG. 6A shows three tables that provide the preferred sets of bias voltage conditions of each Block-decoder of FIG. 5 to work with the 2D or 3D HiNAND2 array for performing multi-task concurrent/pipeline NAND operations in a same or multiple different NAND planes according to an embodiment of the present invention. Three tables together of the present invention in FIG. 6A merely demonstrate one example that performs only two concurrent/pipeline operations. Practically, two or more NAND operations can be well executed in two options in such concurrent and pipeline manner.

One option is referred as the multiple-task concurrent operation that is relatively easier to be carried out by an on-chip central CPU or a simpler State-machine circuit because the executions of part or whole of multiple identical tasks or operations can be collectively initiated, performed, and ended at same timelines to reduce the complexity of traffic control of data flow in a plurality broken GBLs and broken LBLs in all NAND planes. Another option is cited as multiple-task pipeline operation that requires one on-chip CPU or State-machine to work along with a plurality of distributed self-timed control circuits placed physically near respective decoders such as Block-decoder, Segment-decoders, DI and DIV decoders for more efficient and tracking executions of multiple operations. The multiple operations are initiated, executed, and ended automatically, individually and independently and randomly with much more flexibility of NAND array usage. In an embodiment of the present invention, the multi-task concurrent/pipeline operations includes at least two operations respectively initiated at either the same time to different time, executed during a same or different time spans, ended in same or different time with a partial time performing concurrently and rest partial time in pipeline fashion.

The example of FIG. 6A shows a second operation or task executing concurrently or in pipeline manner with a corresponding first operation. The tasks of the first operation and the second operation can be the same or different or performed alternatively at any different time intervals if no data contention occurs on any shared bus. The number of tasks involved in the first and second operations can be more than one type. For example, desired task types for concurrent NAND operations include Read, Program, Program-Verify, Erase and Erase-Verify of NAND memory. Whether the second operation conflicts with the first operation or not, it needs to comply with the data traffic rules set to avoid contention in the common bus such as broken-GBLs or LBLs, to be shown in FIGS. 11A-11C, and FIGS. 12A-12C, and FIGS. 13A-13B in later sections of the present invention.

The first table describes control signal setup for a second Read in one selected Segment with a large CLBL while a first Read, or first Program, or first Program-Verify, or first Erase-Verify operation being performed concurrently or in pipeline manner in another broken-LBL in same or different Segment. The second operation Read of this example is subjected to a preferred set of biased conditions for XB, XBM, ENS, CLR, CLA, XBP, PH, ENB, HXB, GSLp, SSLp, XT1-XT64, VHH, SSL, GSL, WL1-WL64, and PAS. At least seven steps as indicated in the table are preferred, starting the from an initial step of precharging in 2N LBL lines of a 2N-bit DPB, then next a step of latching the voltages of corresponding sets of 64 WLs, SSL and GSL lines to discharge or retain 2N LBL lines' precharge voltage, then next step of a charge-share (CS) operation being carried out between each LBL capacitor and each corresponding GBL capacitor, then a step of transferring charge states to each corresponding sense amplifier of the SPB for cell data evaluation to complete the course of the second Read operation with first operation.

The details of the seven steps to perform the second Read operation with the first operation are further explained below.

First step: Initialization. In this stage, all latches of all decoders are reset to make XBM node to 0V. This is done by coupling one-shot signal of CLA to the gate of a NMOS device 505 with CLR signal set at 0V and ENS signal set at 0V to guarantee the initialization being performed successfully without causing fighting between two pull-down legs of a Latch 510 (made of one paired Inverters of 511 and 512 in Block-decoder circuit of FIG. 5). Simultaneously, the initial voltages of other control signals are set as: GSLp=SSLp=1=Vdd, XT1-XT64=1 or 0 (now at low power state without pump), PH=0V to not enable a Pump clock to save power, VHH=1=Vdd (high voltage pump is not started yet at this stage to save power), and SSL=GSL=WL1-WL64=0# to let these signals floating at 0V.

Second step: Precharge LBL. In this stage, all LBL metal parasitic capacitors are precharged to $V_{inhibit}$=7V (or called Vinh) under the following bias conditions: a) SSL=GSL=WL1-WL64=0#, to let these 66 lines floating at 0V at previous reset cycle (Due to negligible coupling between 2N LBLs to all selected 64 WLs, SSL, and GSL lines, these lines are still floating at around 0V to prevent 2N LBLs precharged $V_{inhibit}$ voltage leakage through 2N NAND strings); b) HXB=0V to float all 64 WLs, SSL, and GSL lines by setting ENB=1=Vdd to force XBP=0 at gate of NOR1 device 552; c) XB=1/0 at a low-voltage state don't care; d) VHH is pumped to H1 or H4 in accordance with the first operation such as Read, Program, Program-Verify or Erase-Verify.

Furthermore, at this stage, the XT1-XT64, SSLp, and GSLp lines are released for other concurrent operating usage so the corresponding voltages become 'don't care' states for a first selected set of 64 WLs relative to other operations while waiting for the completion of LBL precharge of currently selected blocks. After this step, all the selected DPBs in the selected Segment would be fully charged with $V_{inhibit}$ from the selected LBLps power lines as shown in 2D or 3D HiNAND2 arrays.

Third step: Charge WLs, SSL and GSL lines. The voltages of all WLs, SSL, and GSL lines would be collectively set or charged to the desired levels one by one in a pipeline manner to allow the selection of any WLs in each selected block to be read independently and individually without any restriction of the present invention. The following bias conditions are proposed: a) XB=1 due the matched address; b) XBP=1 because XBM=0 but XBMB=1 and ENB=0; c) HXB=H1'=Vread+Vt supplied by a central HV pump; d) PH=CK to start clock pulse to connect the 66-pass gates of the Block-decoder to allow the transferring the H1/VR voltages on XT1-XT64, SSLp, and GSLp to the corresponding 64 WLs, SSL, and GSL lines for the second Read operation. The WL precharge time can be controlled by a Self-timed Block-decoder (not shown).

Fourth step: Latch WL, SSL, GSL to discharge on-cell and perform charge-sharing between LBL and GBL. In this step, respective 66 voltage signals are latched into each set of 64 WLs, SSL, and GSL poly parasitic capacitors immediately and collectively once the third step above is completed. The latching of all the 66 voltages would last about 5-10 µs per iterative ISPP Read time controlled by a delay control circuit associated with the corresponding Self-timed Block-decoder (not shown).

The fourth step can be carried under the following bias conditions and sequences: a) Set ENB=1 to force XBP=HXB=0 to turn off all 66 NMOS transistors of MNS2, MNS3, and MNH1-MNH64 and also to disable the pump circuit 520; b) GSLp=SSLp=X and XT1-XT64=X, this means GSLp, SSLp, and XT1-XT64 lines can be released out for another concurrent and pipeline operation usage when the SSL and GSL lines are floating at Vdd and 63 non-selected WLs are floating at Vread (~6V) and one selected WL floating at VR for this second Read so that the precharge voltage of 2N LBL metal parasitic capacitors will be either discharged or retained in accordance with the stored data. The discharge time is also controlled by a Self-timed Block-decoder circuit (not shown) per each LBL line. After that, a charge-sharing operation is performed between LBL and GBL and the diluted sensed voltages would be evaluated by each corresponding sense amplifier in SPB.

Fifth step: Lock XB Driver. In order to prevent any inadvertent operation from the latched 66 voltages (XT1-XT64, SSLp, and GSLp) in XB Driver, the lock operation of XB driver is necessary.

The fifth step can be carried under the following bias conditions and sequence: a) The addresses of three pre-decoders of Pi, Qj, and Sk are matched when a Block is selected, thus XB=1 to turn on NMOS transistor 502; b) The rising edge of one-shot pulse ENS is to turn on transistor 501 along with XB=1 to set Latch's XBMB=0 so that NMOS transistor 541 in the status report circuit 540 is turned on, thus PAS=0, at Vss=0V.

Note, when XBMB=0, it will disable NAND2 device 501 from being affected by any transient inputs to accidently turn on the Block decoder so that the LBL discharging operation would be degraded. In addition, the Latch is also used as the record of selected Block during the second Read operation.

Sixth step: Unlock XB Driver of the selected block to complete the second Read operation so that this Block can take new operation again in accordance with the instruction of next operation. This step can be carried under the following bias conditions and sequence: applying one-shot pulse of CLR up to Vdd to the gate of NMOS transistor 503 with XB=1 to reset the latch circuit 510. As a result, XBM=0 and the XB Driver 550 could be activated for the discharging operation consecutively.

Seventh step: Discharge all 64 WLs, SSL, and GSL lines of the selected Block collectively and simultaneously when the second Read operation is finished to reduce Vread stress on NAND cells' gates. Again, the discharge time of around 3 µs is also by a Self-timed control circuit (not shown). This step can be done by following bias conditions and sequence of: a) Generating one-shot pulse of XBP and HXB (up to Vread+Vt) by applying one-shot pulse ENB; b) SSLp=GSLp=XT1=XT64=0V and CLA=0V; c) XB=1 and ENS=CLR=CLA=0V.

As a result, the H1=Vread HV on multiple sets of 64 WLs, SSL, and GSL lines of the selected Block are discharged to XT1-XT64, SSLp, and GSLp lines at 0V and get ready to be charged up again in accordance with any next concurrent or pipeline operations.

The second table of FIG. 6A shows how to perform a second Program operation concurrently while a first Read, Program, Program-Verify and Erase-Verify operation is being performed. This operation involves another similar 5 steps with the same sets of control signals implemented in the Block-decoder circuit 500 of FIG. 5 associated with the 2D or 3D HiNAND2 array as explained in the first table shown above. Please note, during the discharge step, one-shot pulse at HXD will reach to Vpp+Vt, but the discharge of WLs, SSL, GSL of selected Blocks starts at much earlier once the HXD voltage above 1V to allow gates of transistors MNS2, MNH1 through MNH64, and MNS3 to open.

In this case, the operation is divided into seven steps in accordance with Block-decoder circuit 500 shown in FIG. 5 and the HiNAND2 array. The first step includes precharging all 2N metal1 LBL lines, 64 WLs, SSL line, and GSL line concurrently. As shown in this table, how to precharge SSL, 64WLs, and GSL is illustrated via a series of control signals. The precharge of 2N metal1 LBL lines will be explained later in PRE-generator circuit of FIG. 9 that generates a PRE signal with required HV for a full pass of the $V_{LBL}$ voltage for Read, Program-Verify, and Erase-Verify operations from the corresponding LBLps_1_1[1] to LBLps_1_m[1] in each Segment of the selected Groups.

First step: Initialization. It is same as the one referred in the previous table.

Second step: It is same as the one in the previous table.

Third step: In this stage, each set of 64 WLs, SSL and GSL voltages would be collectively set or precharged to the desired level one by one in a pipeline manner to allow the selection of any WLs in each selected block to be programmed independently and individually without any restriction of the present invention.

This is done by the following bias conditions: a) XB=1 due the matched address; b) XBP=1 because XBM=0 but XBMB=1 and ENB=0; c) HXB=H4'=Vread+Vt supplied by a central H4 HV pump; d) PH=CK means clock staring clocking to connect the 66-pass gates of block decoder to allow the transferring the H2=Vpass or H3=Vpgm on 64 XT1-XT64, SSLp, and GSLp inputs to the corresponding 64 WLs, SSL and GSL lines for the second Program operation. The WL precharge time will be controlled by a Self-timed Block decoder not shown.

Fourth step: To latch respective 64 voltages into each set of 64 WLs, SSL, and GSL poly parasitic capacitors immediately and collectively once the third step of precharging is completed. The latching of all 66 voltages would last about 20 µs per iterative ISPP program time controlled by a delay control circuit associated with the corresponding Self-timed Block-decoder (not shown).

This can be easily done by the following bias conditions and sequence: a) Set ENB=1 to force XBP=HXB=0 to turn off all 66 NMOS transistors of MNS2, MNS3, and MNH1-MNH64 and also to disable the pump circuit 520; b) GSLp=SSLp=X as well as XT1-XT64=X to release all bus of GSLp, SSLp, XT1-XT64 for other concurrent/pipeline operation usage when the SSL is floating at Vpass(~10V), GSL is floating at 0V and 63 non-selected WLs are floating at Vpass and one selected WL floating at Vpgm of this second Program operation so that the voltages of 2N LBL capacitors will be $V_{inhibit}$ or 0V in accordance with the programmed data. The program time is also controlled by a Self-timed circuit (not shown).

Fifth step: Lock XB Driver. In order to prevent any inadvertent operation from the latched 66 voltages in XB Driver, the lock operation of XB driver is necessary.

This can be easily done by the following bias conditions and sequence: a) The addresses of three pre-decoders of Pi, Qj, and Sk are matched when it is selected, thus XB=1 to turn on NMOS transistor 502; b) The rising edge of one-shot pulse of ENS is to turn on transistor 501 along with XB=1 to set Latch's XBMB node at 0 so that NMOS transistor 541 is turned on, thus PAS=0 e.g, 0V.

Note, when XBMB=0, it will disable NAND2 501 from being affected by any transient inputs to accidently turn on the Block decoder. In addition, the Latch is also used as the record of selected Block during the second Program.

Sixth step: Unlock XB Driver of the selected block to complete the second Program operation so that this block can take new operation again in accordance with the instruction of next operation.

This can be easily done by the following bias conditions and sequence: Apply one-shot pulse of CLR to gate of the NMOS transistor 503 with XB=1 to reset the latch 510. As a result, XBM=0 and XB Driver could be activated for the discharging operation consecutively.

Seventh step: It is same as the one in the previous table.

The third table of FIG. 6A shows how to perform a second Program-Verify operation concurrently while a first Read, Program, Program-Verify and Erase-Verify operation is being performed. This operation involves another similar seven steps as explained above associated with the first table on top. It allows the transferring the H1/VP on 64 XT1-XT64, SSLp, and GSLp to the corresponding 64 WLs, SSL and GSL lines for the second Program-Verify operation. The WL precharge time will be controlled by a Self-timed Block decoder not shown. Please note, during the discharge step, one-shot pulse at HXB will reach to H1' or H4', but the discharge of WLs, SSL, GSL of selected Blocks starts at much earlier once the HXB voltage above 1V to allow gates of transistors MNS2, MNH1 through MNH64, and MNS3 to open.

Since both Read and Program operations all need to precharge and discharge 64 WLs, SSL, GSL, LBL lines, and GBL lines with different voltages, thus the signal setups in the second and third tables are pretty much the same as the signal setup in the first table. Thus detailed descriptions of the second and third tables are skipped here, except that, for second Program operation, the selected WL is set to H3=Vpgm, about 20V, and 63 non-selected WLs are set to H2=Vpass, about 10V.

FIG. 6B is a table showing several preferred sets of bias voltage conditions of signals XB, XBM, ENS, CLR, CLA, XBP, PH, ENB, HXB, GBLp, SSLp, XT1-XT64, VHH, SSLp, GSLp, WL1-WL64, GSL, TPW, and PAS for controlling a concurrent erase operation for the dispersed selected Blocks according to an embodiment of the present invention. The bias conditions of the dispersed Block-Erase operation are in accordance with the Block-decoder circuit 500 shown in FIG. 5 and the 2D HiNAND2 array shown in FIG. 4 and 3D HiNAND2 arrays shown in FIGS. 3A, 3B, 3C, 3D and 3E. The so-called dispersed selected Blocks means that the number N of the selected blocks for erase is any number between 1 and total number of blocks in all NAND planes of whole NAND array. It is nothing to do with the TPW of whole NAND array being divided or not. Further, within each selected Block, the number of the selected WLs for erase can be any number between 1 and 64 if the Block is made of 64-cell NAND string structure.

The preferred dispersed concurrent Block Erase operation of the present invention includes four key steps as summarized below.

First step: Initialization. It is the same as the one shown earlier for performing second operation while the first operation of Program, Read, Program-Verify, and Erase-Verify in FIG. 6A.

Second step: Setup. This step is completed in the following process. Firstly, it is to discharge the select sets of 64 WLs and SSL and GSL poly parasitic capacitors to 0V and then float them at 0V initially in the selected NAND planes before ramping up TPW and DNW voltage to Vers (~20V). This is done by using the bias conditions shown in the bottom row of FIG. 6B table by setting XB=1 and ENB=1=Vdd with common bus lines of XT1-XT64=GSLp=SSLp=0V, one selected planes, regardless of selected or non-selected blocks.

Before the voltages of TPW and DNW of the selected NAND planes are selectively raised to the same Vers by an iterative steps starting from 15V with a final highest voltage of approximate 20V, all associated poly horizontal lines of WLs, SSL, GSL, PRE, DI, DIV_EN and SEG on top of the selected planes have to be discharged to 0V and then disconnected from their respective Decoders to be floating at 0V initially to avoid the gate breakdown happening on those NMOS transistors connected to poly lines by HV TPW in next erase step shown below.

Secondly, it is to ramp the voltages of the selected TPW and DNW to initial Verase=15V so that all poly lines are coupled to the same floating 15V so that no voltage drop between all poly gates of MLBLo, MLBLe, MDBLp, MDBLs, MGBL, MG, and MS and TPW in the same NAND plane. As a result, no gate breakdown will happen on above devices.

Thirdly, it is to sequentially discharge the randomly selected number 64 WLs to 0V for erase but to charge the adjacent non-erase WLs with a voltage H6=Vers−ΔV (ΔV~3 to 5V) in the randomly selected blocks to avoid the WL-WL coupling effect on one-block by one-block base. The voltages of the rest of non-selected erase WLs and all SSL and GSL lines should be left floating HV mode to avoid erase or gate breakdown.

Third step: Perform pipeline Erase on block-block base. Once a set of selected WLs is discharged to 0V of one selected block, the erase operation starts immediately. Several selected blocks may have the overlapping erase period before the discharge of WL to 0V is shorter than each lengthy iterative erase time of around 200~500 µs.

Fourth step: Perform concurrent Erase-Verify. This can be performed concurrently if the erase time is controlled to end on the same time for all selected erase blocks even though their erase operation is performed at different timelines because the erase time typically is much longer than the WL=0V set up time.

Now, more details for Dispersed erase operation will be explained for above steps with reference to the circuits of the 2D and 3D array in FIG. 4 and FIG. 3A-3E and Block-decoder circuit of FIG. 5, SEG-decoder circuit of FIG. 7A, DI-decoder circuit of FIG. 7B and PRE-decoder circuit of FIG. 9.

Before the Erase Setup step is performed, all initial voltages of WLs, SSLs, GSLs, DI, DIV, PRE, and SEG poly lines have to be discharged collectively and simultaneously to 0V and then latched into floating state. In other words, floating at 0V before ramping up TPW and DNW voltage to the same Vers for Erase operation of the present invention.

Force all WLs=SSLs=GSLs=0V by turning on all Block-decoders in FIG. 5.

This is done by setting the following bias conditions:
a) Force all Pi=Qj=Sk=1=Vdd by forcing all outputs of three R, T and G pre-decoders to be Vdd during erase operation. Thus=XB=1.
b) Set CLA=1, then XBM=0, than XBMB=1.
c) ESB=0 and output of NAND2 (551)=0, thus XSP=HXS=1=Vdd. But to save power, we set PH=0 without clock.
d) Set GSLp=SSLp=XT1-XT64=0, then SSL=WL1=WL64=GSL=0V.

Figure 7A:
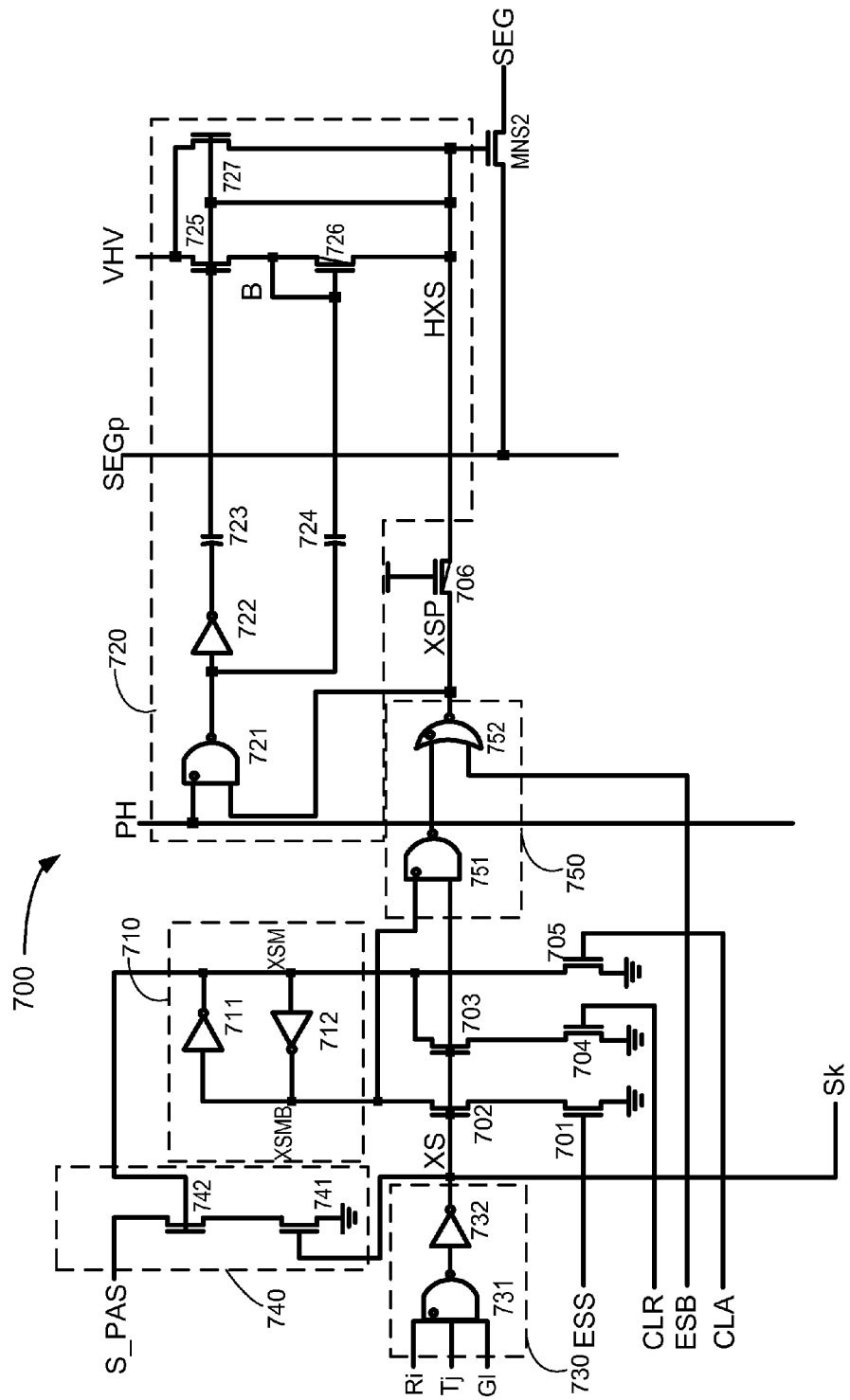
FIG. 7A is a circuit diagram of a preferred Segment-decoder to generate both SEGE and SEGO signals of two different even and odd addresses of a 2D HiNAND2 array shown in FIG. 4 and a SEG signal for several 3D HiNAND2 arrays shown in FIG. 3A, FIG. 3B, FIG. 3C and FIG. 3D according to an embodiment of the present invention.

Force all SEGs=0V initially and floating them in FIG. 7A by setting the following steps.
a) Force all Ri=Tj=Gl=1=Vdd by forcing all outputs of three R, T and G pre-decoders to be Vdd during erase operation, thus=XB=1.
b) Set CLA=1, then XSM=0, than XSMB=1.
c) ESB=0 and output of NOR2 device (752)=1 thus XSP=HXS=1=Vdd. But to save power, we set PH=0 without clock.
d) Set SEGp=0, then all SEG=0V.

To float SEG, it can be done by setting ESB=1, thus XSP=HXS=0V to disable pump to shut off MNS2 transistor.
Force all PRE=0V initially in FIG. 9.
a) Force Ri=Tj=Gk=1 and XSMB=1, then XPR=1 and HXP=1 when ESB=0,
b) but set PH=0 to save power,
c) when PREp=0, then all PRE=0V.
To latch into floating state: Set ESB=1, thus XPR=HXP=0.
Force all DI=0 initially in FIG. 7B.
a) Force Xi=Yj=1,
b) CLA=1, then XSMB=1, then XDP=HXD=1 when ESB=0,
b) but PH=0 to save power,
c) when DIp=0, then all DI=0V.
To latch DI into floating state: Set ESB=1, thus XDP=HXD=0.

Now, once all WLs, SSLs, GSLs, DIs, DIVs, SEGs and PREs signals are set floating at 0V, then the Setup step above can be started without the gate-breakdown concerns on all those NMOS MV devices such as MLBL, MDBL, MDBLp, MDBLs, MGBL, and MG and MS in all NAND strings. The voltages of TPW and DNW of selected planes would be ramped to Vers in iterative way to reduce the Vers voltage-stress during Erase operation. As a result, all poly lines of WLs, SSLs, GSLs, DIs, DIVs, SEGs and PREs would be floating at same Vers voltage as TPW and DNW in the select planes.

Next, the Erase operation moves to the third step mentioned above to sequentially set each randomly selected WLs in the randomly selected blocks, randomly selected segments and randomly selected groups into erase operation on one-block-by-one-block base. The preferred voltages for all key control signals of block-decoder of each selected erase blocks are summarized in the table and explained with reference to FIG. 5 below.

For un-select erase blocks: XB=XBM=ENS=CLR=CLA=XBP=HXB=0=Vss but ENB=1=Vdd but GSLp=SSLp=H5, XT1-XT64=H5, H6, or 0V, SSL=GSL=WL1-WL64=H5#, TPW=H5 and PAS=1& where H5# means floating voltage of H5. 1& means floating at Vdd if pull-down device of this circuit is not being turned on.

The reason of above results are because for the non-selected blocks, then the 3 inputs of Pi, Qj and Sk are not all "1", thus XB=0 of 3-input AND (NAND+NOR=AND), then to force the output of NAND 551=Vdd to results in XBP=0 and HXB=0 through 506 native device of on-state, regardless of Latch status of 510 and ENB. As a result, then output of 521 NAND=Vss to disable the local VHH pump of 520 and to shut off all 66 NMOS transistors of MNS2, MNS3 and MNH1-MN64 in one non-select block decoder. All 66 long poly lines of SSL, WL1-WL64 and GSL in one non-selected block are floating.

Further in the first step, an one-shot pulse is applied to CLA to set XBM node to 0 but XBMB node to 1 to enable device NAND3 for 3 Block-address inputs of Pi, Qj, and Sk. ENB signal is set to 1 (or Vdd) to disable device NOR1 to block those Block-address inputs of XB node. XBP node is at Vss to disable pump. Thus, both XB=0 (Vss) and XBP=0 (Vss) because the address of 3-input (Pi, Qj, and Sk) Block-decoder 530 is not matched.

PH clock is enabled to allow the voltage on XT1~XT64 to transfer onto WL1~WL64 for the selected Blocks. PAS is set to floating because XB node at Vss and transistor 541 is in off-state. Setting GSLp and SSLp inputs to H5 is to prevent from the coupled Vers voltage on GSL and SSL leaking to GSLp and SSLp since Vers=H5. Accordingly, XT1 through XT64 all are set to H5 for non-selected WLs or set to Vss for selected-WL for Erase or H6 for WLs adjacent to selected WL. SSL line, WL1 through WL64, and GSL line are at Floating state with a Vss value initially.

In another specific embodiment, for selected Erased Blocks, the signal setup includes setting XB node to 1 (or Vdd), because the selected one means its address is matched. Also, XBP node is set to Vss because ENB=1 to force the XBP node at Vss, thus HXB node at Vss, too. Other signal setup would be the same as those described above.

The third step of the concurrent Block Erase operation is to perform a concurrent Erase-Verify operation on multiple WLs in separate Segments in one or more Groups for the present invention. More than one WLs of the select blocks cannot be performed concurrent Erase-Verify, Program-Verify and Read operations. Again, it is like the Read or Program-Verify operations to take 7 additional steps as shown in FIG. 6B including discharging all selected WLs, SSL and GSL lines to 0V of all selected blocks in multiple different Segments in one or more than one Groups for the concurrent LBL precharge operation, precharging LBL to $V_{inhibit}$, charging WL, SSL, and GSL lines, latching WL, SSL, GSL to discharge on-cell and performing charge-sharing between LBL and GBL, locking XB driver, unlocking XB driver, and discharging WL, SSL, GSL of selected blocks.

FIG. 7A is a circuit diagram of a preferred Segment-decoder circuit associated with the 2D or 3D HiNAND2 array according to an embodiment of the present invention. As shown, the Segment-decoder circuit 700 includes one Latch 710, one pre-decoder 730 of a Segment with three inputs Ri, Tj, and Gk, one pump circuit 720 with a clock pulse input PH and HV power line VHV, and one Status-report circuit 740 with one Latch status node of S_PAS, along with several control signals such as ESS, CLR(Clear), ESB (Enable pump), CLA (Clear all-latch), a single Segment's output SEG, and one Sk output.

In conventional NAND architecture, there were no Segment-decoders because there is no need of divided LBLs to allow more than one WL concurrent page Program per one NAND plane. The Segment-decoders are used to connect a plurality of top-level N metal2 GBL lines to a plurality of bottom-level 2N metal1 LBL lines. Once one Block in a selected Segment is randomly selected, then this Segment's latch will be set to protect any further operations from being performed again in the same Segment unless the Segment is being reset.

As shown in FIG. 7A, this Segment-decoder circuit 700 also includes one status report circuit 740 made of transistors 741 and 742 connected in series with a S_PAS common output. There is only one HV output, SEG, of each Segment-decoder circuit 700 and one input control signal SEGp and one HV pump power line input VHV associated with the pump circuit 720.

The detailed operations of the Segment-decoder circuit 700 are similar to the above Block-decoder 500 (FIG. 5), excepting that only one HV output SEG is enabled or disabled. The key purpose of Segment-decoder latch 710 is to connect or disconnect the metal1 LBL lines of selected Segments from the corresponding metal2 GBL lines. When a Segment is selected for a first desired NAND operation, any next second operation on the same Segment would be prohibited by S_PAS signal to the system by the NAND chip. The required Program-Verify, Erase-Verify or Read data patterns will be locked in the corresponding multiple metal1 LBL lines during the whole course of above operations. Note that the metal1 LBL parasitic capacitor is not used to store the Program-data patterns. It is only used for Read, Program-Verify, and Erase-Verify because these preferred operations need to be precharged first, then discharged and amplified at SPB.

One special output signal of Sk is generated by this Segment-decoder circuit 700. When addresses of three inputs Ri, Tj, and Gk are matched, then output signal Sk becomes Vdd as shown in FIG. 7A. To accomplish two purposes, the Sk signal is to enable transistor 741 of Segment status circuit 740 associated with the Latch circuit 710 formed by two invertors 711 and 712. Further, the Sk signal is the same one in FIG. 5 as one of the three inputs of Block-decoder 530. In other words, a plurality of Block-decoders 530 within one Segment can only be selected when the corresponding Segment is being enabled. When each Segment's Sk signal outputs a Vss, then all the Block-decoders within the same Segment would be disabled or not selected.

Initially, after power-up, all Segments' Latches (710) would be reset by one common signal of CLA to make the corresponding node of XSM=Vss and XSMB=Vdd to enable the corresponding NAND3 device 751 to allow the selected SEG to be pumped to generate HV SEG signal for connecting the selected Segments' 2N metal1 LBL lines (or capacitors) to the corresponding N metal2 GBL capacitors.

In an embodiment, the Latch 710 of this Segment-decoder circuit 700 will be used to lock the SEG signal at HV voltage, similar as the Latch 510 of Block-decoder 500 is used to lock the SSL, 64 WLs, and GSL at HV voltages once the desired operations are started. In this way, the SEGp input signal can be released for next preferred simultaneous operation that needs to use SEGp for selecting the next desired Segment. This is similar to release the bus of SSLp, XT1 through XT64, and GSLp for the second Block-decoder selection for preferred concurrent operations. Other details of the Segment-decoding operation are like those associated with the Block-decoder circuit 500, thus are skipped here for description simplicity without degrading the spirit of this invention.

Figure 7B:
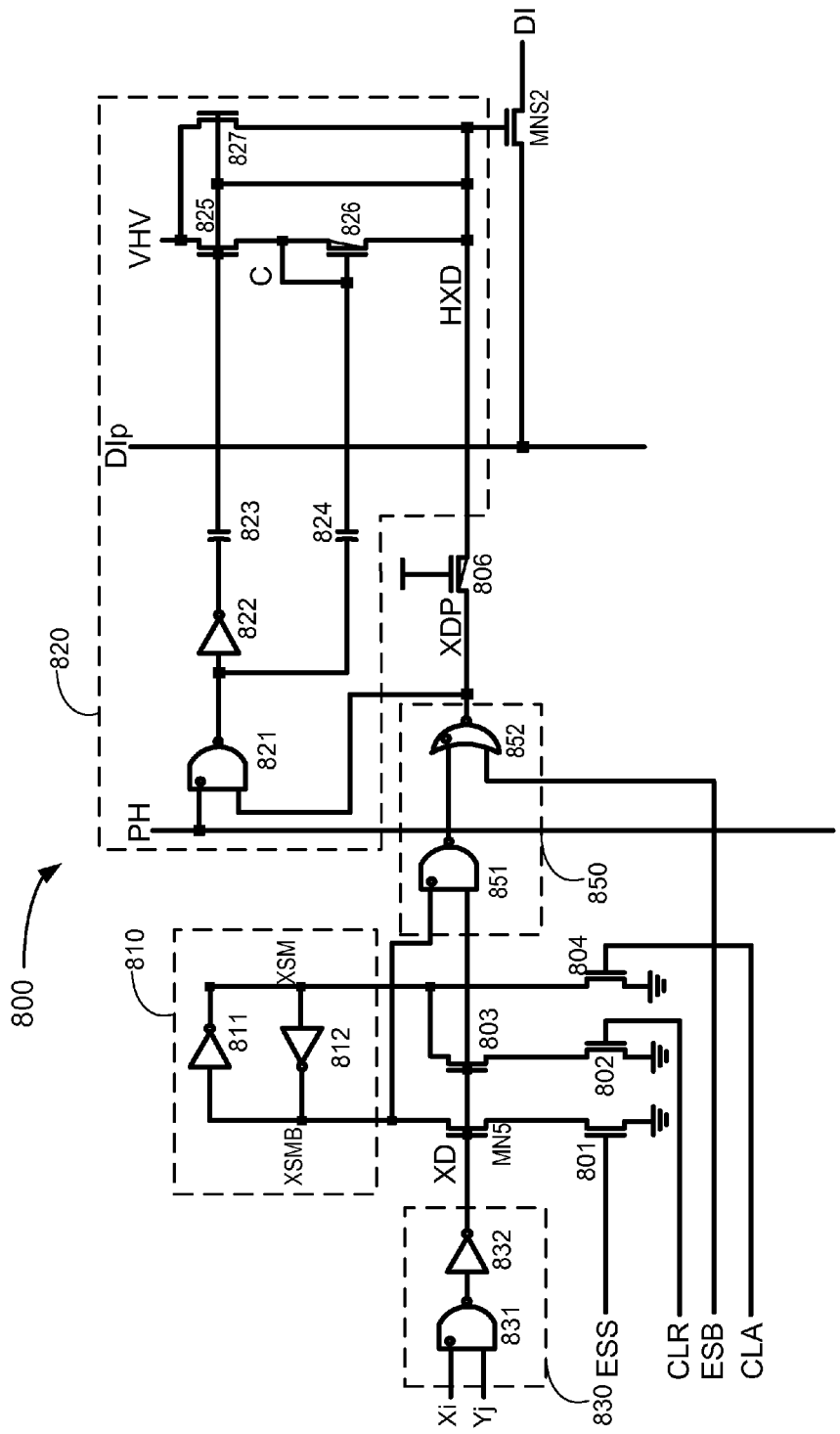
FIG. 7B is a circuit diagram of a preferred broken GBL decoder to generate DI signal for both 2D and 3D HiNAND2 arrays according to an embodiment of the present invention.

FIG. 7B is a circuit diagram of a preferred broken GBL decoder to generate DI signal for both 2D and 3D HiNAND2 arrays according to an embodiment of the present invention. In an embodiment, the DI decoder is intended for set signal DI for controlling broken-LBL connection to perform desired sub-Segment-based multi-task concurrent/pipeline Program operations. As shown, the DI-decoder circuit 800 includes one Latch 810, one pre-decoder 830 with three address inputs Ri, Tj, and Gk, one pump circuit 820 with a clock pulse input PH and HV power line VHV, and one Status-report circuit 840 with one Latch status node of S_PAS, along with several control signals such as ESS, CLR(Clear), ESB (Enable pump), CLA (Clear all-latch), a single output DI, which connects one row of LBL-divided transistors for form multiple sub-Segments within one Segment of the (2D or 3D) HiNAND2 array. Once one Block in a selected sub-Segment is randomly selected, then this DI's latch will be set to protect any further operations from being performed again in the same sub-Segment unless the sub-Segment is being reset.

The detailed operations of the DI-decoder circuit 800 are similar to the above Block-decoder 500 (FIG. 5), excepting that only one HV output DI is enabled or disabled. When a sub-Segment is selected for a first desired Program operation, any next second operation on the same sub-Segment would be prohibited by PAS signal to the system by the NAND chip. The required Program data patterns will be locked in the corresponding multiple metal1 broken-LBL lines during the whole course of above operations.

Initially, after power-up, all Latches (810) would be reset by one common signal of CLA to make the corresponding node of XDM=Vss and XDMB=Vdd to enable the corresponding NAND3 device 851 to allow the selected SEG to be pumped to generate HV DI signal for connecting/disconnecting two sub-Segment's 2N metal1 broken-LBL lines.

In an embodiment, the Latch 810 of this Segment-decoder circuit 800 will be used to lock the DI signal at HV voltage, similar as the Latch 510 of Block-decoder 500 is used to lock the SSL, 64 WLs, and GSL at HV voltages once the desired operations are started. In this way, the DIp input signal can be released for next preferred simultaneous operation that needs to use DIp for selecting the next desired Segment. This is similar to release the bus of SSLp, XT1 through XT64, and GSLp for the second Block-decoder selection for preferred concurrent operations. Other details of the DI-decoding operation are like those associated with the Block-decoder circuit 500, thus are skipped here for description simplicity without degrading the spirit of this invention. Note, for DIV-EN signal that control the common gate of GBL-divided transistors, a similar decoder circuit like the DI decoder 800 of FIG. 7B should be applicable in association with the 2D or 3D HiNAND2 array of the present invention and no further detail is given in the specification.

FIG. 8A shows several preferred sets of bias voltage conditions for the Segment-decoder circuit of FIG. 7A to work with the HiNAND2 array to control multiple simultaneous NAND operations in a same NAND plane or multiple different NAND planes according to an embodiment of the present invention. As shown, three tables for summarizing all control signals for performing three preferred simultaneous NAND operations of the present invention. The details are similar to FIG. 6A with operation complying with Block-decoder shown in FIG. 5. FIG. 8A shows a concurrent second Read while a first Read, or Program, or Program Verify, or Erase Verify operation in accordance with a Segment-decoder 700 shown in FIG. 7A. Whether the second operation conflicts with the first operation or not is up to the rules shown from FIGS. 11A-11C, FIGS. 12A-12C, and FIGS. 13A-13B being complied with embodiments of the present invention. The second operation is operated under a preferred set of biased conditions for signals/nodes 51, XSM, ESS, CLR, CLA, XSP, PH, ESB, HXS, SEGp, VHV, SEG, and S_PAS.

In an embodiment, these second operations include a Read operation while a first Read, or first Program, or first Program-Verify, or first Erase-Verify operation with five preferred steps from precharging and latching to discharge LBL and SEG lines to complete the cycle.

In another embodiment, these second operations include a Program operation while a first Read, or a first Program, or a first Program-Verify, or a first Erase-Verify operation with five preferred steps from precharging and latching LBL and SEG, then to sequentially discharging LBL and GSL lines to reduce WL disturbance.

In yet another embodiment, these second operations include a Program-Verify operation while a first Read, or a first Program, or a first Program-Verify, or a first Erase-Verify operation with five preferred steps from precharging, latching to discharge LBL and SEG lines, and then precharging and unlocking SEG driver to discharge SEG to reduce the WL HV stress to complete the cycle.

FIG. 8B shows several preferred sets of bias voltage conditions of signals S1, XSM, ESS, CLR, CLA, XSP, PH, ESB, HXS, SEGp, VHV, SEG, and S_PAS for controlling a dispersed Block Erase operation according to an embodiment of the present invention. As shown, the preferred bias conditions are to generate SEG output signal of dispersed Block-Erase operation in accordance with the Segment-decoder shown in FIG. 7A and the HiNAND2 array shown in FIG. 4. The preferred steps are proposed in FIG. 8B for this dispersed Block Erase Operation. Initialization step is similar to that in FIG. 6B. Setup step is for setting key signals for the selected and unselected Blocks for Erase. Erase step is for using the biased conditions of above said key signals to erase the selected Blocks. Erase-Verify follows the Erase step. It comprises six sub-steps from discharging the TPW-coupled voltages of floating 64 WLs, SSL, GSL to Vss of all Blocks during Erase step to unlock SEG drivers for the subsequent immediate Erase-Verify operation, to discharge only 64 WLs, SSL, GSL to Vss of selected Blocks only.

Further, an one-shot pulse is applied to CLA to set XSM node to 0 but XSMB node to 1 to enable the NAND3 device 751 for three address inputs of Ri, Tj, and Gk. Setting ESB=1 is to disable the NOR1 device 752 to Block address input of Segment pre-decoder 730. Thus, XSP node becomes Vss and HXS is Vss to disable pump circuit 720 with a HV supply of VHV=1 (or Vdd). S1 output becomes 0 (Vss) because Segment's three address inputs are not matched. These three inputs are Ri, Tj, and Gk, etc. PH clock is not needed during Erase, thus PH=0. S_PAS signal is left floating because Sk is set to Vss and transistor 741 is an Off-state. Note, S_PAS in Segment-decoder circuit 700 is like the PAS of Block-decoder circuit 500.

In addition, SEGp is applied with Vdd, but XSP and HXS nodes are at Vss, thus SEG is set to be floating, e.g, SEG=0# (floating at initially Vss) by shutting off 1-poly NMOS transistor of MNS2. SSL, WL1 through WL64, and GSL lines are left floating with Vss initially.

For the selected Erased Segments, Sk is set to Vdd, because Segment address is matched. S_PAS is enabled because Sk=Vdd to make transistor 741 in a conduction state. The setup of the rest control signals are same as those for unselected Erased Segments shown above.

Further, an one-shot pulse is applied to CLA to set XSM=0 but XSMB=1 to enable NAND3 device 751 for three Block address inputs of Pi, Qj and Sk. ESB is set to Vss to enable the NOR1 device 752 to allow the Address inputs Sk to be 0 (or Vss) because the address of Segment-decoder is not matched. PH clock is not needed during erase, thus PH=0. S_PAS is left floating at Vdd because Sk input is set to Vss and transistor 741 is in an off-state. SEG then is floating at Vers (erase voltage 20V on the word line).

For the selected Erased Blocks, Sk input is set to Vdd, because Segment-decoder address is matched. XSP node is at Vdd because ESB is set to 0 to enable the NOR1 device 752 XSP node at Vdd and further to set HXP node at Vdd.

In yet another specific embodiment, during Erase-Verify operation, additional 6 steps are taken similar to those for the Read and Program-Verify operations. Firstly, it needs to precharge the selected 2N metal1 LBL capacitors to a $V_{LBL}$ voltage and then discharging to Vss or retaining the $V_{LBL}$ voltage depending on the stored data pattern of multiple selected pages. Other steps are similar to those performed for Read and Program-Verify operations described earlier.

For example, for the unselected Blocks, then Sk is set to Vss that would disable the Block-decoder. As seen in FIG. 5, each Block-decoder 530 has three inputs, one of which is Sk. For the selected Segments, Sk is set to Vdd is to enable the selected Blocks inside the selected Segment. Similarly, during Erase, SEG signal is not needed, thus no clock is needed, PH=0.

FIG. 8C shows several preferred sets of bias voltage conditions for the DI decoder circuit of FIG. 7B to work with the HiNAND2 array to control multiple simultaneous NAND operations in a same NAND plane or multiple different NAND planes according to an embodiment of the present invention. As shown, the operation steps of setting bias conditions for performing a second Read/Program/Program-Verify operation while the first Read, Program, Program-Verify, and Erase-Verify operation are substantially similar to those described for Segment-decoder shown in FIG. 8A.

FIG. 8D shows several preferred sets of bias voltage conditions of signals XD, XDM, ESS, CLR, CLA, XDP, PH, ESB, HXD, DIp, VHV, and DI for controlling a dispersed Block Erase concurrent operation according to an embodiment of the present invention. As shown, the operation steps of setting bias conditions for performing a concurrent dispersed Block Erase operation are substantially similar to those described for Segment-decoder shown in FIG. 8B.

Figure 9:
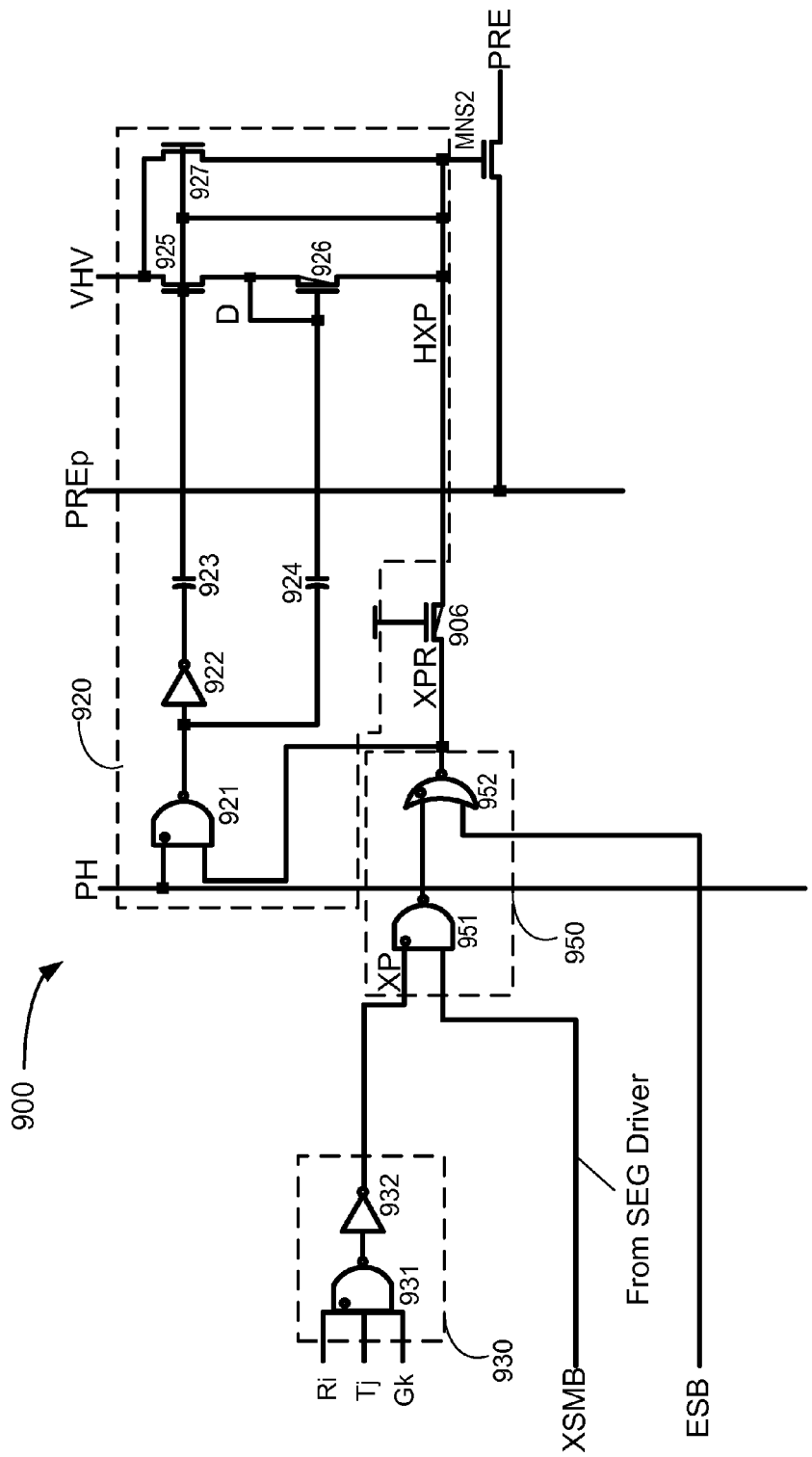
FIG. 9 is a circuit diagram showing a preferred PRE signal generator circuit associated with the 2D or 3D HiNAND array according to an embodiment of the present invention.

FIG. 9 is a circuit diagram showing a preferred PRE-signal generator circuit associated with the 2D or 3D HiNAND array according to an embodiment of the present invention. As shown, the PRE-signal generator circuit 900 comprises one Pre-decoder 930 with three inputs of Ri, Tj, and Gk and one local VHV pump circuit 920 with PH clock input and VHV power line input to fully pass the selected HV signal PREp to a PRE signal along with other control signals such as XSMB, ESB.

The number of such PRE-signal generator circuit 900 is preferably designed to be one per each Block with a much shorter metal1 LBL line or parasitic capacitor so that each metal1 LBL pre-charge current can be substantially reduced during page Program operation. Each Segment has K×m Blocks and each Group preferably has L Segments. Thus totally, J-groups of a HiNAND2 array has K×L×J Blocks, thus K×L×J PRE signals are associated with each long GBL. But each broken metal2 GBL line has only L×J PRE lines. The PRE lines are used to supply the desired $V_{inhibit}$ voltage for Program and $V_{LBL}$ voltage for Read when the selected LBLps lines are supplied respective $V_{inhibit}$ and $V_{LBL}$ voltages. When LBLps line is coupled to Vss, then PRE signal is used to discharge 2N short metal1 LBL lines and even longer N metal2 GBL lines voltages.

Since PRE signal generator circuit 900 needs to fully pass $V_{inhibit}$ voltage (>7V) to the selected LBLs in the selected Blocks of selected Segments from the selected LBLps supply lines, thus it has a local VHV (>7V) pump circuit with PH clock to connect PREp (PRE power line) to PRE which is only enabled whenever the address inputs of Ri, Tj, and Gk are matched. Other control signals include XSMB, ESB, etc.

Again, each 20V HV transistor per PRE circuit 900 has to be protected during the Erase operation. It is because the PRE line is also laid out in parallel to all WLs, SSL, GSL, SEG, and DI lines on top of HiNAND2 array. When Erase operation is performed, then the array's TPW of 20V would be couples to all lines of WLs, SSL, GSL, SEG, DI, and PRE when their initial voltages are floating Vss. This boosted 20V at SEG has to be retained during the Erase operation to protect MDBLs which is the transistor connecting to LBLps power line. It is because the gate of MDBLs and bulk of MDBLs would have the same 20V without resulting in the gate breakdown of MDBLs device.

FIG. 10A shows several preferred sets of bias voltage conditions for the PRE signal generator circuit of FIG. 9 to work with the HiNAND2 array for controlling multiple simultaneous NAND operations in the same NAND plane or multiple different NAND planes according to an embodiment of the present invention. As shown are only the detail bias voltage conditions for performing each second operation of Read, or Program, or Program Verify, or Erase-Verify. Whether the second operation conflicts with a first operation or not, it needs to comply with the rules as shown in the figures from FIGS. 11A-11C, FIGS. 12A-12C, and FIGS. 13A-13B shown in later sections of the present invention. The second operation is associated with a preferred set of biased conditions for XP and group signals from SEG driver such as XSM, ESS, CLR, CLA, XPR, PH, ESB, HXP, PREp, VHV, and PRE.

These second operations include a second Read operation while a first Read, or first Program, or first Program-Verify or first Erase-Verify operation with two preferred steps including precharging 2N LBLs to H1 voltage and PRE and discharging PRE driver to complete the cycle. These second operations include further a second Program operation while a first Read, or first Program, or first Program-Verify or first Erase-Verify operation with two preferred steps including precharging 2N LBLs to H1 voltage and PRE and discharging PRE driver to complete the cycle. These second operations include additional second Program-Verify operation while a first Read, or first Program, or first Program-Verify or first Erase-Verify operation with two preferred steps including precharging 2N LBLs to H1 voltage and PRE and discharging PRE driver to complete the cycle.

FIG. 10B shows several preferred sets of bias voltage conditions of XP and group signals from SEG driver such as XSM, ESS, CLR, CLA, XPR, PH, ESB, HXP, PREp, VHV, and PRE for performing a dispersed Block Erase operation according to an embodiment of the present invention. In an embodiment, three preferred steps are proposed for this dispersed Block Erase Operation, including setting up control bias for the selected and unselected Blocks, setting Erase conditions for the selected and unselected Blocks, and performing an Erase-Verify step with 5 sub-steps from discharging the coupled TPW erased voltages on 64 WLs, SSL, GSL to Vss of all Blocks to unlock XD drivers, to discharging only 64 WLs, SSL, GSL to Vss of the selected Blocks only.

Referring to FIG. 10A and FIG. 10B, the preferred sets of bias condition are provided to generate PRE, PREp, and VHV in accordance with the required Erase and Erase-Verify operations of the HiNAND2 array. The detailed biased conditions are disclosed in the tables for three steps of Erase setup, Erase, and Erase-Verify operations. Thus the detail operations are substantially the same as what have been described earlier in FIGS. 6A-6B, FIGS. 8A and 8B.

FIG. 11A shows two tables of bias conditions of multiple DIV_EN signals for performing a second Read operation at a Group while performing a first Read operation at a different Group along with a simplified HiNAND2 array with a schematic Block diagram of four Groups divided by three GBL transistors MGBL gated by three DIV_EN signals such as DIV_EN[1], DIV_EN[2] and DIV_EN[3] according to a specific embodiment of the present invention. As shown, in two tables of bias conditions of DIV_EN for a preferred operation of a second Read while a first Read being performed at different Groups in accordance with a simplified HiNAND2 array shown in FIG. 4 (or one of FIGS. 3A-3E for 3D NAND) and other circuits such as Block-decoder shown in FIG. 5, SEG of Segment-decoder shown in FIG. 7A, DI-decoder shown in FIG. 7B (and Group decoder similar to the DI decoder, not shown), and PRE generation circuit shown in FIG. 9.

The simplified HiNAND2 array is comprised of four Groups divided by three Group-divided NMOS MHV transistors MGBL gated by three DIV_EN signals such as DIV_EN[1], DIV_EN[2], and DIV_EN[3] of the present invention. In addition, one pair of Data Register and Cache Register termed as SPB are preferably placed on top and bottom of HiNAND2 array and are connected to 4 vertical groups such as Group 1, Group 2, Group 3, and Group 4 by four broken or separate metal2 GBL lines or capacitors.

Two tables next to the simplified HiNAND2 array show how to connect the selected Groups to either top or bottom Data Registers through the adjacent broken metal2 GBL lines by turning on or turning off the selected GBL-divided transistors of MGBL by properly coupling DIV_EN signal to Vdd (1) or Vss (0). For example, if Group 1 is selected for a first Read and is intended to be connected to top SPB for sensing, then three remaining Groups (Group 2, Group 3, and Group 4) can be selected for a second Read operation as indicated in the top three rows of the top table.

Case A): a first Read in Group 1 connected to top SPB, a second Read in Group 2 connected to bottom SPB. In this case, DIV_EN[1]=0 is to turn off MGBL transistor between Group 1 and Group 2 to allow a first metal2 GBL line of the Group 1 connect to top SPB without being affected or diluted by the second metal2 GBL line (and capacitor) formed in Group 2. Next, DIV_EN[2] and DIV_EN[3] are set to Vdd to turn on two connections between the second metal2 GBL line formed in Group 2, and the third metal2 GBL line formed in Group 3 and the fourth metal2 GBL line formed in Group 4 and bottom SPB.

In this case, the connection for the first Read in Group 1 to top SPB takes only one GBL capacitor but the connection for the second Read at Group 2 to bottom SPB takes three GBL capacitors. Thus the second Read signal would have 3-fold GBL capacitors loading more than the first Read signal, because it will have more dilution of charges read out from the second Read. But this is to show the two preferred Read operations can be performed totally independently and concurrently without having data contention issue in the same 2D or 3D NAND plane.

Case B): a first Read in Group 1 connected to top SPB, a second Read in Group 3 connected to bottom SPB. In this case, DIV_EN[1] and DIV_EN[2] are set to Vss but DIV_EN[3] is set to Vdd. DIV_EN[1]=Vss is to turn off one MGBL transistors between Group 1 and Group 2 to allow a first metal2 GBL capacitor of Group 1 to connect to top SPB without being affected or diluted by the second metal2 GBL capacitor formed in Group 2. But DIV_EN[2]=Vss is also used to isolate the third metal2 GBL capacitor of selected Group 3 from the second GBL capacitor of Group 2 so that charges in the third metal2 GBL capacitor would not be diluted by the second GBL capacitor and can be fully sent to bottom SPB when DIV_EN[3] is set to Vdd to connect the third metal2 GBL capacitor to bottom SPB.

Other connections such as setting DIV_EN[1], DIV_EN[2], and DIV_EN[3] to Vss is to allow Group 1 to connect to top SPB using the first GBL capacitor only for the first Read and Group 4 to connect to bottom SPB using only the fourth GBL capacitor for the second Read without bus contention. The second and third GBL capacitors are completely isolated from the first GBL capacitor and the fourth GBL capacitor. In this case, both the first Read and the second Read data from respective metal1 LBL capacitor being diluted evenly with only one metal2 GBL capacitor. Thus, in this case, the Read signal is larger than other cases.

The remaining combinations of connections in top table and bottom table of FIG. 11A with the first Read connected to bottom SPB and the second Read connected to top SPB are functionally similar to the above operations described in Case A) and B). Thus, the descriptions are skipped here for simplicity.

FIG. 11B shows a preferred data flow for concurrently performing a second Read operation along with a first Read operation at two different Groups in a HiNAND2 array according to another specific embodiment of the present invention. As shown, a simplified HiNAND2 array that has been reduced to only two Groups such as Group 1 and Group 2 is used as an example for simplified explanation of the embodiment.

The first Read is executed on one selected Block of one selected Segment in Group 1 occupying both 2N bottom-level metal1 LBL capacitors and N top-level metal2 GBL capacitors that are connected to the top 2N-bit Data Register. But the second Read is executed next on one selected Block of one selected Segment in Group 2 occupying another 2N bottom-level metal1 LBL lines and N top-level metal2 GBL lines that are connected to the bottom 2N-bit Data Register concurrently by turning off the GBL-divided transistor of MGBL with a gate signal DIV_EN[1] being grounded. Thus, two Read operations can be performed concurrently in two different Groups but same NAND plane without resulting in any data bus contention issue. Note, the connection from each pair of 2N metal1 LBL lines to each of N metal2 GBL lines is implemented by connecting one pair of Odd and Even metal1 LBL lines to one metal2 GBL line.

A first SEG[1] signal is set to Vdd to make corresponding Segment-select transistor in conduction state for connecting only a first metal1 LBL capacitor in Segment 1 to top-level metal2 GBL capacitor. Other signals SEG[2], SEG[3], and SEG[4] are set to Vss for isolating the remaining Segments' metal1 LBL capacitors from the first selected metal1 LBL capacitor and the top-level metal2 GBL capacitor so that the page data charges read out from the first metal1 LBL capacitor would not be diluted by other Segments' capacitors because all Segments share common metal2 GBL capacitor in a same Group.

FIG. 11C shows another preferred data flow for concurrently performing a second Read operation along with a first Read operation at a same Group in a HiNAND2 array according to another specific embodiment of the present invention. As shown, the first Read is executed on one of selected Block of one selected Segment in Group 1 using the top-level metal2 GBL line that is connected to top Data Register. But the second Read is also preferably executed next on another selected Block of different selected Segment but in same Group 1 using the same top-level metal2 GBL line. Thus these two operations have to be separately performed in two different time slots to avoid bus contention issue.

In order to avoid the charge dilution to affect the read signal of the first Read and second Read operation, the gate signal DIV_EN[1] of the GBL-divided transistor MGBL between Group 1 and Group 2 is grounded. Thus, the two Read operations can be performed with a time delay less than 1 µs in the same Group 1 in a same NAND plane without resulting in any data bus contention issue. Since time delay between two operations in a same Group is less than 1 µs, it can be considered substantially being performed concurrently and is transparent to system.

FIG. 12A shows two tables of bias conditions of DIV_EN for performing a second Program operation while performing a first Read operation at different Groups along with a simplified HiNAND2 array according to an alternative specific embodiment of the present invention. As shown, the simplified HiNAND2 array is associated with one pair of 2N-bit Data Register and 2N-bit Cache Register placed respectively on top and bottom of the array connected to 4 vertical groups such as Group 1, Group 2, Group 3 and Group 4. Two tables next to the simplified HiNAND2 array show how to connect the selected Groups to either top or bottom Data Registers through turning-on or turning-off the selected GBL-divided transistors MGBL by properly coupling DIV_EN signals to Vdd voltage or Vss. In this example, the HiNAND2 array is simplified to only four Groups divided by three GBL-divided transistors MGBL gated by three DIV_EN signals such as DIV_EN[1], DIV_EN[2], and DIV_EN[3], but the numbers of Groups and associated GBL-divided transistors and respective control gate signals are not limited to those as shown but merely for providing a simpler description without affecting the invented spirit.

In addition, one pair of Data Register and Cache Register termed as a SPB is preferably placed on either top or bottom of the HiNAND2 array and connected to four Groups such as Group 1, Group 2, Group 3, and Group 4 by four metal2 broken-GBL lines or capacitors. This embodiment can be considered to be another example differed from FIG. 11A. If Group 4 is selected for the first Read and is intended to be connected to the bottom SPB for sensing, then three remaining Groups of Group 1, Group 2, and Group 3 can be selected for a second concurrent Read operation connected to either top or bottom SPB. The corresponding gate signals for the group selection are indicated in the last three rows of the bottom table in FIG. 12A.

For example, a first Read in Group 4 connected to bottom SPB is associated with a second Read in Group 2 connected to top SPB. In this case, DIV_EN[3] signal is set to 0=Vss to turn off GBL-divided transistor MGBL between Group 3 and Group 4 to allow the 4th metal2 broken-GBL capacitor in Group 4 directly connect to the bottom SPB only without being affected or diluted by the third metal2 broken-GBL line and capacitor in Group 3. Next, DIV_EN[2] is set to 0=Vss is to disconnect the second metal2 broken-GBL line in Group 2 from the third metal2 broken-GBL line in Group 3.

In addition, DIV_EN[1] is set to 1=Vdd to connect the metal2 GBL capacitor to the first metal2 GBL capacitor so that Group 2 can be connected to the top SPB without being diluted by the third metal2 GBL capacitor for superior charge-sharing sensing scheme like DRAM. In this case, the connection of the first Read in Group 4 to the bottom SPB takes only one GBL capacitor but the connection of the second Read at Group 2 to the top SPB takes two GBL capacitors. Thus the second Read signal would need 2-fold GBL capacitors' loading more than the first Read signal with only one GBL capacitor. Thus, the second Read would have more charge dilution during reading out. In summary, this is to show the two preferred Read operations can be performed independently and concurrently without having data contention issue in the same 2D or 3D NAND plane. The remaining combinations of connections in the top table and the bottom table of FIG. 12A can be referred to above descriptions associated with FIG. 11A. Thus, the descriptions are skipped here for simplicity.

FIG. 12B shows a preferred data flow for concurrently performing a second Program operation along with a first Read operation at two different Groups in a HiNAND2 array according to another alternative specific embodiment of the present invention. In this example, the HiNAND2 array has been simplified to only two groups such as Group 1 and Group 2. The first Read is executed on one selected Block occupying one metal1 LBL capacitor of one selected Segment and also occupying the top metal2 GBL line capacitor to connect to top Data Register with GBL-divided transistor gate signal DIV_EN being grounded to isolate metal2 GBL capacitor of Group 1 from metal2 GBL capacitor of Group 2 to reduce the DRAM-like charge-sharing dilution in read page data from Group 1.

But the new second Program is selected to be executed next on one selected Block of one selected Segment in Group 2 using the bottom metal2 GBL and metal1 LBL line through the Segment-selected transistor with its gate SEG[5] coupled to a voltage ≥Vdd to the bottom Data Register concurrently by turning off the GBL-divided transistor MGBL with a gate signal DIV_EN[1] being grounded. Thus, two different operations can be performed concurrently in different Segments but in a same NAND plane without resulting in any data bus contention issue. The bias conditions for this preferred operation comply with the preferred set of bias conditions as shown in FIG. 12A.

FIG. 12C shows a preferred data flow for concurrently performing a second Program operation along with a first Read operation at a same Group in a HiNAND2 array according to another alternative specific embodiment of the present invention. This shows another example of the preferred data flow diagram of HiNAND2 operation. In this example, it shows a simplified HiNAND2 array that has been reduced to only two groups such as Group 1 and Group 2 for simplified explanation of the preferred HiNAND2 concurrent Program/

Read operations. Furthermore, each Group is reduced to be comprised of only four Segments.

In the specific embodiment, the first operation is a Read operation, which is executed on one of selected Block of one selected Segment in Group 1 occupying the bottom-level metal1 LBL line as well as the top-level metal2 broken-GBL line to connect to the top Data Register. The first Read operation in Group 1 is carrying out one page 2N-bit data upward from the metal1 LBL line through a Segment-select NMOS transistor to the first metal2 broken-GBL line and to the top SPB with DIV_EN[1] being set to Vss to isolate it from the GBL capacitor of Group 2. In this way, the read out data voltage level from the Group 1 would not be severely diluted by another metal2 capacitor in Group 2 for more reliable sensing at SPB.

When a command of second Program operation occurs at the different Blocks but in the same Segment, then the program data sent from SPB to determine the discharging or retaining charges of the local metal1 LBL lines cannot be sent through the same metal2 broken-GBL line and metal1 LBL line in last selected Segment in Group 1 at the same time.

In an embodiment, the first read data sent to SPB from a metal1 LBL line to a metal2 GBL line takes less than 1 μs latency because of the DRAM-like charge-sharing sensing scheme, which is negligible as compared the whole SLC Read operation of 25 μs, or 75 μs for a whole MLC reading. Even each Read operation is divided into five iterative steps of 5 μs that is still 5-fold more than the charge-sharing delay. Thus, the 2nd program-data sent by SPB should be controlled after the period while the first data still occupying LBL and GBL in a first Group. This time delay is relatively short, thus the second Program operation can be substantially considered to be executed concurrently and is transparent to system. The bias conditions of this preferred concurrent operation comply with the preferred set of bias conditions as shown in FIG. 12A.

FIG. 13A is a circuit diagram of one simplified Segment of a 2D HiNAND2 array with four broken-LBL lines configured to allow the performance of the preferred concurrent Read, Program, Program-Verify, and Erase-Verify operations in a same plane or different planes according to an embodiment of the present invention. As shown, Each set of 2N broken metal1 LBL lines of the 2D HiNAND2 array are connected to two sets of 2N major NMOS transistors such as 2N MDBLs transistors and 2N MDB transistors with their common gates tied to PRE[1] and DI[1] respectively. 2N MDBLs transistor drain nodes are connected to corresponding 2N metal1 LBL lines such as LBL[1] to LBL[2N], with their common source nodes being connected to one horizontal metal0 LBLps power line per K Blocks. Each Segment can have more LBLps lines such as LBLps[1] to LBLps[4]. Each MDBLs transistor drain node within said A Blocks is connected one corresponding metal1 LBL line or capacitor within the corresponding Segment (not shown) and the corresponding source node is connected the lower metal0 LBLps power/Vss line. In the followings, the explanations are only addressed on 2D NAND array for simplicity of the description but it should be taken to 3D NAND array as well. In other words, when 2D is referred below, it should be also regarded to refer to 3D as well.

FIG. 13B shows three tables that contain the preferred bias voltages for respective control signals such as DI, PRE, and power lines of LBLps for the preferred concurrent operations in multiple Segments in multiple Groups of the simplified 2D HiNAND2 array of FIG. 13A and the preferred 3D HiNAND2 array as shown in FIGS. 3A-3E in according to an embodiment of the present invention. As shown in respective three tables, three preferred operations are in accordance with the preferred 2D HiNAND2 array (or 3D HiNAND2 array), Block-decoder, Segment-decoder, PRE and DIV circuits in this present invention. The same techniques can also be applied to both vertical-channel type and vertical-gate type 3D NAND arrays for the preferred multiple key NAND operations performed concurrently in same or different 2D or 3D NAND planes.

In an embodiment, a longer metal1 LBL capacitor that comprises at least four shorter metal1 broken-LBL lines is large enough for Read, Program-Verify, and Erase-Verify operations. These four shorter metal1 broken-LBL lines can be used as one combined local metal1 LBL capacitor within a Group by turning on all three MDBLp transistors with gates signals DI[1], DI[2], and DI[3] being coupled to H1'=Vread+VT+ΔV, where ΔV=1V as a margin voltage for fully passing the $V_{inhibit}$ voltage from the selected LBLps line to the selected broken metal1 LBL lines without leakage.

In another embodiment, the Read operation needs to combine four broken-LBL capacitors into a larger capacitor is because the HiNAND2 array uses a DRAM-like charge-sharing sensing scheme with a preferred Multiplier (not shown) to amplify the detected 2N-bit page data pattern from each Page Read. If only using one smaller metal1 broken-LBL capacitor to store the data pattern and then dumped to each corresponding larger metal1 broken-GBL capacitor to connect to the SPB, the precharged $V_{inhibit}$ voltage for each metal1 broken-LBL capacitor will be diluted to a very weak signal in corresponding GBL capacitor, thus the signal become too weak to be detectable by the corresponding Multiplier or SA in SPB.

Unlike the Read operation described above, the Program operation need not to take four longer metal1 LBL lines (with combined capacitors as one) or even one shorter LBL capacitor because one of the preferred Program-Inhibit and Vss voltages of Page data are stored in the channels of 64 NAND cells of selected Block as one embedded capacitor without occupying any metal1 LBL lines or capacitors. In this case, all metal1 LBL capacitors can be used for any second operations without a bus contention concern once the Page Program data voltages are locked into the channel regions of 64 NAND strings and all metal1 LBL capacitors are released for the next operation that might use the local metal1 LBL capacitors in Read, Program-Verify, or Erase-Verify operations. The following preferred operations in three tables are set up to comply with the guidelines explained above.

The three preferred operations are explained below.

1) A $2^{nd}$ pre-charging LBLs while $1^{st}$ Read operation:
  a) The 2nd and 1st LBLs have to be in different Segment.
  b) For new Read, it needs to combine 4 smaller metal1 LBL capacitors into one bigger LBL read capacitor. Thus, setting all DI[1]=DI[2]=DI[3]=H1 to combine four Blocks.
  c) To precharge all LBL[1]= . . . =LBL[2N]=H1, then all LBLps[1]=LBLps[2]=LBLps[3]=H1 and all PRE[1]=PRE[2]=PRE[3]=PRE[4]=H1' to fully pass the voltage from all four LBLps to all 2N LBL lines.

2) DI setup for pre-charging LBLs while a first Program operation: Since no 2N LBL lines are being occupied in the first Program operation, thus all selected 2N LBL metal1 lines of A Blocks can be precharged with a $V_{inhibit}$ in 1-cycle in same K Blocks. Therefore four metal1 LBL are selected as one combined capacitor.
  a) The 2nd and 1st LBLs lines have to be in different A-Block in different Segments.
  b) For new Read, it needs to use a 4 combined metal LBL1 capacitor as one LBL read capacitor. Thus, setting all DI[1]=DI[2]=DI[3]=H1 to combine 4 Blocks.

c) To precharge all LBL[1]= ... =LBL[2N]=H1, then all LBLps[1]=LBLps[2]=LBLps[3]=H1 and all PRE[1]=PRE[2]=PRE[3]=PRE[4]=H1' to fully pass the voltage from all four LBLps to all 2N LBL lines.

3) DI biased conditions for Erase operation.

In this case, all lines of PRE[1] to PRE[4], DI[1] to DI[3], and LBLps[1] to LBLps[4] are preferably set to be floating Vss initially to avoid the electric short from happening when HiNAND2 array's common triple P-well (TPW) is ramped to an erase voltage of 20V. As a consequence, all Block's transistors of MDBLs and MDBL can be protected without inducing gate breakdown during the erase HV stress operation between their poly2 gates and transistors' channels because their gates would be coupled to the same 20V voltage of TPW during Erase if there are no leakage paths in DIV and PRE lines.

Note, since Erase operation, a 20V is applied to the TPW that is under the whole HiNAND2 plane, thus the second operations cannot be performed on the same NAND plane that is carrying out the Erase operation with the same TPW voltage.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A NAND memory array with a 2-level metal broken-BL hierarchical architecture for performing continuous and concurrent multiple-WL Program, Read, Erase, Erase-Verify, and Program-Verify operations in dispersed Blocks in a same or multiple different NAND planes, the NAND memory array comprising:

a plane of NAND array cells made of a plurality of Blocks having 2N columns in Y direction and a plurality of rows in X direction, the plane being built on a common Triple-Pwell (TPW) region over a deep-Nwell region on a P-substrate, the X direction being perpendicular to the Y direction, the plane including J Groups in the Y direction, each Group including L Segments in the Y direction, each Segment including m sub-Segments in the Y direction, each sub-Segments including K Blocks in the Y direction, each Block including M rows or 2N strings of NAND array cells in the X direction capped respectively by a first row of 2N string-select devices and a second row of 2N string-select devices, each of M rows of NAND array cells forming a page having a common gate connected to a word line (WL), the first/second row of 2N string-select devices having a common gate line coupled to a first/second gate signal, a source node of the second row of 2N string-select devices being connected to a common source line, N being a multiplier of a byte, J, L, m, and K being properly selected integer numbers including 4, 8, 16, 32, 64, 128;

N global bit lines (GBLs) laid in parallel extended the full plane in the Y direction as top-level metal lines with a first pitch;

J−1 rows of N GBL-divided devices disposed in the X direction with a common gate line coupled to a third gate signal and configured to respectively divide each GBL to J broken-GBLs, each broken-GBL being associated with one column of NAND array cells in one Group connecting all L Segments therein;

2N local bit lines (LBLs) laid in parallel extended to all strings in one Segment in the Y direction as bottom-level metal lines with a second pitch below the top-level metal lines;

a first row of N first Segment-select devices disposed for each Segment of each Group and configured to respectively connect each broken-GBL in a Group to an odd number LBL associated with a selected Segment of the Group, the first row of N first Segment-select devices having a common gate line coupled to a fourth gate signal;

a second row of N second Segment-select devices disposed next to each first row of N first Segment-select devices and configured to respectively connect each said broken-GBL in the Group interleavingly to a next even number LBL associated with the selected Segment of the Group, the second row of N second Segment-select devices having a common gate line coupled to a fifth gate signal;

m−1 rows of 2N LBL-divided devices disposed in the X direction with a common gate line coupled to a sixth gate signal and configured to respectively divide each LBL to m broken-LBLs, each broken-LBL being associated with one column of NAND array cells in one sub-Segment connecting all K Blocks therein and configured to connect respectively to a drain node of the first string-select device of one string of NAND array cells in each of K Blocks of said sub-Segment; and a row of 2N LBL-precharge devices disposed in the X direction with a common gate line coupled to a seventh gate signal and configured to respectively connect each broken-LBL to a common dedicated metal power line for each sub-Segment of each Segment of each Group;

wherein the first, second, third, fourth, fifth, sixth, and seventh gate signals and all WL voltages controlled by corresponding decoders with latch designs and one common dedicated metal power line associated with 2N broken-LBLs per sub-Segment or 2N LBLs per Segment are configured for performing multi-task concurrent/pipeline operations of multiple-WL or partial-WL Program in dispersed Blocks flexibly based on any sub-Segment and of multiple-WL or partial-WL Read, Erase-Verify, and Program-Verify in dispersed Blocks flexibly based on any Segment in a same plane or multiple different planes with multiple-fold performance improvements.

2. The NAND memory array of claim 1 wherein each GBL-divided device, each LBL-divided device, each string-select device, and each LBL-precharge device is a same type NMOS 1-poly medium-high-voltage (MHV) transistor.

3. The NAND memory array of claim 1 wherein M is selected from 8, 16, 32, 64, or other integer numbers depending on array density and N is an integer greater than 2 for defining size of a page in any Block of the plane.

4. The NAND memory array of claim 1 wherein each LBL forms a first metal parasitic capacitor serving as an 1-bit Segment dynamic page buffer (DPB) and each broken-LBL forms a second metal parasitic capacitor serving as an 1-bit sub-Segment DPB and a row of 2N broken-LBLs forms a 2N-bit DPB associated with the sub-Segment without taking additional peripheral area from a N-bit static page buffer (SPB) placed at either ends of the plane of NAND array cells.

5. The NAND memory array of claim 4 wherein the first metal parasitic capacitor comprises a first capacitance programmably expandable from a second capacitance of the second metal parasitic capacitor by connecting one or more sub-Segments by one or more LBL-divided devices in a selected Segment, the first capacitance of 1-bit Segment DPB being one or more up to m folds of the second capacitance of 1-bit sub-Segment DPB.

6. The NAND memory array of claim 4 wherein the 2N-bit DPB is configured to store charges of Vss or $V_{inhibit}$=7V voltages corresponding to one selected from 1) 2N-bit of temporary page program data defined by Vss=0V or Vdd loaded interleavingly in two cycles through corresponding N GBLs from the N-bit SPB, 2) 2N-bit of temporary $V_{inhibit}$ voltages precharged from each common dedicated metal power line per sub-Segment, and 3) 2N-bit of temporary transient page program data defined by the Vss or $V_{inhibit}$ in accordance with sensed threshold voltage levels from a selected page of 2N-bit NAND array cells during iterative Program-Verify and Erase-Verify operations or Read operation.

7. The NAND memory array of claim 6 wherein multiple 2N-bit page program data from the N-bit SPB are stored and locked sequentially in two cycles each page into multiple selected 2N-bit DPBs respectively associated with multiple sub-Segments in multiple selected Segments by properly setting at least corresponding third, fourth, fifth, sixth, and seventh gate signals to allow a corresponding broken-GBL released for next operation in different Segment without any data contention for performing Segment-based multiple-WL concurrent and pipeline NAND operations.

8. The NAND memory array of claim 7 wherein the multiple 2N-bit page program data are configured to be stored and locked in the channel regions of selected 2N-bit strings of NAND array cells in corresponding multiple selected Blocks within a sub-Segment by properly setting at least corresponding first, second, sixth, and seventh gate signals to allow a corresponding broken-LBL released for next operation in different Blocks in a same Sub-Segment without any data contention for performing Block-based multiple-WL concurrent and pipeline NAND operations.

9. The NAND memory array of claim 8 wherein the Vss and $V_{inhibit}$ voltages associated with each of the multiple 2N-bit page program data are stably stored in the channels of the selected 2N-bit strings of NAND array cells after ramping up corresponding WLs' voltages to Vpgm of 20V and Vpass of 10 V before setting the corresponding first gate signals to Vss=0V to turn off corresponding 2N first string-select devices to isolate the selected 2N strings of NAND array cells from the corresponding second metal parasitic capacitors formed by the 2N broken-LBLs to release the corresponding broken-LBLs for next concurrent and pipeline NAND operation.

10. The NAND memory array of claim 1 wherein the first pitch of all N GBLs is at least twice of the second pitch of 2N LBLs.

11. The NAND memory array of claim 1 wherein the multi-task concurrent/pipeline operations includes a first operation selected from Program, Read, Program-Verify, and Erase-Verify initiated at a first time, executed in a first time span, and ended in a second time and at least a second operation selected from Program, Read, Program-Verify, and Erase-Verify initiated at a third time, executed in a second time span, and ended in a fourth time, the third time being the same or later than the first time, the second time span being partially overlapped with the first time span, the fourth time being earlier than, the same, or later than the second time, depending on task.

12. The NAND memory array of claim 11 wherein the first operation is a Program operation on a full page 2N-bit of NAND array cells in a selected Block of a selected sub-Segment of a selected Segment of a selected Group, the second operation is a Program operation on another full page 2N-bit of NAND array cells in a different Block of a different sub-Segment of the same or a different Segment of the same or a different Group.

13. The NAND memory array of claim 11 wherein the first operation is a Read, or Program-Verify, or Erase-Verify operation on a full page 2N-bit of NAND array cells in a selected Block of a selected sub-Segment of a selected Segment of a selected Group, the second operation is any NAND operation on another full page 2N-bit of NAND array cells in a different Block of a different sub-Segment of a different Segment of the same or a different Group.

14. The NAND memory array of claim 1 wherein the N-bit GBLs are directly coupled with a first N-bit static page buffer and a second N-bit static page buffer respectively located at two ends of the plane of NAND array cells providing 2-fold flexibility enhancement in sensing signals during N-bit-based concurrent charge-sharing, each bit charge-sharing being carried out between a small metal parasitic capacitor associated with a selected LBL and a large metal parasitic capacitor associated with one or more broken-GBLs.

15. The NAND memory array of claim 1 wherein the bottom-level N-bit odd number LBLs and N-bit even number LBLs per N-bit top-level metal2 GBLs are configured to load a whole page of 2N-bit page program data in two cycles including loading the odd number N-bit half-page program data patterns and the even number N-bit half-page program data patterns from associated a N-bit static page buffer via N-bit GBLs.

16. The NAND memory array of claim 1 wherein the corresponding decoders include a block decoder circuit for setting the first gate signal and the second gate signal and the M WL voltages, a first Segment decoder circuit for setting the fourth gate signal and the second Segment decoder circuit for setting the fifth gate signal, a Group decoder circuit for setting the third gate signal, a DI decoder circuit for setting the sixth gate signal, and a precharge generator circuit for setting the seventh gate signal.

17. The NAND memory array of claim 16 wherein the first gate signal and the second gate signal and the M WL voltages associated with a currently selected block are respectively set to predetermined bias voltages of 0V or of Vdd up to about 20V generated by respective M+2 bus lines controlled by the block decoder circuit through a corresponding pump circuit.

18. The NAND memory array of claim 17 wherein the block decoder circuit comprises a latch circuit coupled to a status reporter circuit and configured to latch the predetermined bias voltages into respective poly parasitic line capacitors associated with corresponding common gate lines of the first string-select devices and the second string-select devices and the M WLs of NAND array cells so that the M+2 bus lines can be released for sending the predetermined bias voltages to corresponding common gate lines and the M WLs associated with a next selected block.

19. The NAND memory array of claim 18 wherein the latch circuit comprises two invertors configured to enable a pre-decoder output associated with one or more block addresses to control the pump circuit for charging respective predetermined bias voltages to the first gate signal, the second gate signal, and the M WLs, or disable a pre-decoder output to control the pump circuit for locking the charged bias voltages to respective poly parasitic line capacitors, or to enable a pre-decoder output to control the pump circuit for discharging the predetermined bias voltages stored in the respective poly parasitic line capacitors to the respective M+2 bus lines.

20. The NAND memory array of claim 19 wherein the status report circuit comprises one transistor gated to the pre-decoder output and another transistor gated to a latch node of the latch circuit, the status report circuit being configured to sense the high/low status of the latch circuit to report the block address of the currently selected block with an unfinished concurrent/pipeline operation including Read, Program, Program-Verify, and Erase-Verify.

21. The NAND memory array of claim 20 wherein the pump circuit comprises a first LV input coupled to a node driver to receive an enable or disable signal from the latch circuit and the pre-decoder output, a second clock input coupled to a clock pulse through a NAND device and an inverter coupled with two capacitors, a third HV input coupled with three HV transistors, and an output control gate of M+2 HV transistors for controlling passage of the predetermined bias voltages from the M+2 bus lines to respective common gate lines of the first string-select devices and the second string-select devices and the M WLs.

22. The NAND memory array of claim 21 wherein all the corresponding decoders are configured to adjust the first, second, third, fourth, fifth, sixth, and seventh gate signals and all selective WL voltages for performing multiple random page-based Erase operations concurrently for one or more up to M pages per block in multiple dispersed blocks arbitrarily selected from multiple NAND planes, each page-based Erase operation in one selected block being carried out by firstly floating the first gate signal and the second gate signal and all selective WLs to 0V followed by secondly raising the Triple-Pwell (TPW) region and the deep-Nwell region with a same erase voltage, thirdly setting the selected WLs to Vss and remaining unselected WLs to the same erase voltage by applying the erase voltage plus a threshold level of the string-select device to the output control gate to start erase with a predetermined duration, and fourthly locking the selected WLs to Vss and remaining unselected WLs and the first gate signal and the second gate signal to the same erase voltage by grounding the output control gate to release the M+2 bus lines of the block decoder circuit for further setting and locking WL voltages for a next select block.

23. The NAND memory array of claim 22 wherein the one or more up to M pages per block comprise same or different addresses within each block in multiple dispersed blocks and comprise same or different number of pages within each block in multiple dispersed blocks.

24. The NAND memory array of claim 21 wherein the block decoder further comprises a first LV control input, a second LV control input, a third LV control input, and a fourth LV control input, the first LV control input coupled to the pre-decoder output for setting a first latch node of the latch circuit, the second LV control input coupled to the pre-decoder output for setting a second latch node of the latch circuit, the third LV control input for combining the latch circuit output and the pre-decoder output to set the pump circuit, the fourth LV control input coupled to the second latch node without coupling to the pre-decoder output for resetting the latch circuit.

25. The NAND memory array of claim 24 wherein the block decoder circuit is configured to adjust the predetermined bias voltages for the first gate signal, the second gate signal, and the M WLs in multiple steps at least for performing at least a second Read operation at the currently selected block of a selected Segment in a self-timed concurrent/pipeline manner while a first operation being performed for Read, or Program, or Program-Verify, or Erase-Verify in another selected block in the same or a different Segment, the multiple steps including initializing at least the second latch node to Vss=0V by applying Vss to the second LV control input, an one-shot Vdd=1.8V pulse to the fourth LV control input, Vss to the first LV control input, and Vdd to the third LV control input to make the M WLs at low voltage states either at Vdd=1.8V or Vss=0V and the first gate signal, the second gate signal, and the M WLs floating at Vss;

pre-charging the 2N LBLs associated with the currently selected block to a median-high voltage $V_{inhibit}$~7V from the common dedicated metal power line by applying ~8V to the seventh gate signal while keeping the first gate signal, the second gate signal, and the M WLs floating at Vss;

setting the first gate signal and the second gate signal to Vdd and the M WLs to respective WL voltages for performing the second Read operation by at least switching the third LV control input to Vss and enabling the pump circuit for providing the predetermined bias voltages from the M+2 bus lines;

latching Vdd to the first gate signal and the second gate signal and the WL voltages set in previous step to the M WLs by at least switching the third LV control input to Vdd to store corresponding charges to respectively poly parasitic line capacitors to allow discharging of any on-cells while retaining charges of any off-cells in a page of the selected block that are shared between corresponding LBLs and associated GBLs;

locking the node driver to prevent any inadvertent operation from the M+2 bus lines of the pump circuit on the latched status of the first gate signal, the second gate signal, and the M WLs by at least applying an one-shot Vdd pulse to the first LV control input while keeping the second LV control input and the fourth LV control input to Vss and the third LV control input to Vdd;

unlocking the node driver by applying an one-shot Vdd pulse to the second LV control input while keeping the first LV control input and the fourth LV control input at Vss and the third LV control input at Vdd; and discharging the predetermined bias voltages stored in the poly parasitic line capacitors associated with respective common gate lines of the first string-select devices and the second string-select devices and the M WLs to the M+2 bus lines as the second Read operation is finished triggered by a falling-edge of an one-shot low-voltage pulse at the third LV control input to induce a rising-edge of an one-shot low-voltage pulse at node driver output and a rising-edge of an one-shot high-voltage pulse at the output control gate of the pump circuit while keeping the first LV control input, the second LV control input, and the fourth LV control input to Vss.

26. The NAND memory array of claim 24 wherein the block decoder circuit is configured to adjust the predetermined bias voltages for the first gate signal, the second gate signal, and the M WLs in multiple steps for performing at least a second Program operation at the currently selected block of a selected sub-Segment of a selected Segment in a self-timed concurrent/pipeline manner while a first operation being performed for Read, or Program, or Program-Verify, or Erase-Verify in another selected block of a different Sub-Segment of the same or different Segment, the multiple steps including initializing at least the second latch node to Vss=0V by applying Vss to the second LV control input, one-shot Vdd=1.8V pulse to the fourth LV control input, Vss to the first LV control input, and Vdd to the third LV control input to make the M WLs at low voltage states either at Vdd=1.8V or Vss=0V and the first gate signal, the second gate signal, and the M WLs floating at Vss;

pre-charging the 2N broken-LBLs associated with the currently selected block to a median-high voltage $V_{inhibit}$~7V from the common dedicated metal power line by applying ~8V to the seventh gate signal while keeping the first gate signal, the second gate signal, and the M WLs floating at Vss;

setting a desired set of voltages with Vpass=10V at the first gate signal, Vss at the second gate signal, and a desired program voltage Vpgm of about 20V or program-inhibit voltages of about 7V at the M WLs for performing the second Program operation by at least switching the third LV control input to Vss and enabling the pump circuit for providing the predetermined bias voltages from the M+2 bus lines;

latching the desired set of voltages for the first gate signal, the second gate signal, and the M WLs by at least switching the third LV control input to Vdd to respectively poly parasitic line capacitors to allow discharge of programmed cells from corresponding broken-LBLs through associated GBLs;

locking the node driver to prevent any inadvertent operation from the M+2 bus lines of the pump circuit on the latched status of the first gate signal, the second gate signal, and the M WLs by at least applying an one-shot Vdd pulse to the first LV control input while keeping the second LV control input and fourth LV control input to Vss and the third LV control input to Vdd;

unlocking the node driver by applying an one-shot Vdd pulse to the second LV control input while keeping the first LV control input and the fourth LV control input at Vss and the third LV control input at Vdd; and discharging bias voltages stored in the poly parasitic line capacitors associated with respective control gate lines of the first string-select devices and the second string-select devices and the M WLs to the M+2 bus lines as the second Program operation is finished triggered by an falling-edge of an one-shot low-voltage pulse at the third LV control input to induce a rising-edge of an one-shot low-voltage pulse at node driver output and a rising-edge of an one-shot high-voltage pulse to the control node of the pump circuit while keeping the first LV control input, the second LV control input, and the fourth LV control input to Vss.

27. The NAND memory array of claim 16 wherein the fourth/fifth gate signal associated with a currently selected Segment is set to a predetermined bias voltage of 0V for disconnecting corresponding LBLs with corresponding GBLs or set to Vdd up to about 10V for connecting corresponding LBLs with corresponding GBLs, the predetermined bias voltage being generated by a bus line controlled by the first/second Segment decoder circuit through a corresponding pump circuit.

28. The NAND memory array of claim 27 wherein the first/second Segment decoder circuit comprises a latch circuit coupled to a status reporter circuit configured to latch the predetermined bias voltage into a poly parasitic line capacitor associated with the corresponding common gate line of the first/second row of the N first/second Segment-select devices associated with the currently selected Segment so that the bus line can be released for sending the predetermined bias voltage to another corresponding common gate line associated with another selected Segment.

29. The NAND memory array of claim 28 wherein the latch circuit comprises two invertors configured to enable a pre-decoder output associated with one or more Segment addresses to control the pump circuit for charging the predetermined bias voltage to either the fourth gate signal or the fifth gate signal and generating an address signal representing the currently-selected Segment to respective pre-decoder inputs of block decoder circuits associated with blocks within the selected Segment, and to disable the pre-decoder output for latching the charged bias voltage to corresponding poly parasitic line capacitor, and to enable the pre-decoder output to control the corresponding pump circuit for discharging the bias voltage stored in the corresponding poly parasitic line capacitor to the bus line.

30. The NAND memory array of claim 29 wherein the status report circuit comprises one transistor gated to the pre-decoder output, another transistor gated to the latch circuit, and a Segment-select signal output coupled to the pre-decoder output, the status report circuit being configured to sense the high/low status of the latch circuit to identify a Segment address from the pre-decoder output which is matched with the currently selected Segment so as to yield Vdd=1.8V when at least one block within the current Segment is unfinished in a corresponding operation or to yield Vss=0V when all blocks within the current Segment are finished in corresponding operations so the current Segment is re-opened for future operations.

31. The NAND memory array of claim 30 wherein the pump circuit comprises a first LV enable input coupled to a node driver to receive an enable or disable signal from the latch circuit and the pre-decoder output, a second clock input coupled to a clock pulse through a NAND device and an inverter coupled with two capacitors, a third HV supply input coupled with three HV transistors, and an output control gate for controlling passage of the predetermined bias voltage from the bus line to the fourth/fifth gate signal associated with corresponding common gate line of the N first/second Segment-select devices.

32. The NAND memory array of claim 31 wherein the first/second Segment decoder further comprises a first LV control input, a second LV control input, a third LV control input, and a fourth LV control input, the first LV control input coupled to the pre-decoder output for setting a first latch node of the latch circuit, the second LV control input coupled to the pre-decoder output for setting a second latch node of the latch circuit, the third LV control input for combining the latch circuit output and the pre-decoder output to set control input for the pump circuit, the fourth LV control input coupled to the second latch node without coupling to the pre-decoder output for resetting the latch circuit.

33. The NAND memory array of claim 32 wherein the first/second Segment decoder circuit is configured to adjust a bias voltage for the fourth/fifth gate signal in multiple steps at least for performing a second Read operation at the currently selected Segment of a Group in a self-timed concurrent/pipeline manner while a first operation being performed for Read, or Program, or Program-Verify, or Erase-Verify in another selected Segment of the same or different Group, the multiple steps including initializing at least the second latch node to Vss=0V by applying Vss to the second LV control input, one-shot Vdd=1.8V pulse to the fourth LV control input, Vss to the first LV control input, and Vdd to the third LV control input to make the bus line at a low voltage state either at Vdd=1.8V or Vss=0V and the fourth/fifth gate signal floating at Vss;

pre-charging the N odd/even-number LBLs associated with the currently selected Segment to a median-high voltage $V_{inhibit}$~7V from the common dedicated metal power line by applying ~8V to the seventh gate signal while keeping the fourth/fifth gate signal floating at Vss;

setting the fourth/fifth gate signal to Vpass=10V for the second Read operation by at least switching the third LV control input to Vss and enabling the pump circuit for providing corresponding bias voltage from the bus line;

latching the Vpass to the fourth/fifth gate signal by at least switching the third LV control input to Vdd to store corresponding charges to the poly parasitic line capacitor to allow discharging of any on-cells while retaining charges of any off-cells in a page of a selected block in the selected Segment and sharing between corresponding LBLs and corresponding GBLs;

locking the node driver to prevent any inadvertent operation from the bus line of the pump circuit on the latched status of the fourth/fifth gate signal for performing the second Read operation by at least applying an one-shot Vdd pulse to the first LV control input while keeping the second LV control input and fourth LV control input to Vss and the third LV control input to Vdd;

unlocking the node driver by applying an one-shot Vdd pulse to the second LV control input while keeping the first LV control input and the fourth LV control input at Vss and the third LV control input at Vdd; and discharging corresponding charges stored in the poly parasitic line capacitor associated with the common gate line of corresponding row of the N first/second Segment-select devices to the bus line as the second Read operation is finished triggered by a falling-edge of an one-shot low-voltage pulse at the third LV control input to induce a rising-edge of an one-shot low-voltage pulse at node driver output and a rising-edge of an one-shot high-voltage pulse at the output control gate of the pump circuit while keeping the first LV control input, the second LV control input, and the fourth LV control input to Vss.

34. The NAND memory array of claim 32 wherein the first/second Segment decoder circuit is configured to adjust a bias voltage for the fourth/fifth gate signal in multiple steps at least for performing a second Program operation at a currently selected sub-Segment of a selected Segment of a Group in a self-timed concurrent/pipeline manner while a first operation being performed for Read, or Program, or Program-Verify, or Erase-Verify in another sub-Segment of different Segment, the multiple steps including initializing at least the second latch node to Vss=0V by applying Vss to the second LV control input, one-shot Vdd=1.8V pulse to the fourth LV control input, Vss to the first LV control input, and Vdd to the third LV control input to make the bus line at a low voltage state either at Vdd=1.8V or Vss=0V and the fourth/fifth gate signal floating at Vss;

pre-charging the N odd/even-number broken-LBLs associated with the currently selected sub-Segment to a median-high voltage $V_{inhibit}$~7V from the common dedicated metal power line by applying ~8V to the seventh gate signal while keeping the fourth/fifth gate signal floating at Vss;

setting the fourth/fifth gate signal to Vdd for the second Program operation by at least switching the third LV control input to Vss and enabling the pump circuit for providing the predetermined bias voltage from the bus line;

latching Vdd for the fourth/fifth gate signal by at least switching the third LV control input to Vdd to store corresponding charges to the poly parasitic line capacitor to allow discharging of programmed cells from corresponding broken-LBLs to corresponding broken-GBLs associated with the same Segment;

locking the node driver to prevent any inadvertent operation from the bus line of the pump circuit on the latched status of the fourth/fifth gate signal for performing the second Program operation by at least applying an one-shot Vdd pulse to the first LV control input while keeping the second LV control input and fourth LV control input to Vss and the third LV control input to Vdd;

unlocking the node driver by applying an one-shot Vdd pulse to the second LV control input while keeping the first LV control input and the fourth LV control input at Vss and the third LV control input at Vdd; and discharging corresponding charges stored in the poly parasitic line capacitor associated with the common gate line of corresponding row of the N first/second Segment-select devices to the bus line as the second Program operation is finished triggered by a falling-edge of an one-shot low-voltage pulse at the third LV control input to induce a rising-edge of an one-shot low voltage pulse at node driver output and a rising-edge of one-shot high-voltage pulse at the output control gate of the pump circuit while keeping the first LV control input, the second LV control input, and the fourth LV control input to Vss.

35. The NAND memory array of claim 16 wherein the sixth gate signal associated with a currently selected Segment is set to a predetermined bias voltage of 0V or Vdd up to about 7V generated by a bus line controlled by the DI decoder circuit through a corresponding pump circuit.

36. The NAND memory array of claim 35 wherein the DI decoder circuit comprises a latch circuit configured to latch the predetermined bias voltage into a poly parasitic line capacitor associated with the common gate line of corresponding row of 2N LBL-divided devices for connecting/disconnecting two broken-LBLs in the currently selected Segment so that the bus line can be released for sending the predetermined bias voltage to another common gate line for connecting/disconnecting another two broken-LBLs in the currently selected Segment.

37. The NAND memory array of claim 36 wherein the latch circuit comprises two invertors configured to enable a pre-decoder output associated with one or more Segment addresses to control the pump circuit for charging the predetermined bias voltage to the sixth gate signal and to disable the pre-decoder output for latching the charged voltage to corresponding poly parasitic line capacitor.

38. The NAND memory array of claim 37 wherein the pump circuit comprises a first LV enable input coupled to an output port of a node driver to receive an enable or disable signal from the latch circuit and the pre-decoder output, a second clock input coupled to a clock pulse through a NAND device and an inverter coupled with two capacitors, a third HV input coupled with three HV transistors, and an output control gate for controlling passage of the predetermined bias voltage from the bus line to the sixth gate signal associated with corresponding common gate line of the 2N LBL-divided devices.

39. The NAND memory array of claim 38 wherein the DI decoder further comprises a first LV control input, a second LV control input, a third LV control input, and a fourth LV control input, the first LV control input coupled to the pre-decoder output for setting a first latch node of the latch circuit, the second LV control input coupled to the pre-decoder output for setting a second latch node of the latch circuit, the third LV control input for combining the latch circuit output and the pre-decoder output to set control input for the pump circuit, the fourth LV control input coupled to the second latch node without coupling to the pre-decoder output for resetting the latch circuit.

40. The NAND memory array of claim 39 wherein the DI decoder circuit is configured to adjust a bias voltage for the sixth gate signal for performing at least a second Read operation at the currently selected Segment of a Group in a self-timed concurrent/pipeline manner while a first operation being performed for Read, or Program, or Program-Verify, or Erase-Verify in another selected Segment of the same or different Group.

41. The NAND memory array of claim 39 wherein the DI decoder circuit is configured to adjust a bias voltage for the sixth gate signal for performing at least a second Program operation at a currently selected sub-Segment of a selected Segment in a self-timed concurrent/pipeline manner while a first operation being performed for Read, or Program, or Program-Verify, or Erase-Verify in another sub-Segment of different Segment.

42. The NAND memory array of claim 16 wherein the third gate signal is set to a predetermined bias voltage of 0V or Vdd from a bus line through an output of the Group decoder circuit.

43. The NAND memory array of claim 16 wherein the seventh gate signal is set to a predetermined bias voltage of 0V or Vdd up to 10V plus a margin of about 1V from a bus line through an output of the precharge generator circuit.

44. The NAND memory array of claim 43 wherein the precharge generator circuit is configured to use the predetermined bias voltage set for the seventh gate signal to control precharge/discharge up to 7V to/from the 2N LBLs associated with each selected Segment from/to the common dedicated metal power line in the beginning/ending of at least a second operation selected from Read, Program, Program-Verify, and Erase-Verify of a full-page of NAND array cells in a selected block of the selected Segment a self-timed concurrent/pipeline manner while a first operation selected from Read, Program, Program-Verify, and Erase-Verify of another full-page of NAND array cells being performed in another block of another Segment.

45. The NAND memory array of claim 44 wherein the common dedicated metal power line is configured to be grounded or to receive a median high $V_{inhibit}$ voltage of about 7V from an independent LBL power supply with substantially lower resistance than that through all strings of NAND array cells from a static page buffer located at an end of the plane.

46. A 3D NAND memory array with a 2-level metal broken-BL hierarchical architecture for performing continuous and concurrent multiple-WL Program, Read, Erase, Erase-Verify, and Program-Verify operations in dispersed Blocks in a same or multiple different NAND planes, the 3D NAND memory array comprising:

a plane of 3D NAND array cells made of a plurality of Blocks having 2N columns in a first direction and a plurality of rows in a second direction, the plane including J Groups in the first direction, each Group including L Segments, each Segment being divided to n sub-Segments, each sub-Segments including K Blocks, each Block including M rows or 2N strings of 3D NAND array cells in the second direction capped respectively by a first row of 2N string-select devices and a second row of 2N string-select devices, each of M rows of 3D NAND array cells gated with one word line (WL), the first/second row of 2N string-select devices having a common gate line coupled to a first/second gate signal, a source node of the second row of 2N string-select devices being connected to a common source line, N being a multiplier of a byte, J, L, n, and K being properly selected integer numbers including 4, 8, 16, 32, 64, 128, the first direction being perpendicular to the second direction, each string of 3D NAND array cells being laid in a third direction perpendicular to both the first direction and the second direction;

2N global bit lines (GBLs) laid in parallel as top-level metal lines extended the full plane in the first direction;

J–1 rows of 2N GBL-divided devices disposed in the first direction with a common gate line coupled to a third gate signal for respectively dividing each GBL to J broken-GBLs, each broken-GBL being associated with one column of 3D NAND array cells in one Group connecting all L Segments therein;

2N local bit lines (LBLs) laid in parallel extended to all 2N strings in one Segment in the first direction as bottom-level metal lines below the top-level metal lines;

a row of 2N Segment-select devices disposed for each Segment of each Group and configured to be commonly gated by a fourth gate signal and respectively connect 2N broken-GBLs in a Group to 2N LBLs associated with a selected Segment of the Group;

n–1 rows of 2N LBL-divided devices disposed in the first direction with a common gate line coupled to a fifth gate signal and configured to respectively divide each LBL to n broken-LBLs, each broken-LBL being associated with one column of 3D NAND array cells in one sub-Segment connecting all K Blocks therein and being configured to connect respectively to a drain node of the first string-select device of one string of 3D NAND array cells in each of K Blocks of said sub-Segment; and a row of 2N LBL-precharge devices being disposed in the second direction with a common gate line coupled to a sixth gate signal and configured to respectively connect 2N broken-LBLs to a common dedicated metal power line for each sub-Segment of each Segment of each Group;

wherein the first, second, third, fourth, fifth, sixth, gate signals and all WL voltages controlled by corresponding decoders with latch designs and one common dedicated metal power line associated with 2N broken-LBLs per sub-Segment or 2N LBLs per Segment are configured for performing multi-task concurrent/pipeline operations of multiple-WL or partial-WL Program in dispersed Blocks flexibly based on any sub-Segment and of multiple-WL or partial-WL Read, Erase-Verify, and Program-Verify in dispersed Blocks flexibly based on any Segment in a same plane or multiple different planes with multiple-fold performance improvements.

47. The 3D NAND memory array of claim 46 wherein each of the GBL-divided devices, the LBL-divided devices, and the LBL-precharge devices comprises one selected from a single NMOS 1-poly medium-high-voltage (MHV) transistor, a pair of NMOS 1-poly MHV transistors having a common gate connected in series, and a pair of NMOS 1-poly MHV transistors having a common gate connected by a third NMOS 2-poly MHV transistor in series, each of the first/second string-select devices comprises a NMOS 1-poly MHV transistor.

48. The 3D NAND memory array of claim 46 wherein M is an integer number depending on NAND design density and N is an integer greater than 2 for defining size of a page in any block of the plane.

49. The 3D NAND memory array of claim 46 wherein each LBL forms a first metal parasitic capacitor serving as an 1-bit Segment dynamic page buffer (DPB) and each broken-LBL forms a second metal parasitic capacitor serving as an 1-bit sub-Segment DPB and a row of 2N broken-LBLs forms a 2N-bit DPB associated with the plane of 3D NAND array cells without taking additional peripheral area from a 2N-bit static page buffer (SPB) placed at either ends of the NAND plane.

50. The 3D NAND memory array of claim 49 wherein the first metal parasitic capacitor comprises a first capacitance programmably expandable from a second capacitance of the second metal parasitic capacitor by connecting one or more sub-Segments by one or more LBL-divided devices in a selected Segment, the first capacitance of 1-bit Segment DPB being one or more up to m folds of the second capacitance of 1-bit sub-Segment DPB.

51. The 3D NAND memory array of claim 49 wherein the 2N-bit DPB is configured to store charges of Vss or $V_{inhibit}$=7V voltages corresponding to one selected from 1) 2N-bit of temporary page program data defined by Vss=0V or Vdd loaded interleavingly through corresponding 2N GBLs from the 2N-bit SPB, 2) 2N-bit of temporary $V_{inhibit}$ voltages precharged from each common dedicated metal power line per sub-Segment, and 3) 2N-bit of temporary transient page program data defined by the Vss or $V_{inhibit}$ in accordance with sensed threshold voltage levels from a selected page of 2N-bit 3D NAND array cells during iterative Program-Verify and Erase-Verify operations or Read operation.

52. The 3D NAND memory array of claim 51 wherein multiple 2N-bit page program data from the 2N-bit SPB are configured to be stored and locked sequentially per page into multiple selected 2N-bit DPBs respectively associated with multiple sub-Segments in multiple selected Segments by properly setting at least corresponding third, fourth, fifth, and sixth gate signals to allow a corresponding broken-GBL released for next operation in different Segment without any data contention for performing Segment-based multiple-WL concurrent/pipeline NAND operations.

53. The 3D NAND memory array of claim 52 wherein the multiple 2N-bit page program data are configured to be stored and locked in the channel regions of selected 2N-bit strings of 3D NAND array cells in selected pages of multiple selected Blocks within a sub-Segment by properly setting at least corresponding first, second, fifth, and sixth gate signals to allow a corresponding broken-LBL released for next operation in different Blocks in a same Sub-Segment without any data contention for performing Block-based multiple-WL concurrent/pipeline NAND operations.

54. The 3D NAND memory array of claim 53 wherein Vss and $V_{inhibit}$ voltages associated with each of the multiple 2N-bit page program data are stably stored in the channels of the selected 2N-bit strings of 3D NAND array cells after ramping up corresponding WLs' voltages to Vpgm of 20V and Vpass of 10V before setting the corresponding first gate signals to Vss=0V to turn off corresponding 2N first string-select devices to isolate the selected 2N strings of 3D NAND array cells from the corresponding second metal parasitic capacitors formed by the 2N broken-LBLs to release the corresponding broken-LBLs for next concurrent and pipeline NAND operation.

55. The 3D NAND memory array of claim 46 wherein the multi-task concurrent/pipeline operations includes a first operation selected from Program, Read, Program-Verify, and Erase-Verify initiated at a first time, executed in a first time span, and ended in a second time and at least a second operation selected from Program, Read, Program-Verify, and Erase-Verify initiated at a third time, executed in a second time span, and ended in a fourth time, the third time being the same or later than the first time, the second time span being partially overlapped with the first time span, the fourth time being earlier than, the same, or later than the second time, depending on task.

56. The 3D NAND memory array of claim 55 wherein the first operation is a Program operation on a full page 2N-bit of 3D NAND array cells in a selected Block of a selected sub-Segment of a selected Segment of a selected Group, the second operation is a Program operation on another full page 2N-bit of 3D NAND array cells in a different Block of a different sub-Segment of the same or a different Segment of the same or a different Group.

57. The 3D NAND memory array of claim 55 wherein the first operation is a Read or Program-Verify or Erase-Verify operation on a full page of 3D NAND array cells in a selected Block of a selected sub-Segment of a selected Segment of a selected Group, the second operation is any NAND operation on another full page of 3D NAND array cells in a different Block of a different sub-Segment of a different Segment of the same or a different Group.

58. The 3D NAND memory array of claim 46 wherein the 2N-bit GBLs are directly coupled with a first 2N-bit static page buffer and a second 2N-bit static page buffer respectively located at two ends of the plane of 3D NAND array cells providing 2-fold flexibility enhancement in sensing signals during 2N-bit-based concurrent charge-sharing, each bit charge-sharing being carried out between a small metal parasitic capacitor associated with a selected LBL and a large metal parasitic capacitor associated with one or more broken-GBLs.

59. The 3D NAND memory array of claim 46 wherein the corresponding decoders include a block decoder circuit for setting the first gate signal and the second gate signal and the M WL voltages, a Segment decoder circuit for setting the fourth gate signal, a Group decoder circuit for setting the third gate signal, a DI decoder circuit for setting the fifth gate signal, and a precharge generator circuit for setting the sixth gate signal.

60. The 3D NAND memory array of claim 59 wherein the first gate signal and the second gate signal and the M WL voltages associated with a currently selected block are respectively set to predetermined bias voltages of 0V or of Vdd up to about 20V generated by respective M+2 bus lines controlled by the block decoder circuit through a corresponding pump circuit.

61. The 3D NAND memory array of claim 60 wherein the block decoder circuit comprises a latch circuit coupled to a status reporter circuit and configured to latch the predetermined bias voltages into respective poly parasitic line capacitors associated with corresponding common gate lines of the first string-select devices and the second string-select devices and the M WLs of 3D NAND array cells so that the M+2 bus lines can be released for sending the predetermined bias voltages to corresponding common gate lines and the M WLs associated with a next selected block.

62. The 3D NAND memory array of claim 61 wherein the latch circuit comprises two invertors configured to enable a pre-decoder output associated with one or more block addresses to control the pump circuit for charging respective predetermined bias voltages to the first gate signal, the second gate signal, and the M WLs, or disable a pre-decoder output to control the pump circuit for locking the charged bias voltages to respective poly parasitic line capacitors, or to enable a pre-decoder output to control the pump circuit for discharging the predetermined bias voltages stored in the respective poly parasitic line capacitors to the respective M+2 bus lines.

63. The 3D NAND memory array of claim 62 wherein the status report circuit comprises one transistor gated to the pre-decoder output and another transistor gated to a latch node of the latch circuit, the status report circuit being configured to sense the high/low status of the latch circuit to report the block address of the currently selected block with an unfinished concurrent/pipeline operation including Read, Program, Program-Verify, and Erase-Verify.

64. The 3D NAND memory array of claim 63 wherein the pump circuit comprises a first LV input coupled to a node driver to receive an enable or disable signal from the latch circuit and the pre-decoder output, a second clock input coupled to a clock pulse through a NAND device and an inverter coupled with two capacitors, a third HV input coupled with three HV transistors, and an output control gate of M+2 HV transistors for controlling passage of the predetermined bias voltages from the M+2 bus lines to respective common gate lines of the first string-select devices and the second string-select devices and the M WLs.

65. The 3D NAND memory array of claim 64 wherein all the corresponding decoders are configured to adjust the first, second, third, fourth, fifth, and sixth gate signals and all selective WL voltages for performing multiple random partial-block Erase operations concurrently in multiple dispersed blocks arbitrarily selected from multiple NAND planes, each Erase operation in a selected block being carried out by at least setting selected WLs to Vss and remaining unselected WLs to the same erase voltage by applying the erase voltage plus a threshold level of the string-select device to the output control gate to start erase with a predetermined duration, then locking the selected WLs to Vss and remaining unselected WLs and the first gate signal and the second gate signal to the same erase voltage by grounding the output control gate to release the M+2 bus lines of the block decoder circuit for further setting and locking WL voltages for a next select block.

66. The 3D NAND memory array of claim 64 wherein the block decoder further comprises a first LV control input, a second LV control input, a third LV control input, and a fourth LV control input, the first LV control input coupled to the pre-decoder output for setting a first latch node of the latch circuit, the second LV control input coupled to the pre-decoder output for setting a second latch node of the latch circuit, the third LV control input for combining the latch circuit output and the pre-decoder output to set the pump circuit, the fourth LV control input coupled to the second latch node without coupling to the pre-decoder output for resetting the latch circuit.

67. The 3D NAND memory array of claim 66 wherein the block decoder circuit is configured to adjust the predetermined bias voltages for the first gate signal, the second gate signal, and the M WLs in multiple steps at least for performing at least a second Read operation at the currently selected block of a selected Segment in a self-timed concurrent/pipeline manner while a first operation being performed for Read, or Program, or Program-Verify, or Erase-Verify in another selected block in the same or a different Segment, the multiple steps including initializing at least the second latch node to Vss=0V by applying Vss to the second LV control input, an one-shot Vdd=1.8V pulse to the fourth LV control input, Vss to the first LV control input, and Vdd to the third LV control input to make the M WLs at low voltage states either at Vdd=1.8V or Vss=0V and the first gate signal, the second gate signal, and the M WLs floating at Vss;

pre-charging the 2N LBLs associated with the currently selected block to a median-high voltage $V_{inhibit}$~7V from the common dedicated metal power line by applying ~8V to the sixth gate signal while keeping the first gate signal, the second gate signal, and the M WLs floating at Vss;

setting the first gate signal and the second gate signal to Vdd and the M WLs to respective WL voltages for performing the second Read operation by at least switching the third LV control input to Vss and enabling the pump circuit for providing the predetermined bias voltages from the M+2 bus lines;

latching Vdd to the first gate signal and the second gate signal and the WL voltages set in previous step to the M WLs by at least switching the third LV control input to Vdd to store corresponding charges to respectively poly parasitic line capacitors to allow discharging of any on-cells while retaining charges of any off-cells in a page of the selected block that are shared between corresponding LBLs and associated GBLs;

locking the node driver to prevent any inadvertent operation from the M+2 bus lines of the pump circuit on the latched status of the first gate signal, the second gate signal, and the M WLs by at least applying an one-shot Vdd pulse to the first LV control input while keeping the second LV control input and the fourth LV control input to Vss and the third LV control input to Vdd;

unlocking the node driver by applying an one-shot Vdd pulse to the second LV control input while keeping the first LV control input and the fourth LV control input at Vss and the third LV control input at Vdd; and discharging the predetermined bias voltages stored in the poly parasitic line capacitors associated with respective common gate lines of the first string-select devices and the second string-select devices and the M WLs to the M+2 bus lines as the second Read operation is finished triggered by a falling-edge of an one-shot low-voltage pulse at the third LV control input to induce a rising-edge of an one-shot low-voltage pulse at node driver output and a rising-edge of an one-shot high-voltage pulse at the output control gate of the pump circuit while keeping the first LV control input, the second LV control input, and the fourth LV control input to Vss.

68. The 3D NAND memory array of claim 66 wherein the block decoder circuit is configured to adjust the predetermined bias voltages for the first gate signal, the second gate signal, and the M WLs in multiple steps for performing at least a second Program operation at the currently selected block of a selected sub-Segment of a selected Segment in a self-timed concurrent/pipeline manner while a first operation being performed for Read, or Program, or Program-Verify, or Erase-Verify in another selected block of a different Sub-Segment of the same or different Segment, the multiple steps including initializing at least the second latch node to Vss=0V by applying Vss to the second LV control input, one-shot Vdd=1.8V pulse to the fourth LV control input, Vss to the first LV control input, and Vdd to the third LV control input to make the M WLs at low voltage states either at Vdd=1.8V or Vss=0V and the first gate signal, the second gate signal, and the M WLs floating at Vss;

pre-charging the 2N broken-LBLs associated with the currently selected block to a median-high voltage $V_{inhibit}$~7V from the common dedicated metal power line by applying ~8V to the sixth gate signal while keeping the first gate signal, the second gate signal, and the M WLs floating at Vss;

setting a desired set of voltages with Vpass=10V at the first gate signal, Vss at the second gate signal, and a desired program voltage Vpgm of about 20V or program-inhibit voltages of about 7V at the M WLs for performing the second Program operation by at least switching the third LV control input to Vss and enabling the pump circuit for providing the predetermined bias voltages from the M+2 bus lines;

latching the desired set of voltages for the first gate signal, the second gate signal, and the M WLs by at least switching the third LV control input to Vdd to respectively poly parasitic line capacitors to allow discharge of programmed cells from corresponding broken-LBLs through associated GBLs;

locking the node driver to prevent any inadvertent operation from the M+2 bus lines of the pump circuit on the latched status of the first gate signal, the second gate signal, and the M WLs by at least applying an one-shot Vdd pulse to the first LV control input while keeping the second LV control input and fourth LV control input to Vss and the third LV control input to Vdd;

unlocking the node driver by applying an one-shot Vdd pulse to the second LV control input while keeping the first LV control input and the fourth LV control input at Vss and the third LV control input at Vdd; and discharging bias voltages stored in the poly parasitic line capacitors associated with respective control gate lines of the first string-select devices and the second string-select devices and the M WLs to the M+2 bus lines as the second Program operation is finished triggered by an falling-edge of an one-shot low-voltage pulse at the third LV control input to induce a rising-edge of an one-shot low-voltage pulse at node driver output and a rising-edge of an one-shot high-voltage pulse to the control node of the pump circuit while keeping the first LV control input, the second LV control input, and the fourth LV control input to Vss.

69. The 3D NAND memory array of claim 59 wherein the partial block in multiple dispersed blocks comprises different sizes and different addresses respectively in multiple dispersed blocks.

70. The 3D NAND memory array of claim 59 wherein the fourth gate signal associated with a currently selected Segment is set to a predetermined bias voltage of 0V for disconnecting corresponding LBLs with corresponding GBLs or set to Vdd up to about 8V for connecting corresponding LBLs with corresponding GBLs, the predetermined bias voltage being generated by a bus line controlled by the Segment decoder circuit through a corresponding pump circuit.

71. The 3D NAND memory array of claim 70 wherein the Segment decoder circuit comprises a latch circuit coupled to a status reporter circuit configured to latch the predetermined bias voltage into a poly parasitic line capacitor associated with the corresponding common gate line of the 2N Segment-select devices associated with the currently selected Segment so that the bus line can be released for sending the predetermined bias voltage to another corresponding common gate line associated with another selected Segment.

72. The 3D NAND memory array of claim 71 wherein the latch circuit comprises two invertors configured to enable a pre-decoder output associated with one or more Segment addresses to control the pump circuit for charging the predetermined bias voltage to either the fourth gate signal and generating an address signal representing the currently-selected Segment to respective pre-decoder inputs of block decoder circuits associated with blocks within the selected Segment, and to disable the pre-decoder output for latching the charged bias voltage to corresponding poly parasitic line capacitor, and to enable the pre-decoder output to control the corresponding pump circuit for discharging the bias voltage stored in the corresponding poly parasitic line capacitor to the bus line.

73. The 3D NAND memory array of claim 72 wherein the status report circuit comprises one transistor gated to the pre-decoder output, another transistor gated to the latch circuit, and a Segment-select signal output coupled to the pre-decoder output, the status report circuit being configured to sense the high/low status of the latch circuit to identify a Segment address from the pre-decoder output which is matched with the currently selected Segment so as to yield Vdd=1.8V when at least one block within the current Segment is unfinished in a corresponding operation or to yield 0V when all blocks within the current Segment are finished in corresponding operations so the current Segment is re-opened for future operations.

74. The 3D NAND memory array of claim 73 wherein the pump circuit comprises a first LV enable input coupled to a node driver to receive an enable or disable signal from the latch circuit and the pre-decoder output, a second clock input coupled to a clock pulse through a NAND device and an inverter coupled with two capacitors, a third HV supply input coupled with three HV transistors, and an output control gate for controlling passage of the predetermined bias voltage from the bus line to the fourth gate signal associated with corresponding common gate line of the 2N Segment-select devices.

75. The 3D NAND memory array of claim 74 wherein the Segment decoder further comprises a first LV control input, a second LV control input, a third LV control input, and a fourth LV control input, the first LV control input coupled to the pre-decoder output for setting a first latch node of the latch circuit, the second LV control input coupled to the pre-decoder output for setting a second latch node of the latch circuit, the third LV control input for combining the latch circuit output and the pre-decoder output to set control input for the pump circuit, the fourth LV control input coupled to the second latch node without coupling to the pre-decoder output for resetting the latch circuit.

76. The 3D NAND memory array of claim 75 wherein the Segment decoder circuit is configured to adjust a bias voltage for the fourth gate signal in multiple steps at least for performing a second Read operation at the currently selected Segment of a Group in a self-timed concurrent/pipeline manner while a first operation being performed for Read, or Program, or Program-Verify, or Erase-Verify in another selected Segment of the same or different Group, the multiple steps including initializing at least the second latch node to Vss=0V by applying Vss to the second LV control input, one-shot Vdd=1.8V pulse to the fourth LV control input, Vss to the first LV control input, and Vdd to the third LV control input to make the bus line at a low voltage state either at Vdd=1.8V or Vss=0V and the fourth gate signal floating at Vss;

pre-charging the 2N LBLs associated with the currently selected Segment to a median-high voltage $V_{inhibit}$~7V from the common dedicated metal power line by applying ~8V to the sixth gate signal while keeping the fourth gate signal floating at Vss;

setting the fourth gate signal to Vpass=10V for the second Read operation by at least switching the third LV control input to Vss and enabling the pump circuit for providing corresponding bias voltage from the bus line;

latching the Vpass to the fourth/fifth gate signal by at least switching the third LV control input to Vdd to store corresponding charges to the poly parasitic line capacitor to allow discharging of any on-cells while retaining charges of any off-cells in a page of a selected block in the selected Segment and sharing between corresponding LBLs and corresponding GBLs;

locking the node driver to prevent any inadvertent operation from the bus line of the pump circuit on the latched status of the fourth gate signal for performing the second Read operation by at least applying an one-shot Vdd pulse to the first LV control input while keeping the second LV control input and fourth LV control input to Vss and the third LV control input to Vdd;

unlocking the node driver by applying an one-shot Vdd pulse to the second LV control input while keeping the first LV control input and the fourth LV control input at Vss and the third LV control input at Vdd; and discharging corresponding charges stored in the poly parasitic line capacitor associated with the common gate line of corresponding row of the 2N Segment-select devices to the bus line as the second Read operation is finished triggered by a falling-edge of an one-shot low-voltage pulse at the third LV control input to induce a rising-edge of an one-shot low-voltage pulse at node driver output and a rising-edge of an one-shot high-voltage pulse at the output control gate of the pump circuit while keeping the first LV control input, the second LV control input, and the fourth LV control input to Vss.

77. The 3D NAND memory array of claim 75 wherein the Segment decoder circuit is configured to adjust a bias voltage for the fourth gate signal in multiple steps at least for performing a second Program operation at a currently selected sub-Segment of a selected Segment of a Group in a self-timed concurrent/pipeline manner while a first operation being performed for Read, or Program, or Program-Verify, or Erase-Verify in another sub-Segment of different Segment, the multiple steps including initializing at least the second latch node to Vss=0V by applying Vss to the second LV control input, one-shot Vdd=1.8V pulse to the fourth LV control input, Vss to the first LV control input, and Vdd to the third LV control input to make the bus line at a low voltage state either at Vdd=1.8V or Vss=0V and the fourth gate signal floating at Vss;

pre-charging the 2N broken-LBLs associated with the currently selected sub-Segment to a median-high voltage $V_{inhibit}$~7V from the common dedicated metal power line by applying ~8V to the sixth gate signal while keeping the fourth gate signal floating at Vss;

setting the fourth gate signal to Vdd for the second Program operation by at least switching the third LV control input to Vss and enabling the pump circuit for providing the predetermined bias voltage from the bus line;

latching Vdd for the fourth gate signal by at least switching the third LV control input to Vdd to store corresponding charges to the poly parasitic line capacitor to allow discharging of programmed cells from corresponding broken-LBLs to corresponding broken-GBLs associated with the same Segment;

locking the node driver to prevent any inadvertent operation from the bus line of the pump circuit on the latched status of the fourth gate signal for performing the second Program operation by at least applying an one-shot Vdd pulse to the first LV control input while keeping the second LV control input and fourth LV control input to Vss and the third LV control input to Vdd;

unlocking the node driver by applying an one-shot Vdd pulse to the second LV control input while keeping the first LV control input and the fourth LV control input at Vss and the third LV control input at Vdd; and discharging corresponding charges stored in the poly parasitic line capacitor associated with the common gate line of corresponding row of the 2N Segment-select devices to the bus line as the second Program operation is finished triggered by a falling-edge of an one-shot low-voltage pulse at the third LV control input to induce a rising-edge of an one-shot low voltage pulse at node driver output and a rising-edge of one-shot high-voltage pulse at the output control gate of the pump circuit while keeping the first LV control input, the second LV control input, and the fourth LV control input to Vss.

78. The 3D NAND memory array of claim 59 wherein the fifth gate signal associated with a currently selected Segment is set to a predetermined bias voltage of 0V or Vdd up to about 7V generated by a bus line controlled by the DI decoder circuit through a corresponding pump circuit.

79. The 3D NAND memory array of claim 78 wherein the DI decoder circuit comprises a latch circuit configured to latch the predetermined bias voltage into a poly parasitic line capacitor associated with the common gate line of corresponding row of 2N LBL-divided devices for connecting/disconnecting two broken-LBLs in the currently selected Segment so that the bus line can be released for sending the predetermined bias voltage to another common gate line for connecting/disconnecting another two broken-LBLs in the currently selected Segment.

80. The 3D NAND memory array of claim 79 wherein the latch circuit comprises two invertors configured to enable a pre-decoder output associated with one or more Segment addresses to control the pump circuit for charging the predetermined bias voltage to the fifth gate signal and to disable the pre-decoder output for latching the charged voltage to corresponding poly parasitic line capacitor.

81. The 3D NAND memory array of claim 80 wherein the pump circuit comprises a first LV enable input coupled to an output port of a node driver to receive an enable or disable signal from the latch circuit and the pre-decoder output, a second clock input coupled to a clock pulse through a NAND device and an inverter coupled with two capacitors, a third HV input coupled with three HV transistors, and an output control gate for controlling passage of the predetermined bias voltage from the bus line to the fifth gate signal associated with corresponding common gate line of the 2N LBL-divided devices.

82. The 3D NAND memory array of claim 81 wherein the DI decoder further comprises a first LV control input, a second LV control input, a third LV control input, and a fourth LV control input, the first LV control input coupled to the pre-decoder output for setting a first latch node of the latch circuit, the second LV control input coupled to the pre-decoder output for setting a second latch node of the latch circuit, the third LV control input for combining the latch circuit output and the pre-decoder output to set control input for the pump circuit, the fourth LV control input coupled to the second latch node without coupling to the pre-decoder output for resetting the latch circuit.

83. The 3D NAND memory array of claim 82 wherein the DI decoder circuit is configured to adjust a bias voltage for the fifth gate signal for performing at least a second Read operation at the currently selected Segment of a Group in a self-timed concurrent/pipeline manner while a first operation being performed for Read, or Program, or Program-Verify, or Erase-Verify in another selected Segment of the same or different Group.

84. The 3D NAND memory array of claim 82 wherein the DI decoder circuit is configured to adjust a bias voltage for the fifth gate signal for performing at least a second Program operation at a currently selected sub-Segment of a selected Segment in a self-timed concurrent/pipeline manner while a first operation being performed for Read, or Program, or Program-Verify, or Erase-Verify in another sub-Segment of different Segment.

85. The 3D NAND memory array of claim 59 wherein the third gate signal is set to a predetermined bias voltage of 0V or Vdd from a bus line through an output of the Group decoder circuit.

86. The 3D NAND memory array of claim 59 wherein the sixth gate signal is set to a predetermined bias voltage of 0V or Vdd up to 10V plus a margin of about 1V from a bus line through an output of the precharge generator circuit.

87. The 3D NAND memory array of claim 86 wherein the precharge generator circuit is configured to use the predetermined bias voltage set for the sixth gate signal to control precharge/discharge about 7V to/from the 2N LBLs in each selected Segment from/to the common dedicated metal power line in the beginning/ending of at least a second operation selected from Read, Program, Program-Verify, and Erase-Verify of a full-page of 3D NAND array cells in a selected block of the selected Segment a self-timed concurrent/pipeline manner while a first operation selected from Read, Program, Program-Verify, and Erase-Verify of another full-page of 3D NAND array cells being performed in another block of another Segment.

88. The 3D NAND memory array of claim 87 wherein the common dedicated metal power line is configured to be grounded or to receive a median high $V_{inhibit}$ voltage of about 7V from an independent LBL power supply with substantially lower resistance than that through all strings of 3D NAND array cells from a static page buffer located at an end of the plane.

89. A Block-decoder with latch design for performing multi-task concurrent/pipeline multiple-WL Program, Read, Erase, Erase-Verify, and Program-Verify operations in dispersed Blocks of a NAND memory array with a 2-level metal broken-BL hierarchical architecture, the NAND memory array comprising:
  a plane of NAND array cells made of a plurality of Blocks having 2N columns in Y direction and a plurality of rows in X direction, the plane being built on a common Triple-Pwell (TPW) region over a deep-Nwell region on a P-substrate, the X direction being perpendicular to the Y direction, the plane including J Groups in the Y direction, each Group including L Segments in the Y direction, each Segment including m sub-Segments in the Y direction, each sub-Segments including K Blocks in the Y direction, each Block including M rows, 2N strings of NAND array cells in the X direction capped respectively by a first row of 2N string-select devices and a second row of 2N string-select devices, each of M rows of NAND array cells forming a page having a common gate connected to a word line (WL), the first/second row of 2N string-select devices having a common gate line coupled to a first/second gate signal, a source node of the second row of 2N string-select devices being connected to a common source line, N being a multiplier of a byte, J, L, m, and K being properly selected integer numbers including 4, 8, 16, 32, 64, 128;
  N global bit lines (GBLs) laid in parallel extended the full plane in the Y direction as top-level metal lines with a first pitch;
  J−1 rows of N GBL-divided devices disposed in the X direction with a common gate line coupled to a third gate signal and configured to respectively divide each GBL to J broken-GBLs, each broken-GBL being associated with one column of NAND array cells in one Group connecting all L Segments therein;
  2N local bit lines (LBLs) laid in parallel extended to all strings in one Segment in the Y direction as bottom-level metal lines with a second pitch below the top-level metal lines;
  a first row of N first Segment-select devices disposed for each Segment of each Group and configured to respectively connect each broken-GBL in a Group to an odd number LBL associated with a selected Segment of the Group, the first row of N first Segment-select devices having a common gate line coupled to a fourth gate signal;
  a second row of N second Segment-select devices disposed next to each first row of N first Segment-select devices and configured to respectively connect each said broken-GBL in the Group interleavingly to a next even number LBL associated with the selected Segment of the Group, the second row of N second Segment-select devices having a common gate line coupled to a fifth gate signal;
  m−1 rows of 2N LBL-divided devices disposed in the X direction with a common gate line coupled to a sixth gate signal and configured to respectively divide each LBL to m broken-LBLs, each broken-LBL being associated with one column of NAND array cells in one sub-Segment connecting all K Blocks therein and configured to connect respectively to a drain node of the first string-select device of one string of NAND array cells in each of K Blocks of said sub-Segment; and
  a row of 2N LBL-precharge devices disposed in the X direction with a common gate line coupled to a seventh gate signal and configured to respectively connect each broken-LBL to a common dedicated metal power line for each sub-Segment of each Segment of each Group;
  the Block-decoder comprising:
  a pre-decoder circuit receiving Block address inputs and outputting a decoded address signal;
  a latch circuit coupled to the pre-decoder circuit to receive the decoded address signal to send an enable/disable signal;
  a lock circuit coupled receive the enable/disable signal from latch circuit and a lock/unlock signal to deliver a first output signal and a second output signal; and
  a pump circuit configured to supply a plurality of high-voltage inputs via a series of HV transistors coupled to all WLs, a first common gate line, and the second common gate line of a selected Block in the plane of NAND array cells, the pump circuit being coupled to the lock circuit so that the first output signal can latch the plurality of high-voltage inputs to poly parasitic capacitors associated with the all WLs, a first common gate line, and the second common gate line to be used as corresponding WL voltages, the first gate signal, and the second gate signal for performing NAND operation on the selected Block and the second output signal can prevent inadvertent signals from other operations into the latched WL voltages, the first gate signal, and the second gate signal.

* * * * *